(12) United States Patent
Kusai et al.

(10) Patent No.: US 9,087,715 B2
(45) Date of Patent: Jul. 21, 2015

(54) NONVOLATILE SEMICONDUCTOR MEMORY DEVICE AND METHOD OF MANUFACTURING THE SAME

(75) Inventors: Haruka Kusai, Yokohama (JP); Kiwamu Sakuma, Yokohama (JP); Shosuke Fujii, Fujisawa (JP); Masumi Saitoh, Yokohama (JP); Masahiro Kiyotoshi, Yokkaichi (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 5 days.

(21) Appl. No.: 13/547,645

(22) Filed: Jul. 12, 2012

(65) Prior Publication Data

US 2013/0175490 A1 Jul. 11, 2013

(30) Foreign Application Priority Data

Jul. 15, 2011 (JP) ................. 2011-157157

(51) Int. Cl.
| H01L 27/115 | (2006.01) |
| H01L 27/088 | (2006.01) |
| H01L 21/265 | (2006.01) |
| H01L 21/02 | (2006.01) |
| H01L 21/3205 | (2006.01) |

(Continued)

(52) U.S. Cl.
CPC .............. *H01L 27/088* (2013.01); *G11C 16/04* (2013.01); *G11C 16/10* (2013.01); *H01L 21/02367* (2013.01); *H01L 21/265* (2013.01); *H01L 21/32051* (2013.01); *H01L 21/76877* (2013.01); *H01L 27/1157* (2013.01); *H01L 27/11519* (2013.01); *H01L 27/11524* (2013.01); *H01L 27/11551* (2013.01); *H01L 27/11565* (2013.01); *H01L 27/11578* (2013.01); *H01L 27/24* (2013.01); *H01L 29/66825* (2013.01); *H01L 29/66833* (2013.01); *H01L 29/685* (2013.01); *H01L 29/788* (2013.01); *H01L 29/792* (2013.01); *H01L 29/82* (2013.01)

(58) Field of Classification Search
CPC ...................... H01L 27/11578; H01L 27/2481
USPC ........................................................ 257/326
See application file for complete search history.

(56) References Cited

U.S. PATENT DOCUMENTS

| 2011/0140070 A1* | 6/2011 | Kim ................................ 257/5 |
| 2011/0227028 A1* | 9/2011 | Sekar et al. ....................... 257/4 |

(Continued)

FOREIGN PATENT DOCUMENTS

| JP | 2013-110193 A | 6/2013 |
| JP | 2013-161920 A | 8/2013 |

OTHER PUBLICATIONS

U.S. Appl. No. 14/043,134, filed Oct. 1, 2013, Sakuma.

(Continued)

*Primary Examiner* — Peniel M Gumedzoe
*Assistant Examiner* — Christopher Johnson
(74) *Attorney, Agent, or Firm* — Oblon, McClelland, Maier & Neustadt, L.L.P.

(57) ABSTRACT

According to one embodiment, a nonvolatile semiconductor memory device includes a fin-type stacked layer structure having memory cells, and a beam connected to an end portion of the structure. Each of the structure and the beam includes semiconductor layers stacked in a perpendicular direction. The beam includes a contact portion provided at one end of the beam, and a low resistance portion provided between the contact portion and the end portion of the structure.

10 Claims, 51 Drawing Sheets

(51) Int. Cl.

| | |
|---|---|
| *H01L 21/768* | (2006.01) |
| *H01L 27/24* | (2006.01) |
| *G11C 16/04* | (2006.01) |
| *H01L 29/66* | (2006.01) |
| *H01L 29/68* | (2006.01) |
| *H01L 29/788* | (2006.01) |
| *H01L 29/792* | (2006.01) |
| *G11C 16/10* | (2006.01) |
| *H01L 29/82* | (2006.01) |

(56) References Cited

U.S. PATENT DOCUMENTS

2011/0266604 A1* 11/2011 Kim et al. ............... 257/314
2013/0181184 A1* 7/2013 Sakuma et al. ............... 257/5
2013/0200450 A1 8/2013 Kusai et al.

OTHER PUBLICATIONS

A. Hubert, et al., "A stacked SONOS technology, up to 4 levels and 6nm crystalline nanowires, with gate-all-around or independent gates (Φ-Flash), suitable for full 3D integration", IEDM, 2009, pp. 637-640.

Hang-Ting Lue, et al., "A Highly Scalable 8-Layer 3D Vertical-Gate (VG) TFT NAND Flash Using Junction-Free Buried Channel BE-SONOS Device", Symposium on VLSI Technology Digest of Technical Papers, 2010, pp. 131-132.

* cited by examiner

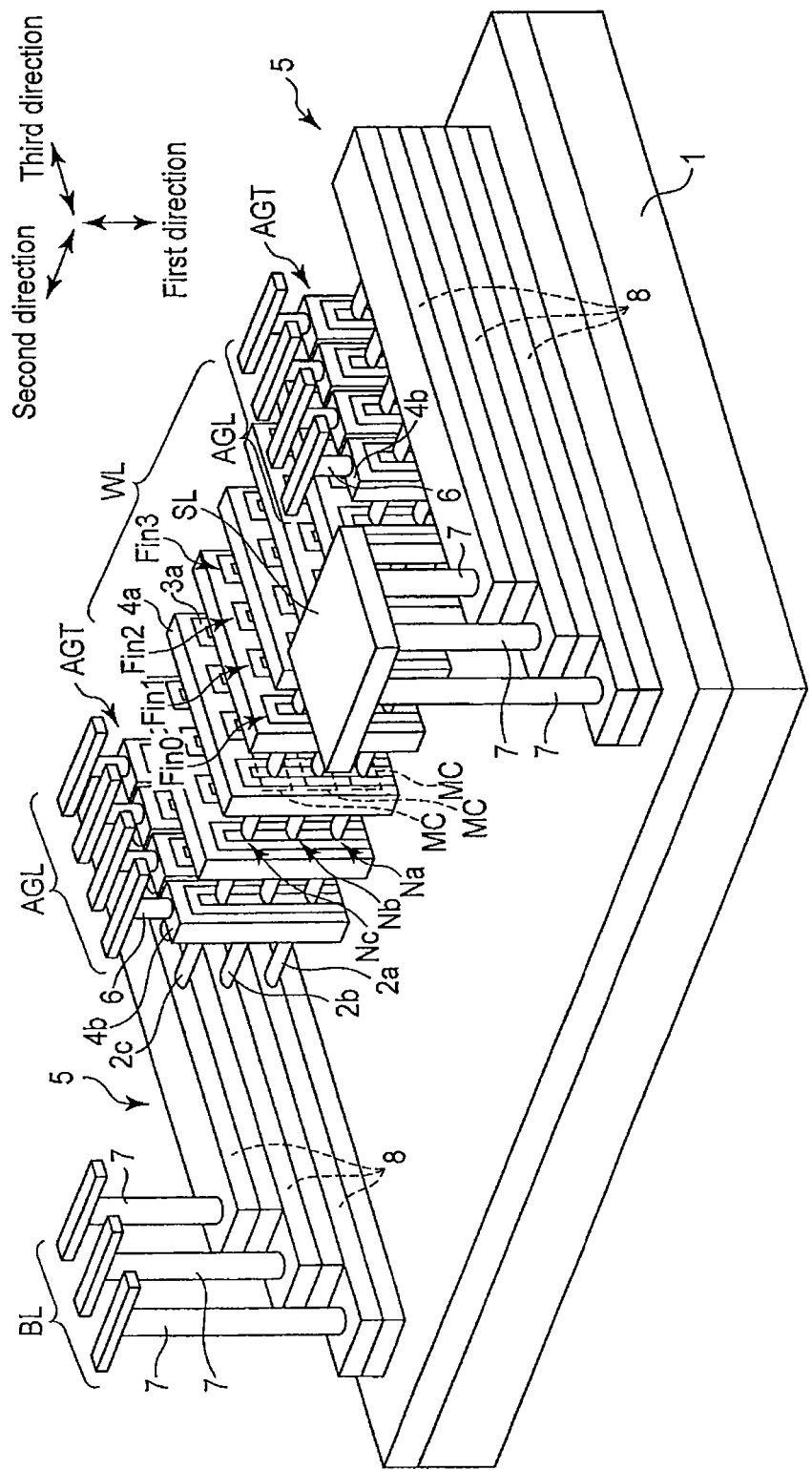
F I G. 1

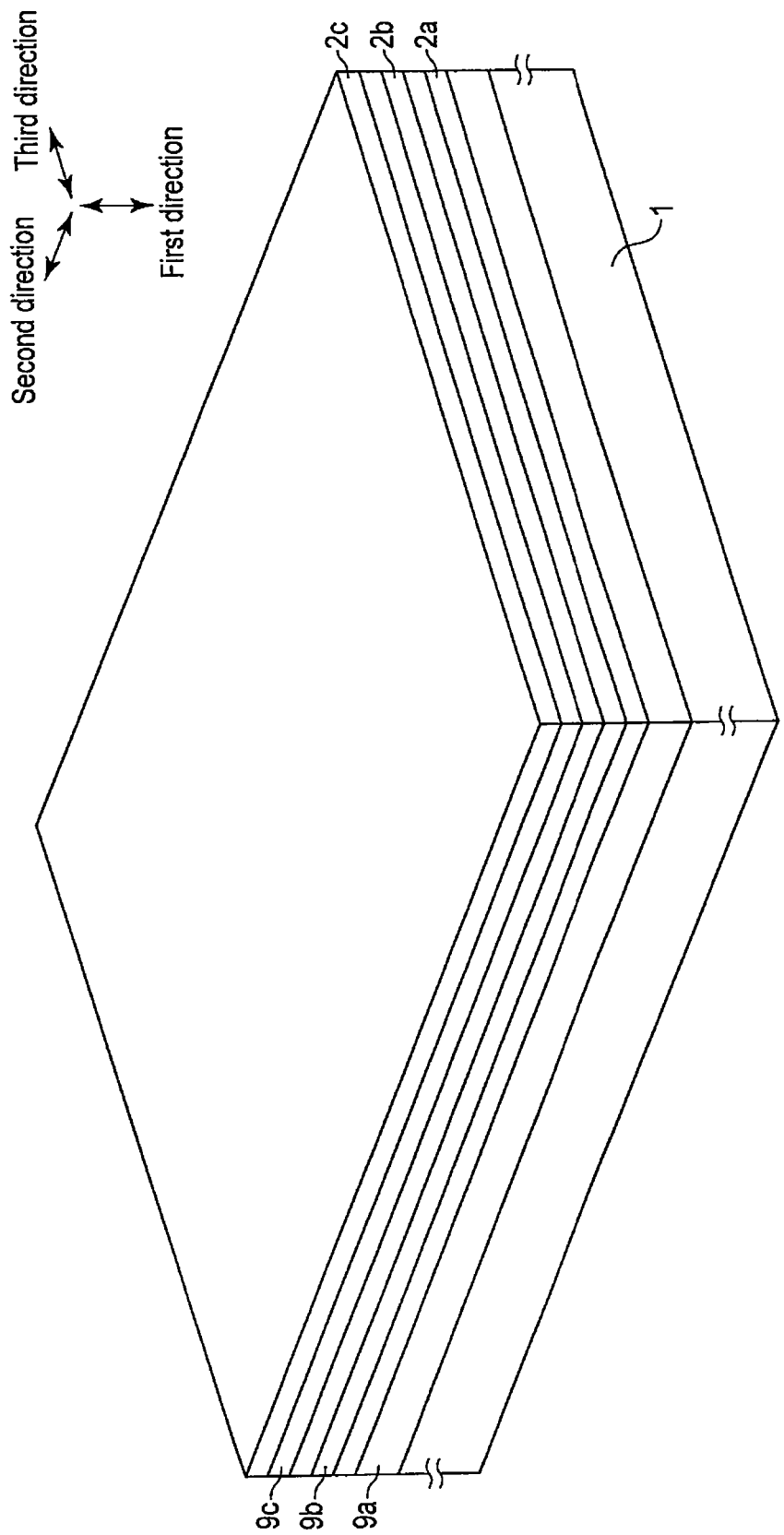
F I G. 4

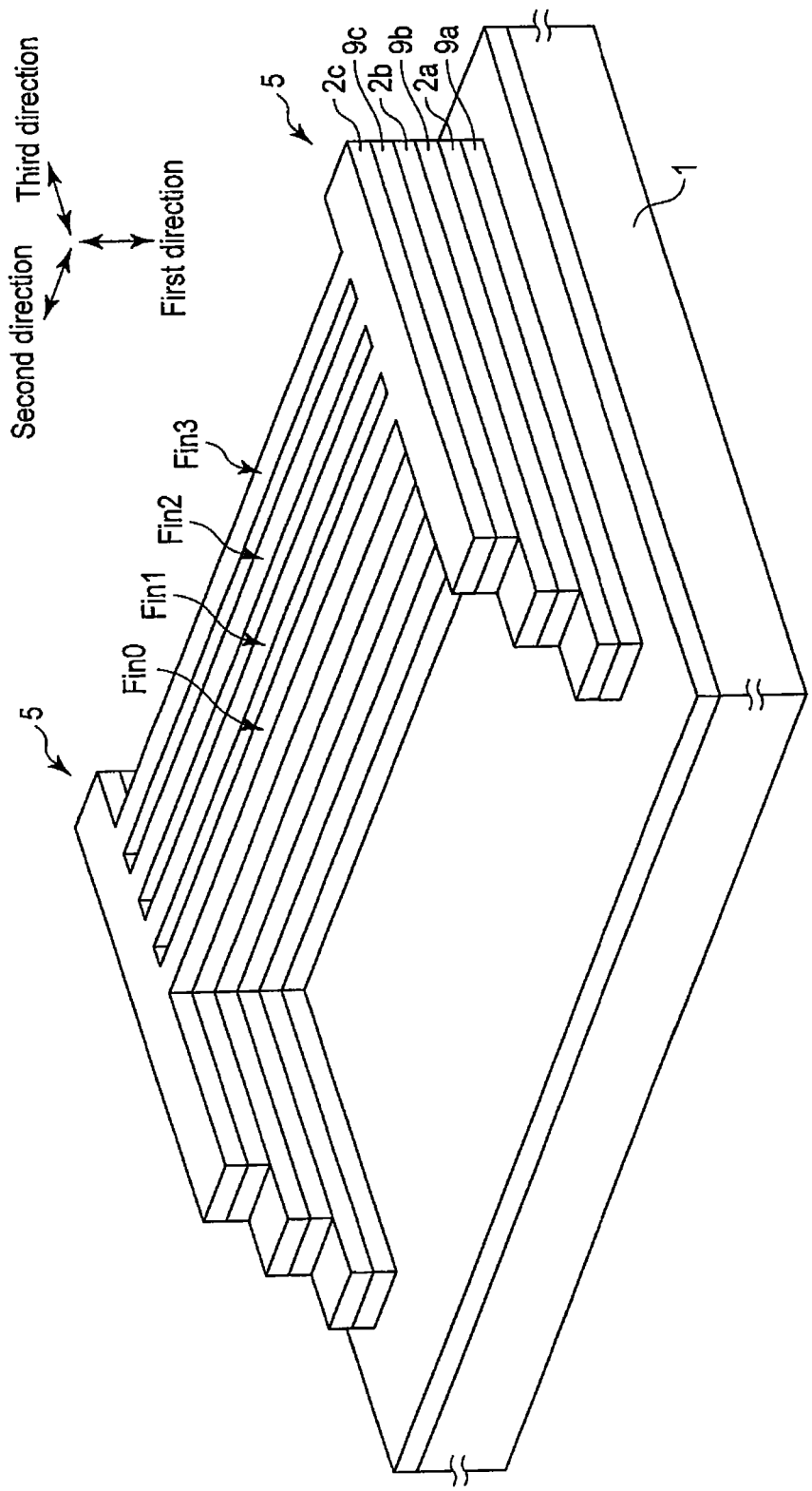
F I G. 6

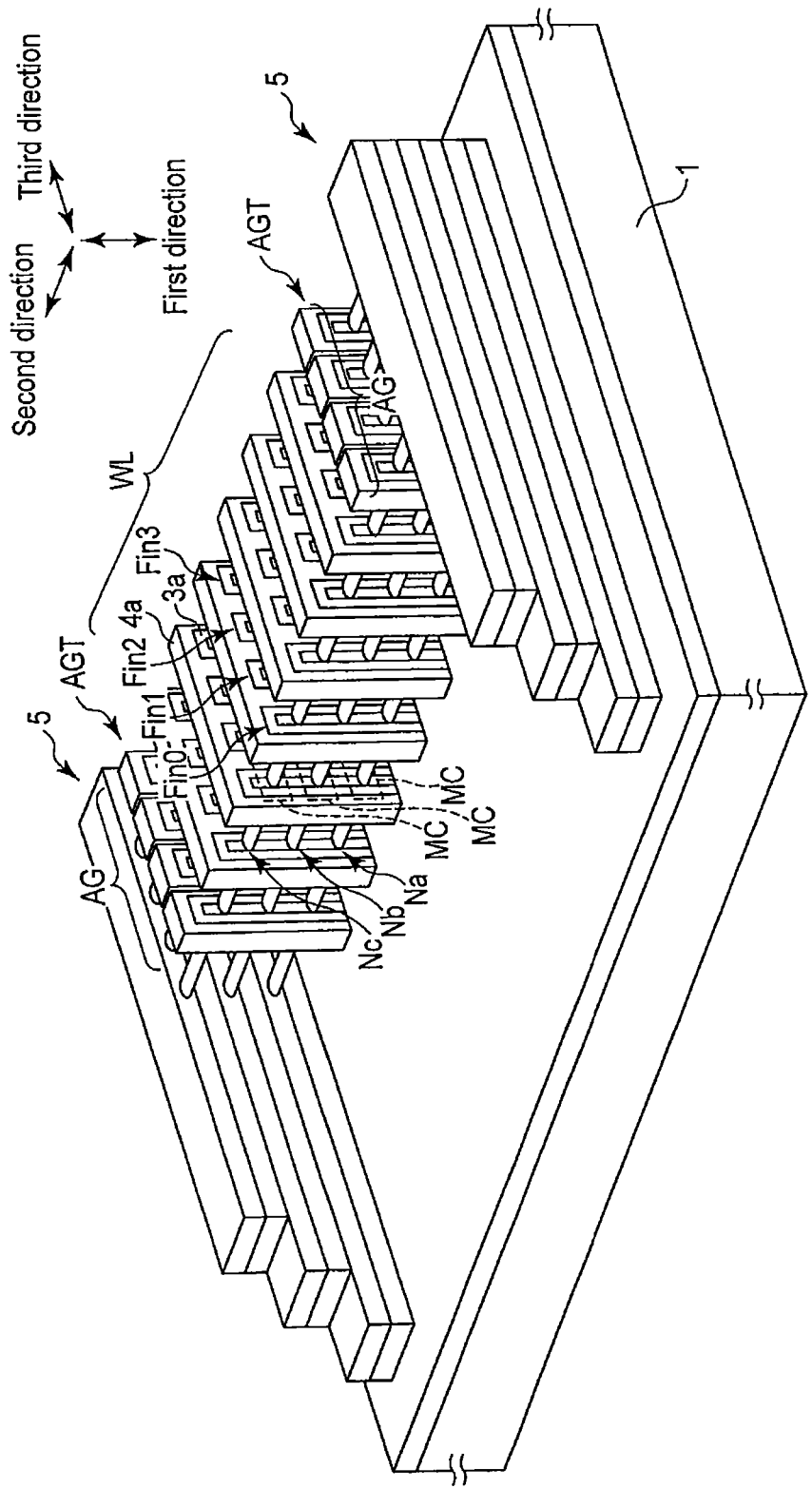
F I G. 7

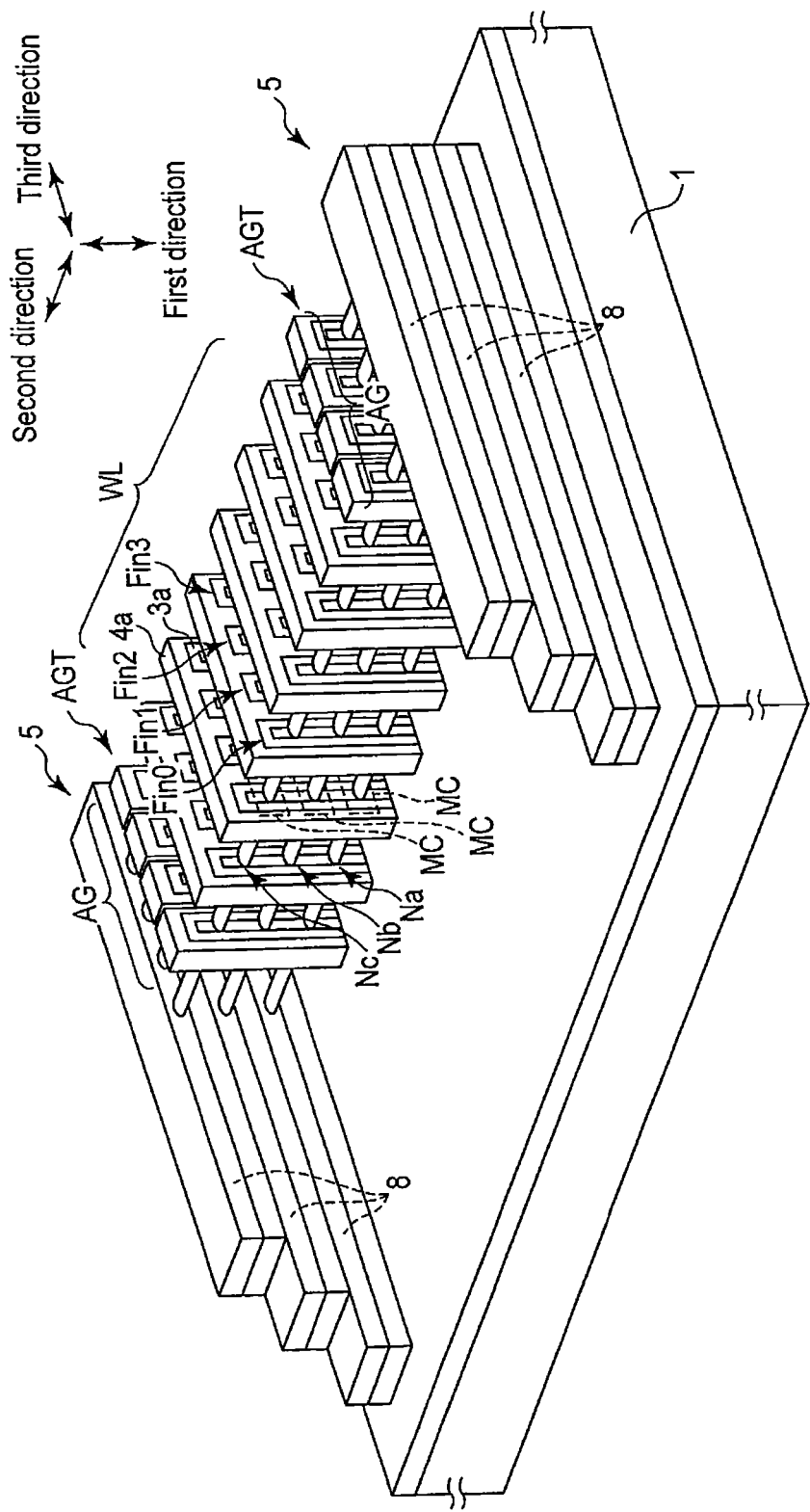
F I G. 8

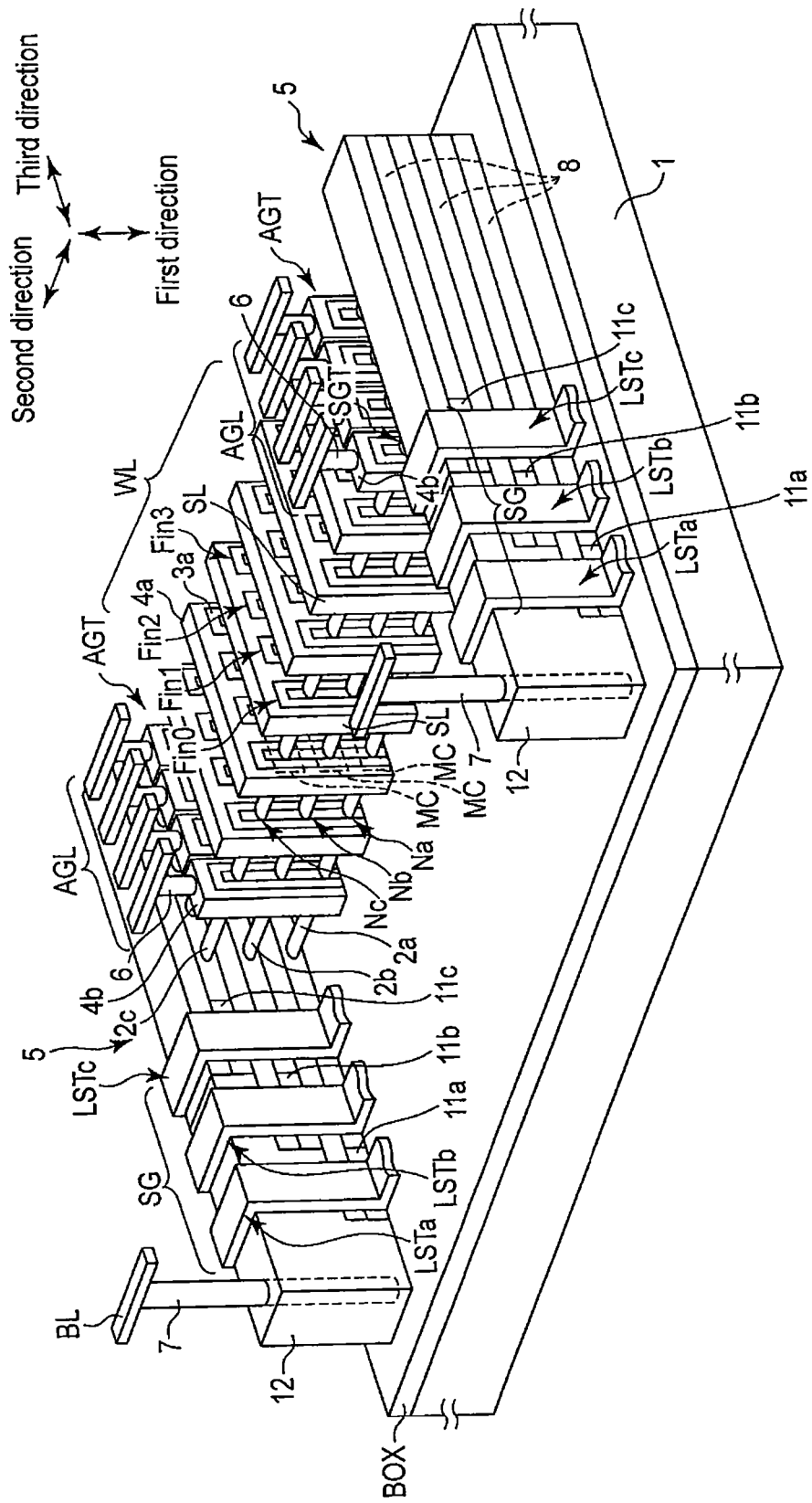
F I G. 10

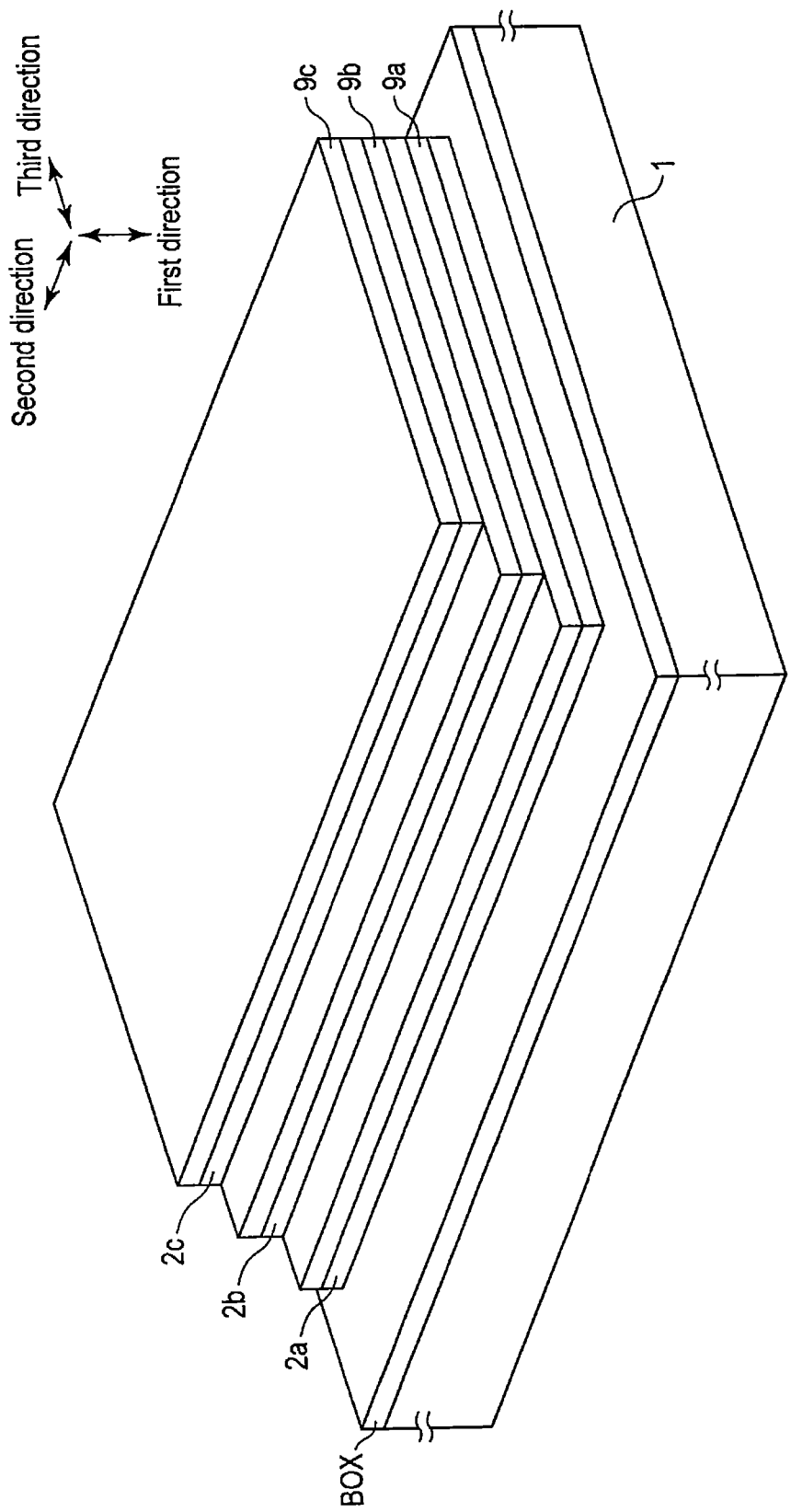
F I G. 13

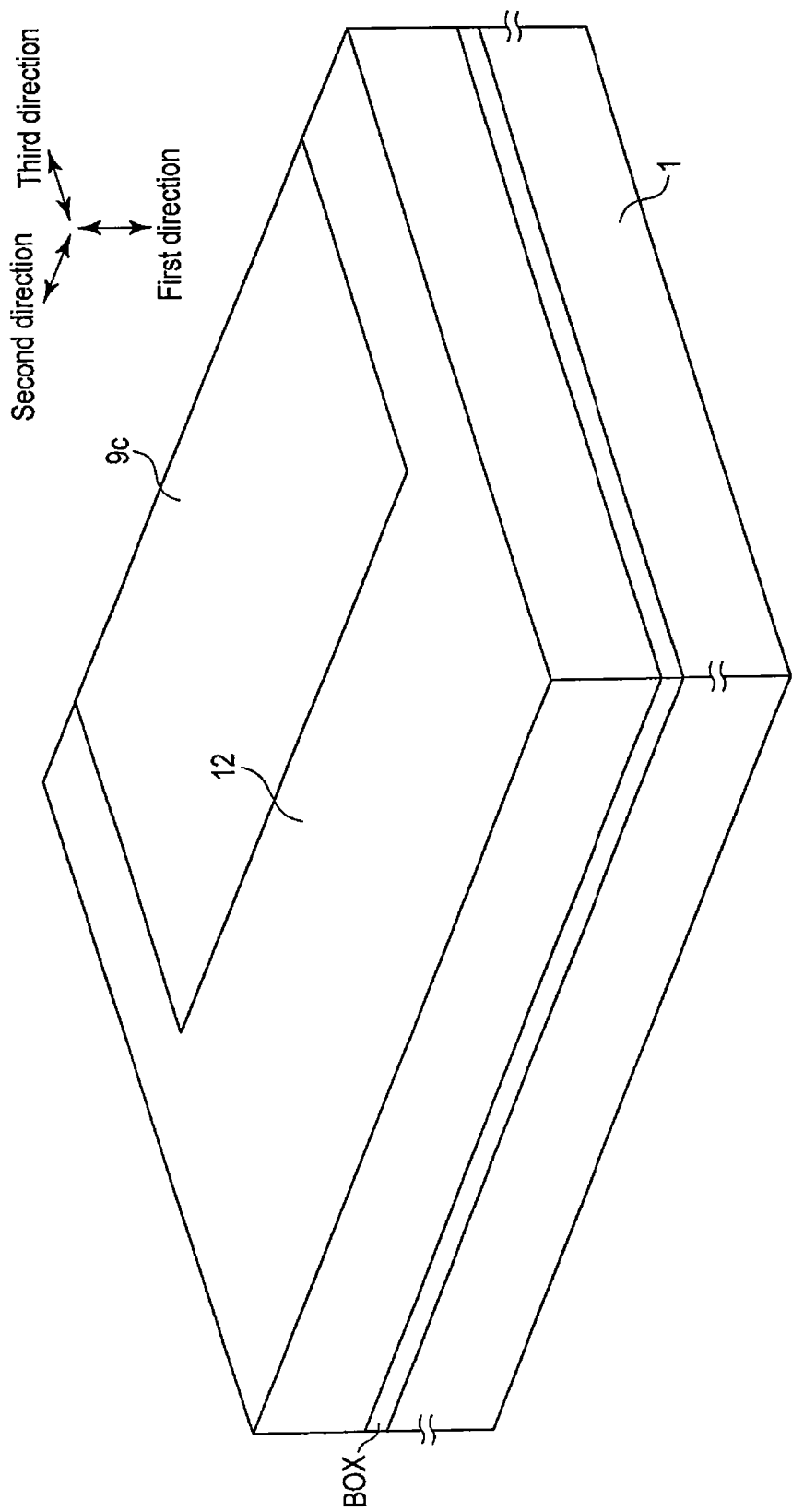
F I G. 15

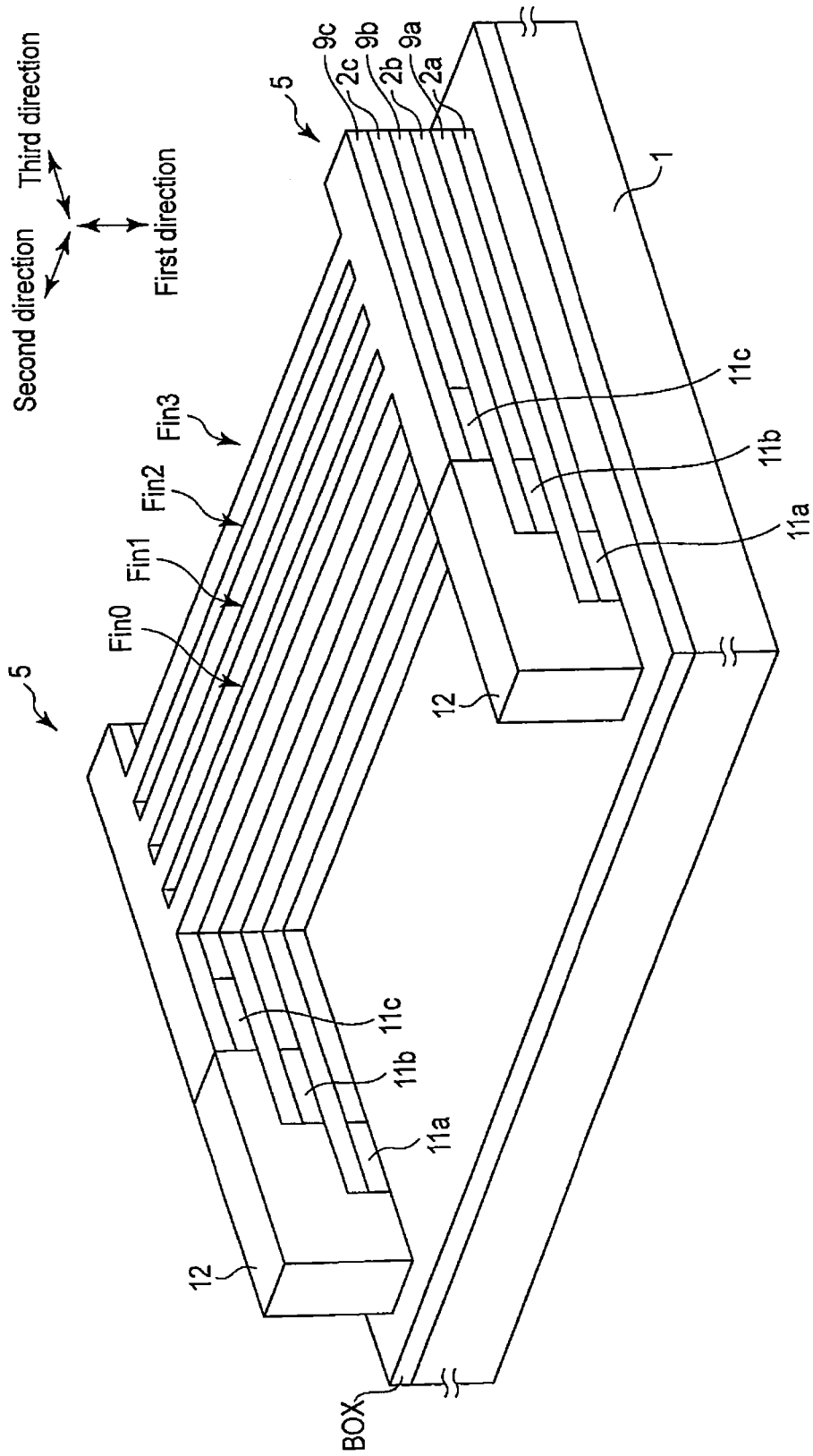
F I G. 16

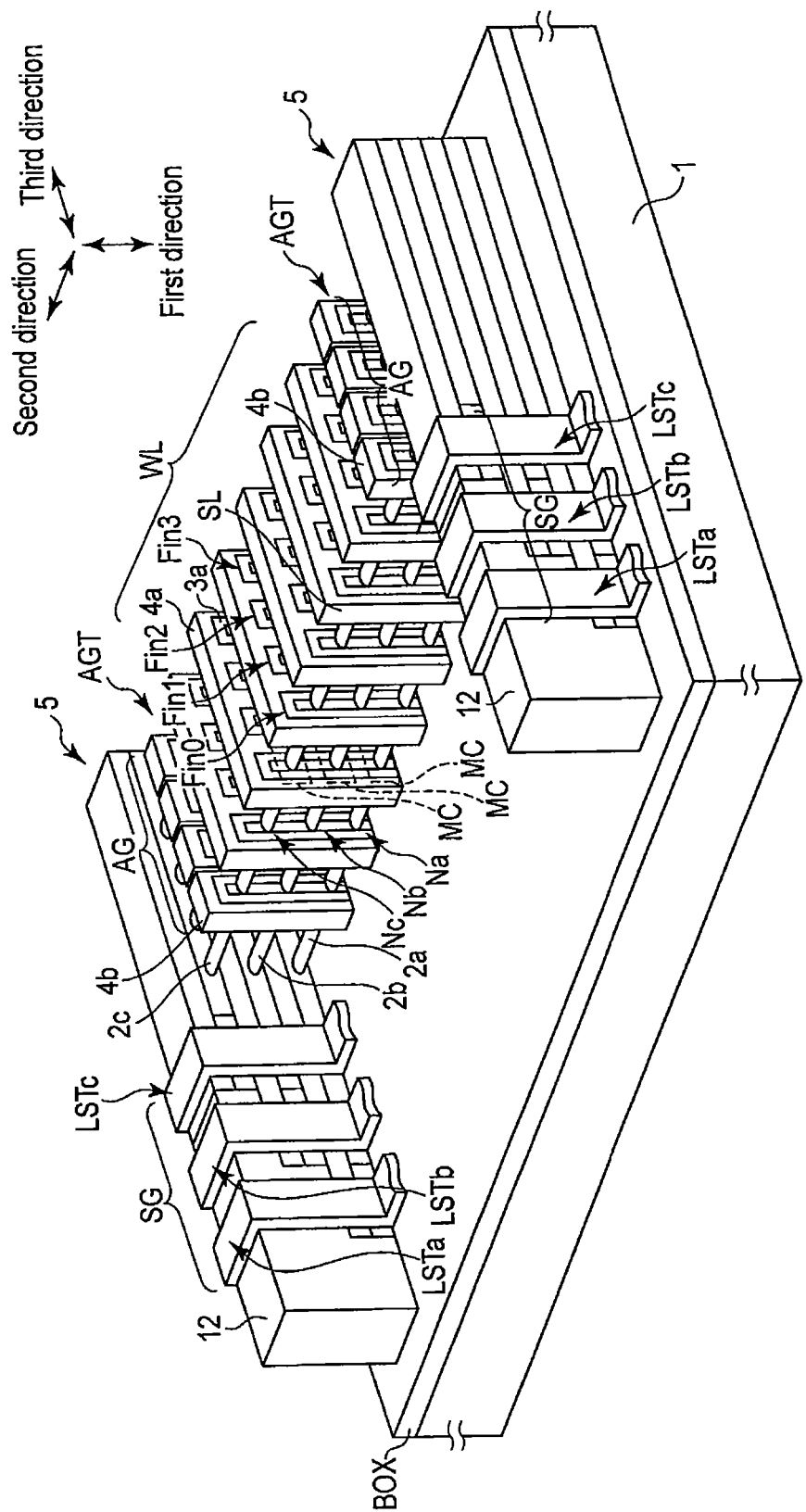
F I G. 18

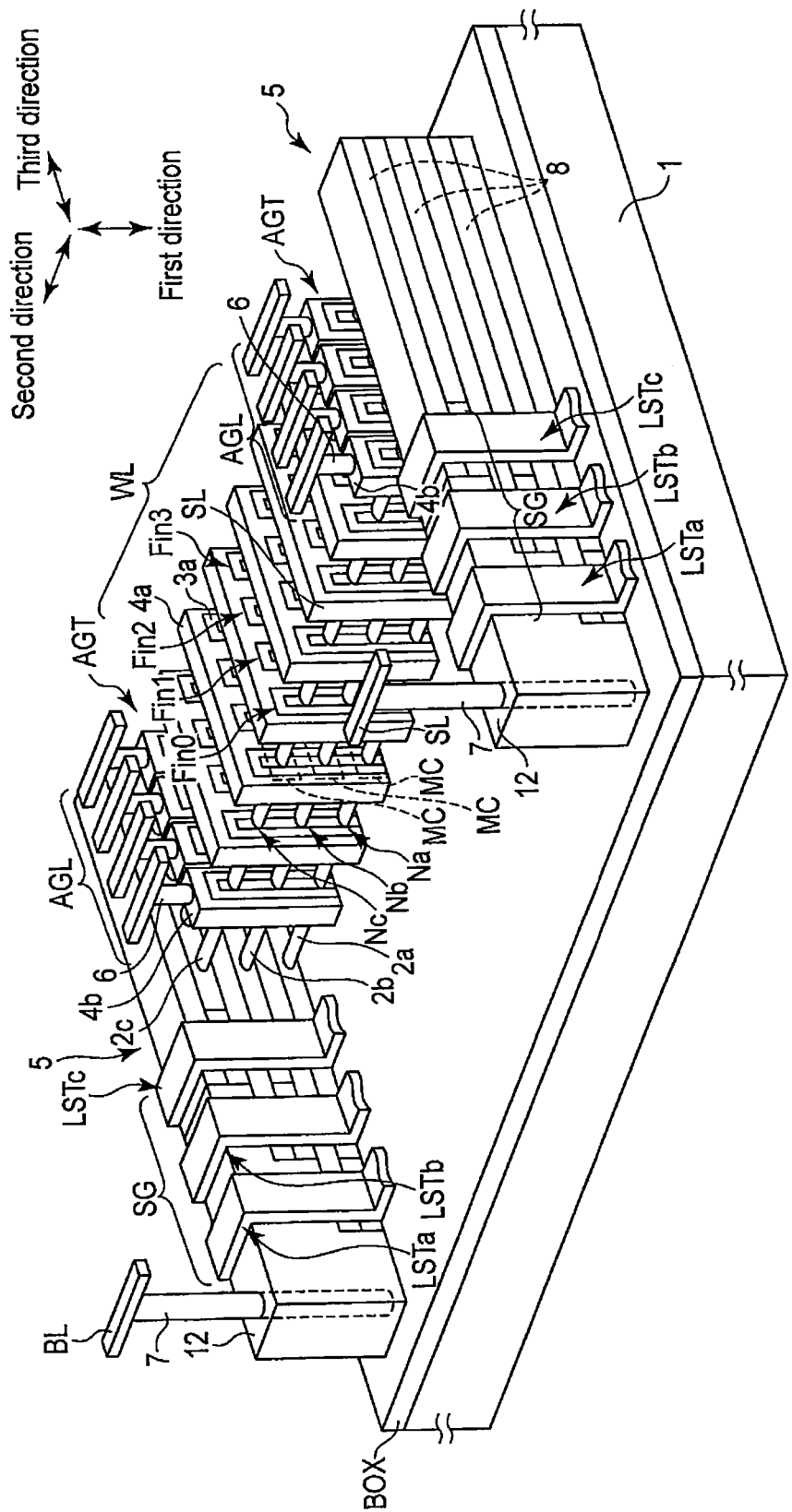
F I G. 19

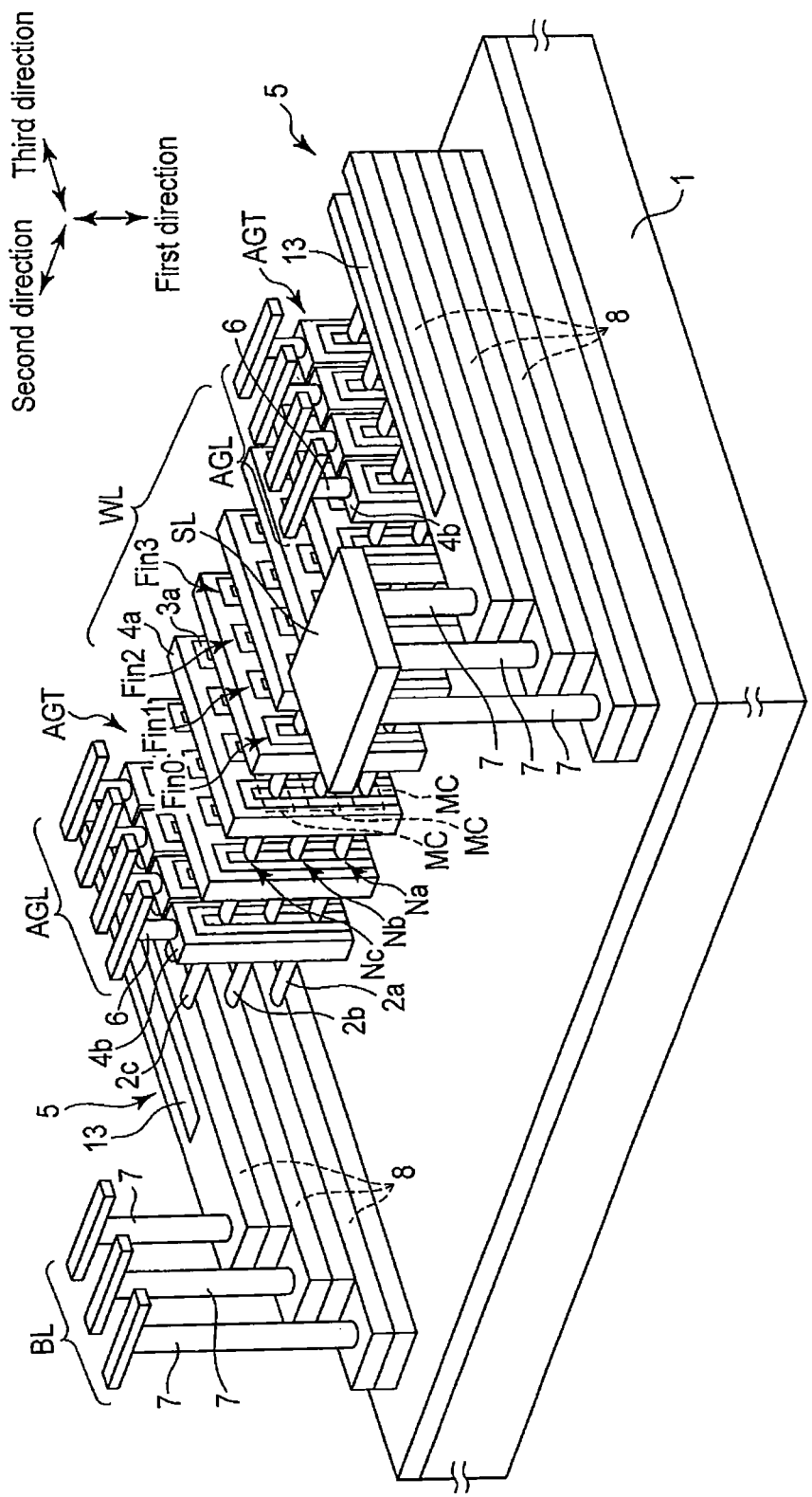
F I G. 20

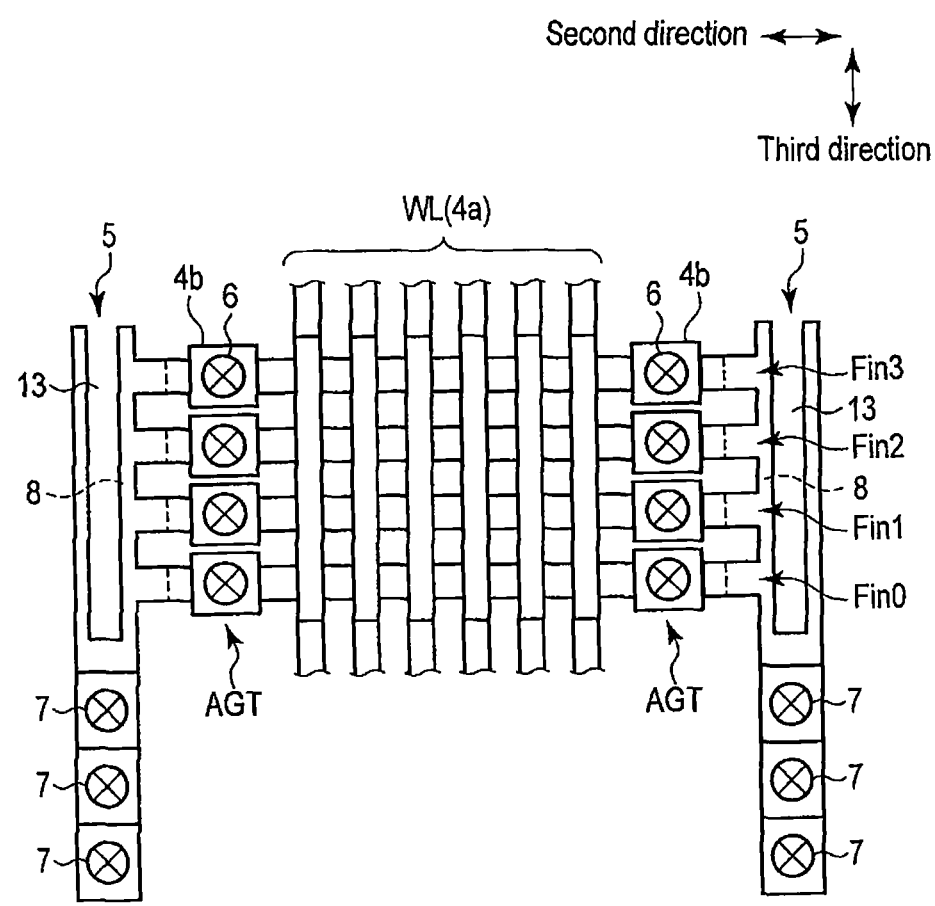
F I G. 21

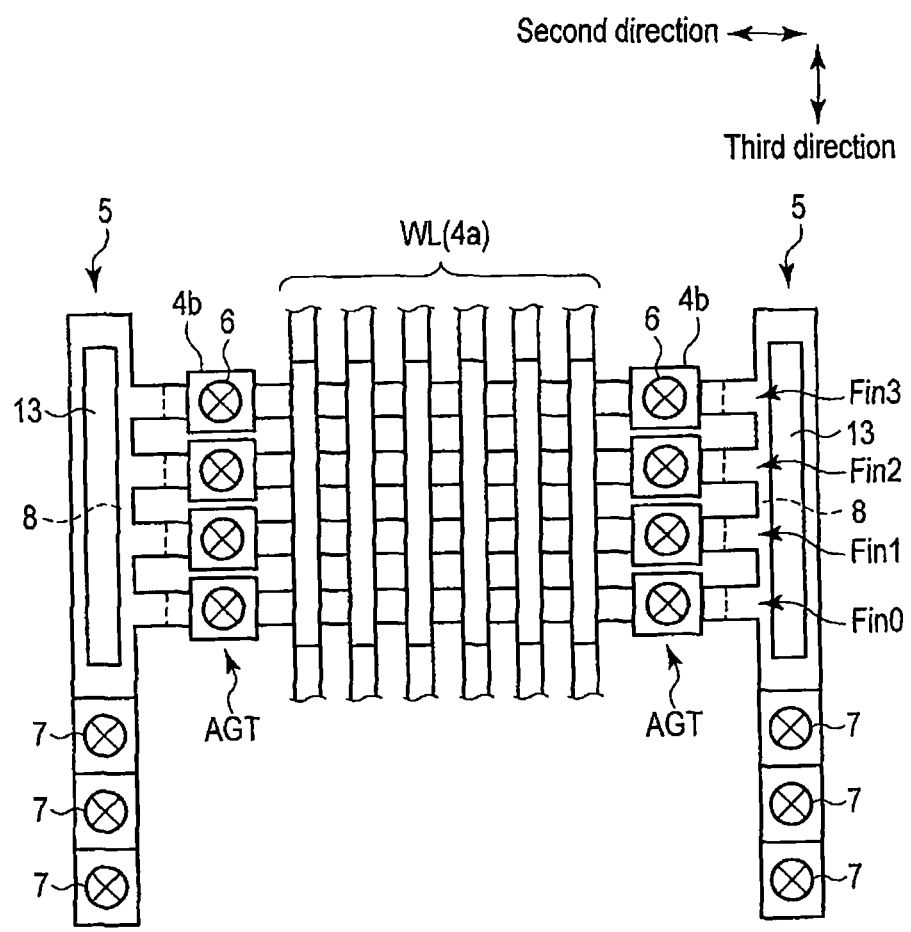
F I G. 22

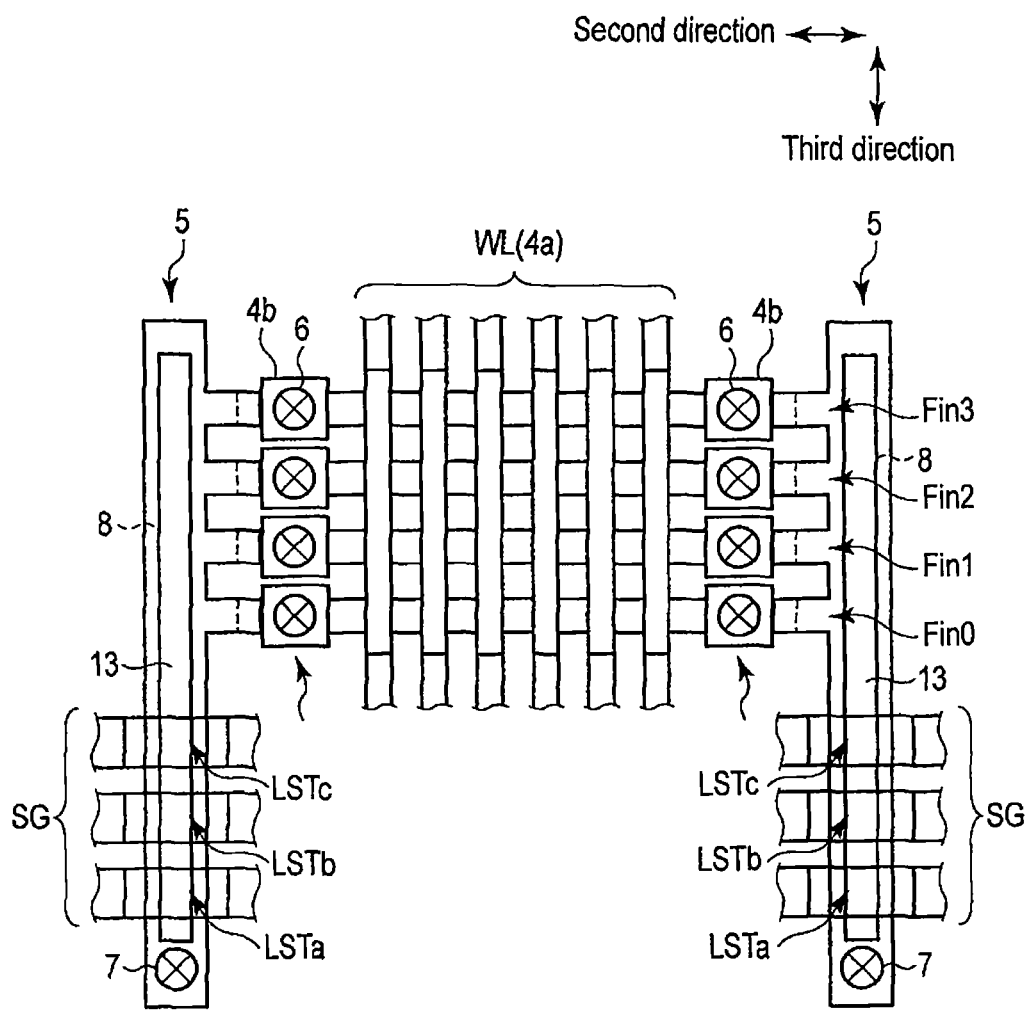
F I G. 2 3

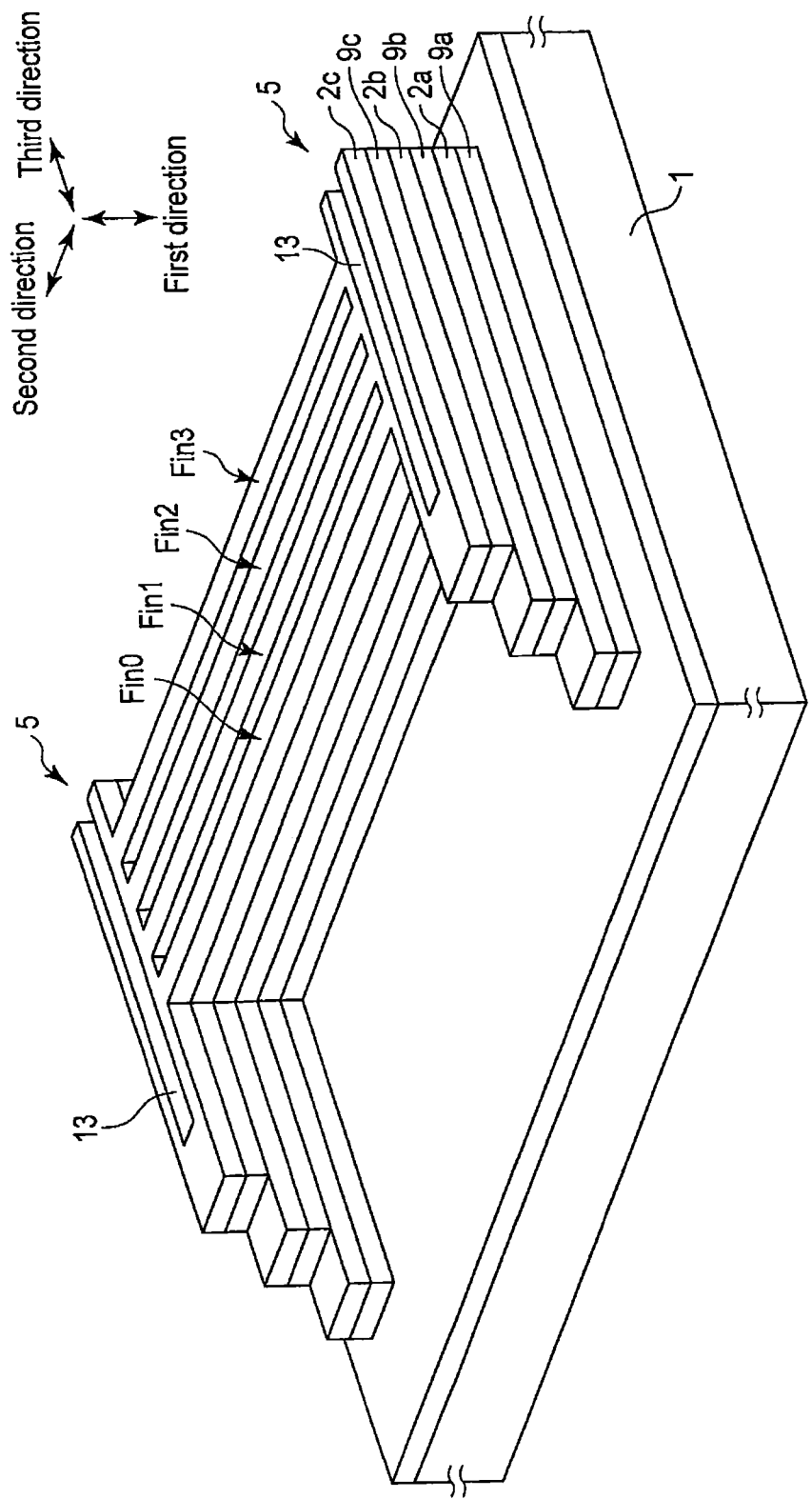
F I G. 24

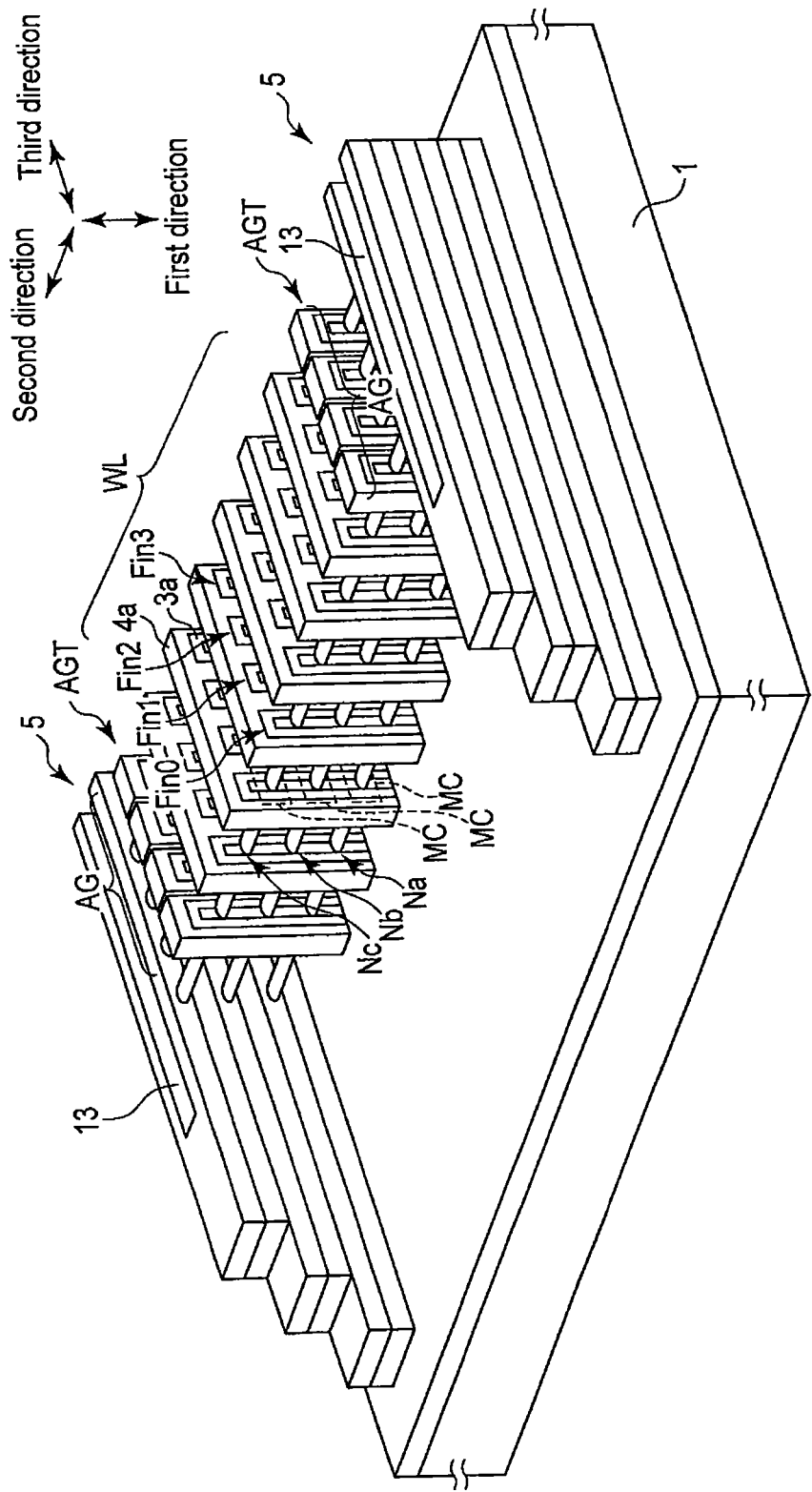
F I G. 2 5

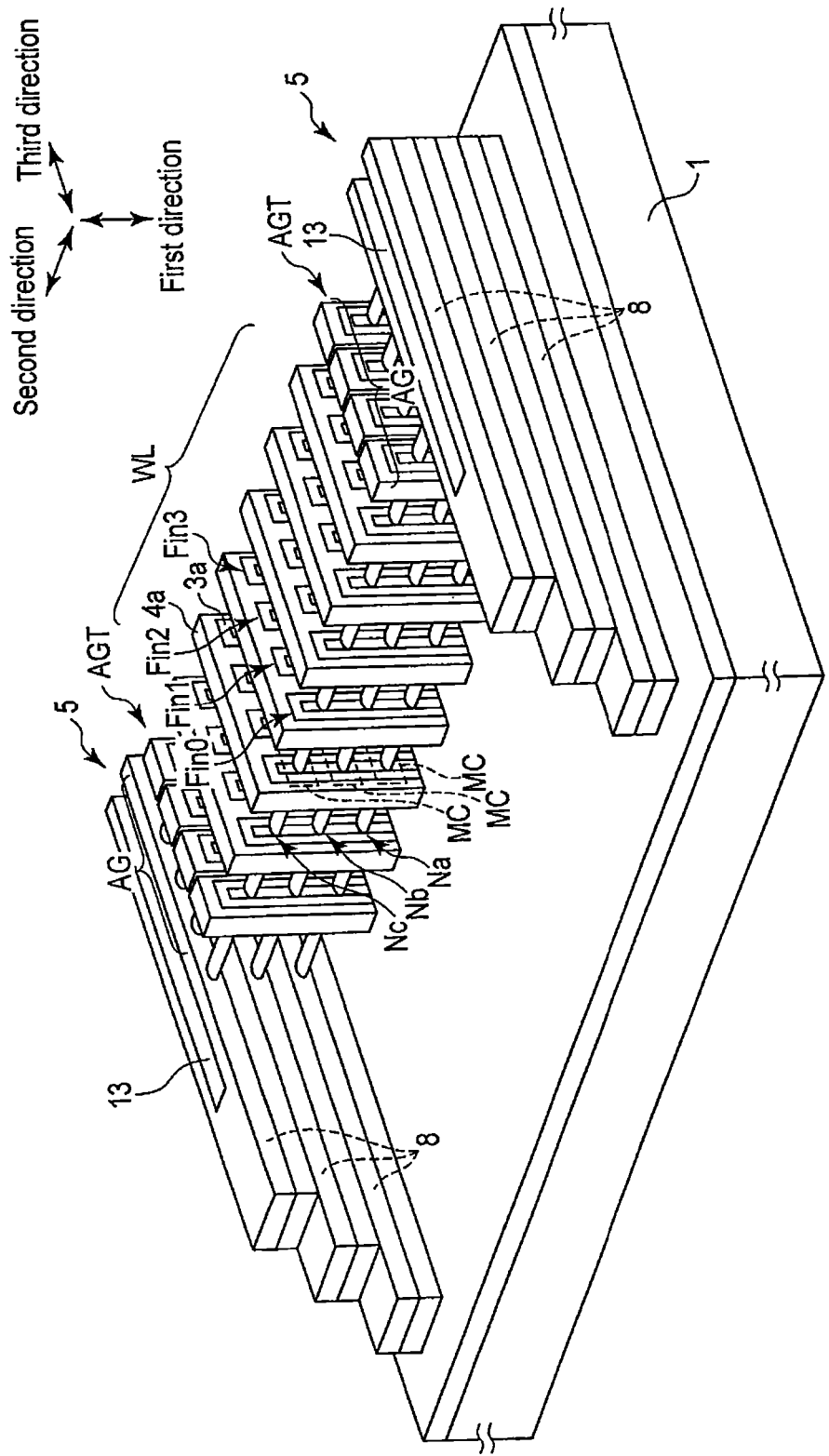
F I G. 26

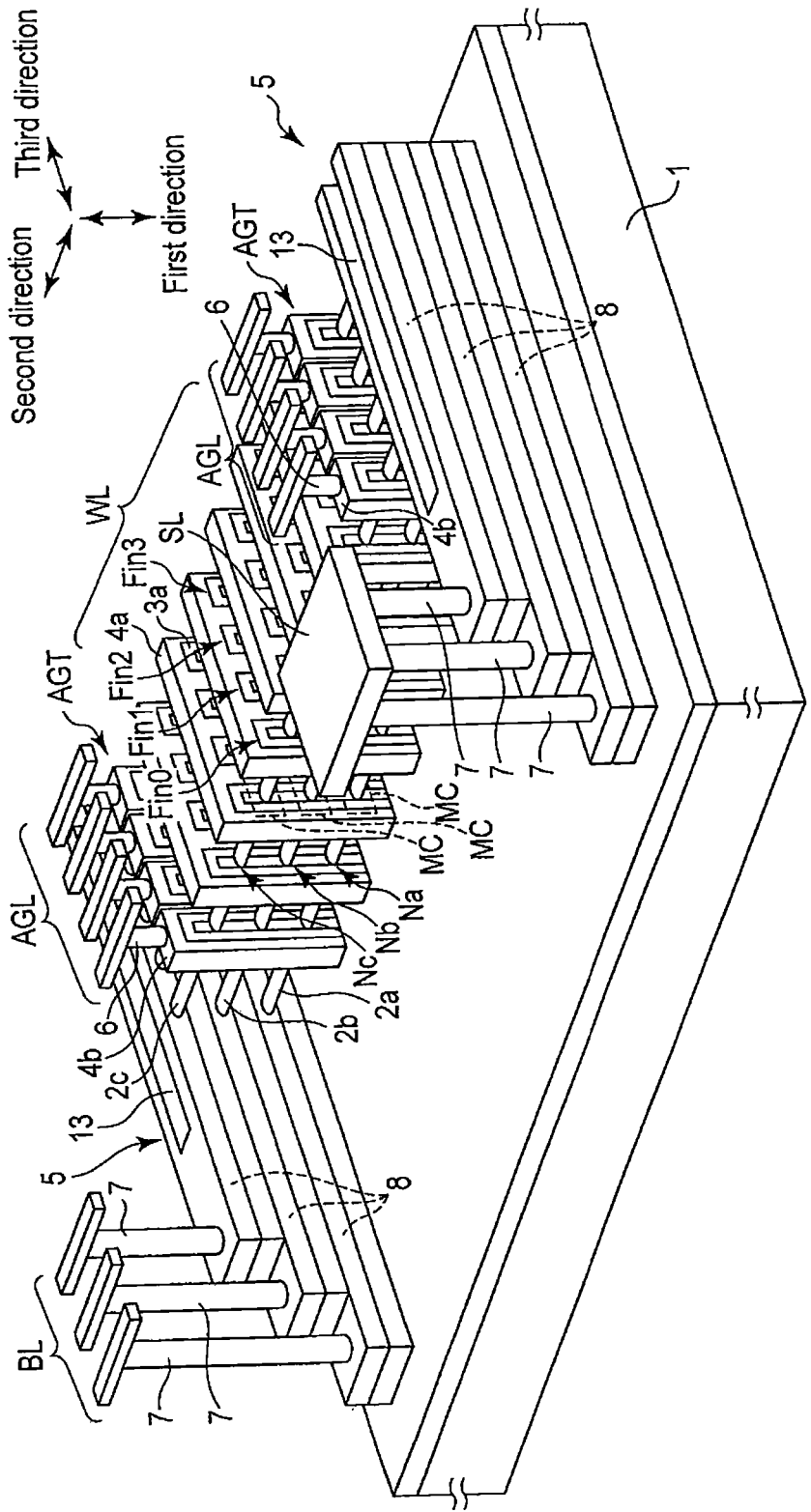
F I G. 27

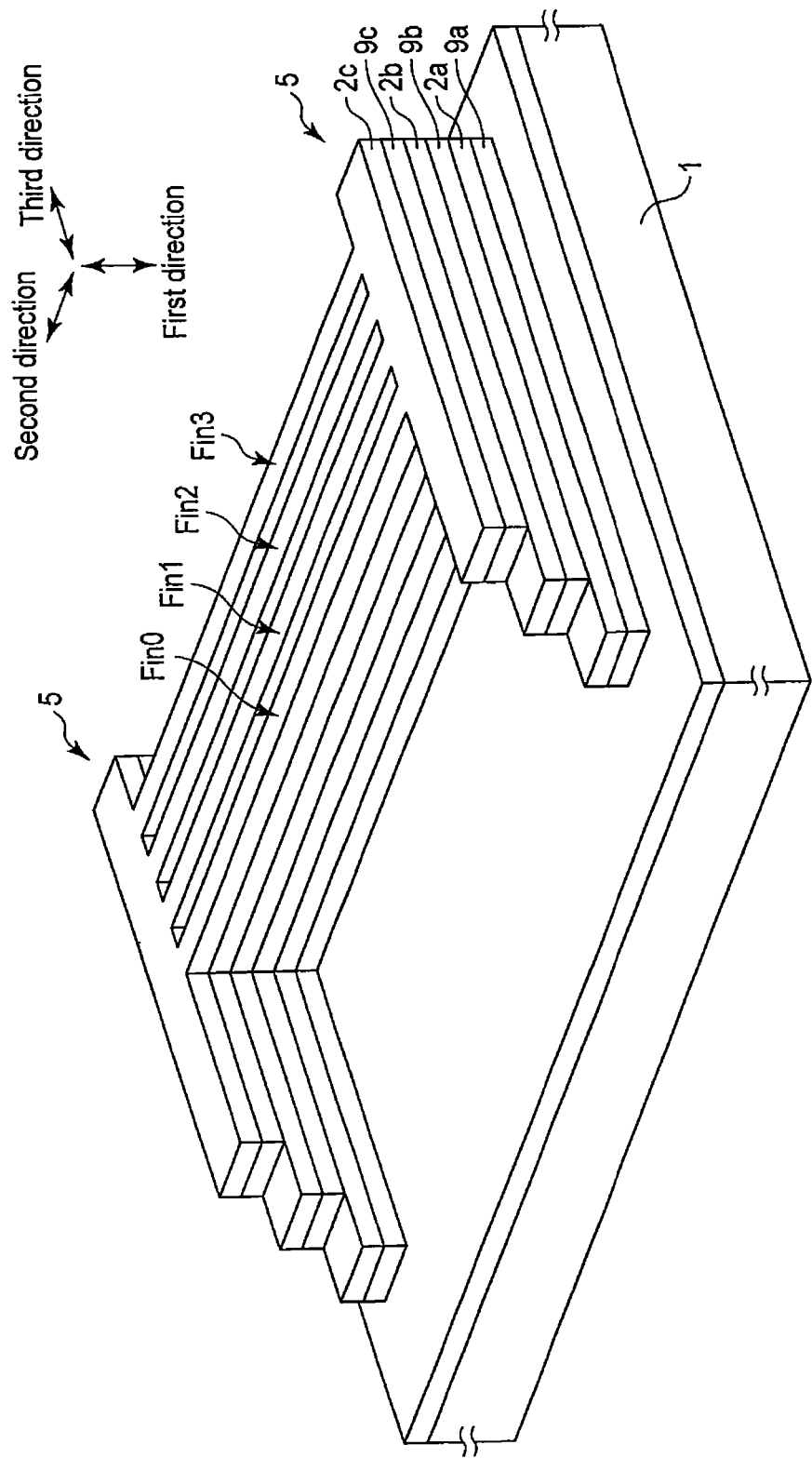
F I G. 28

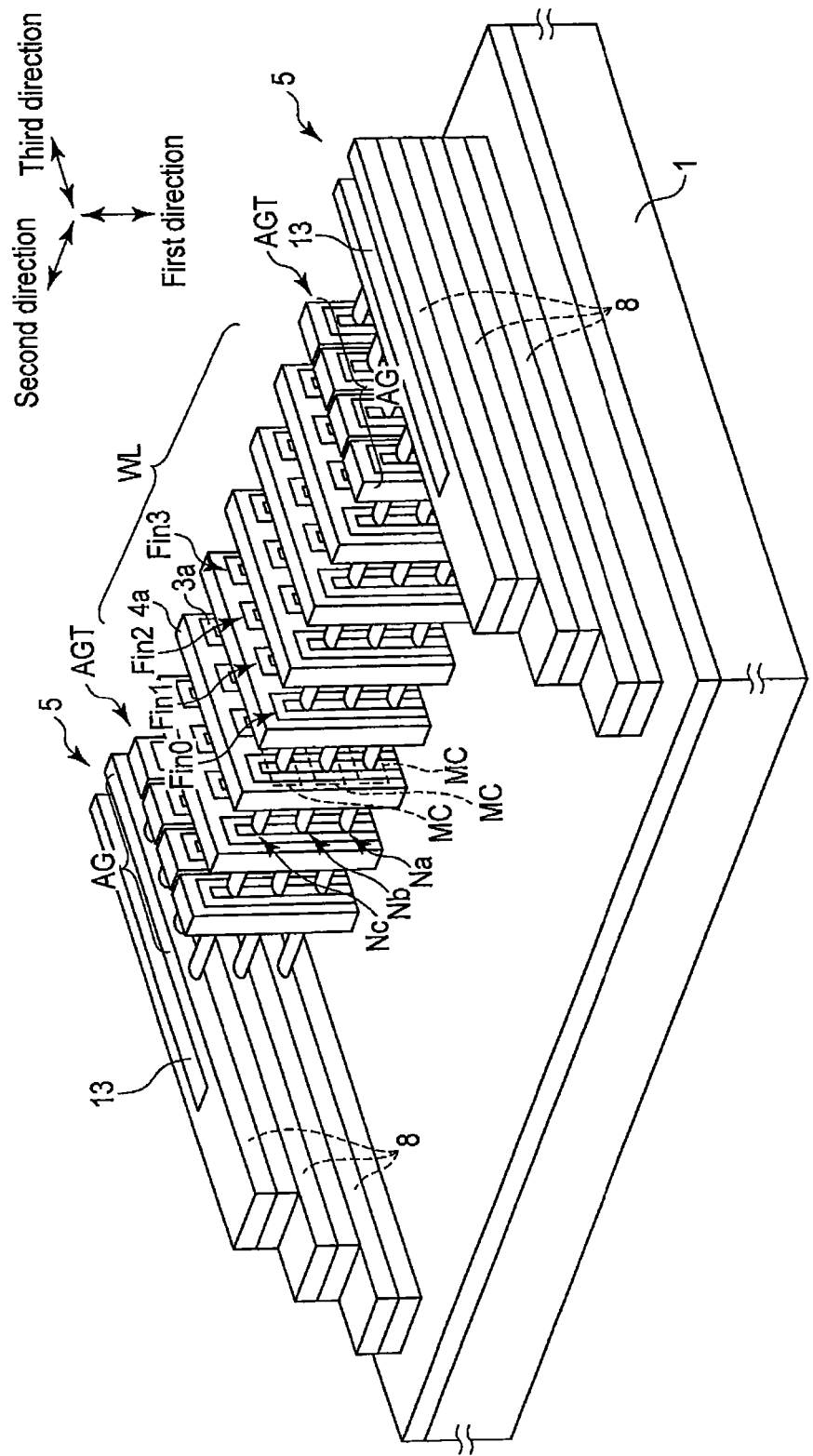
F I G. 29

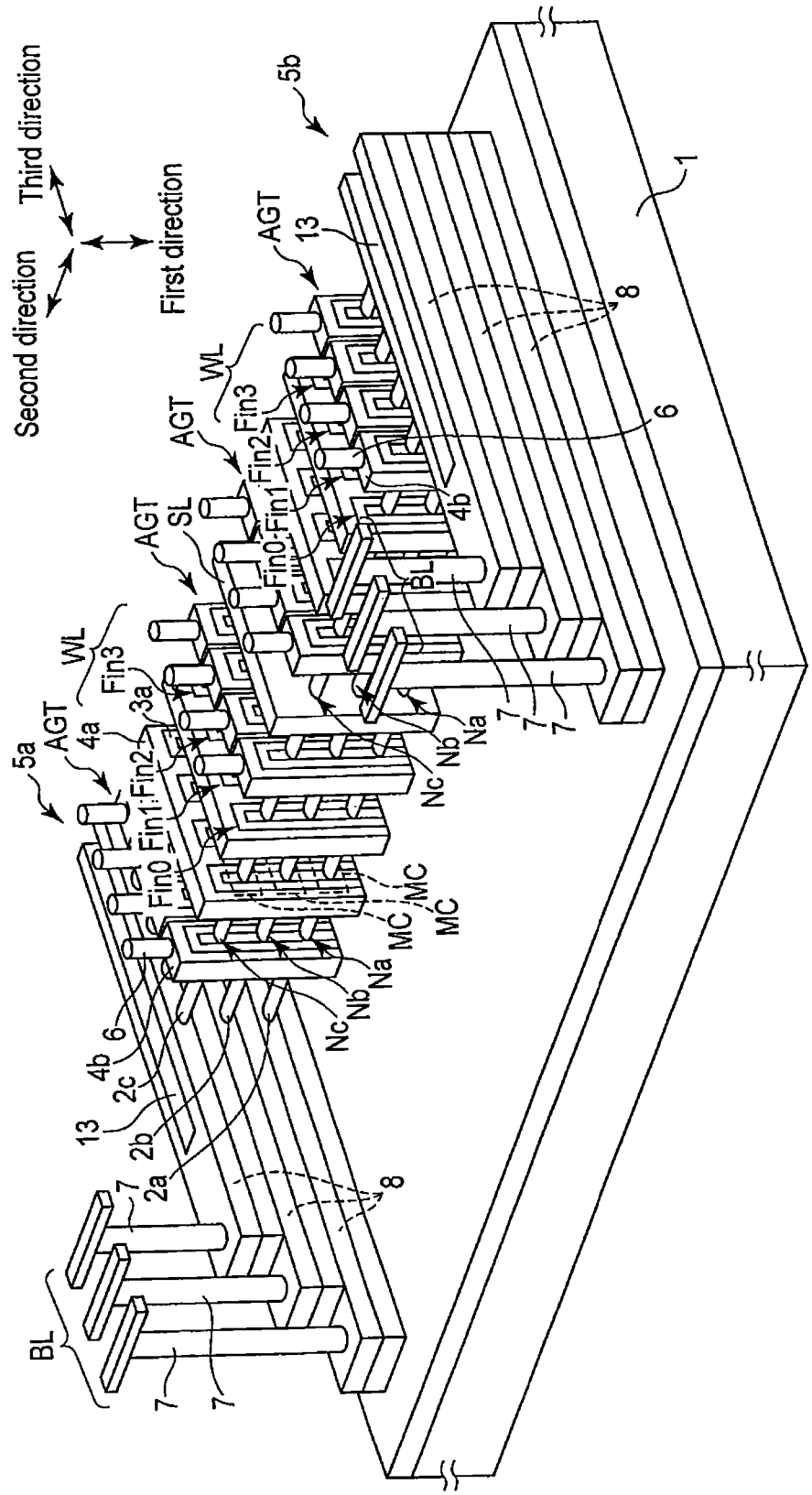
F I G. 30

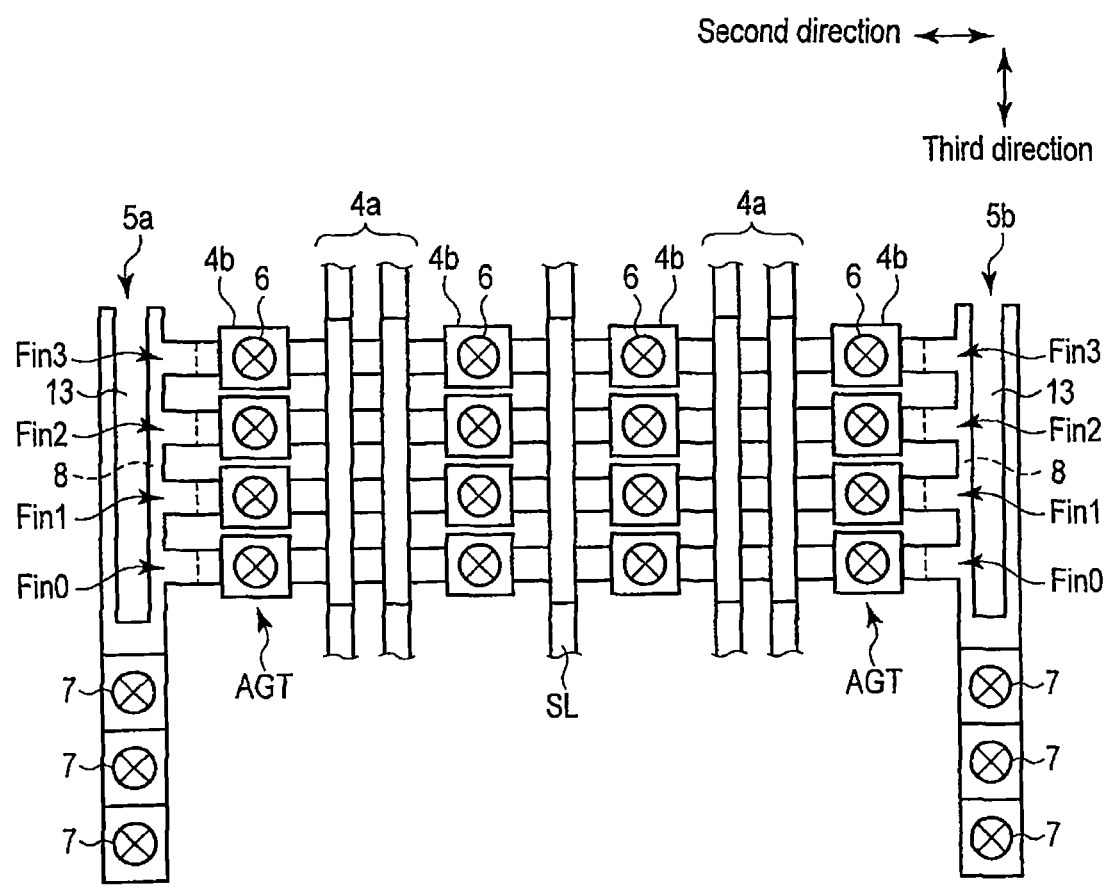
F I G. 31

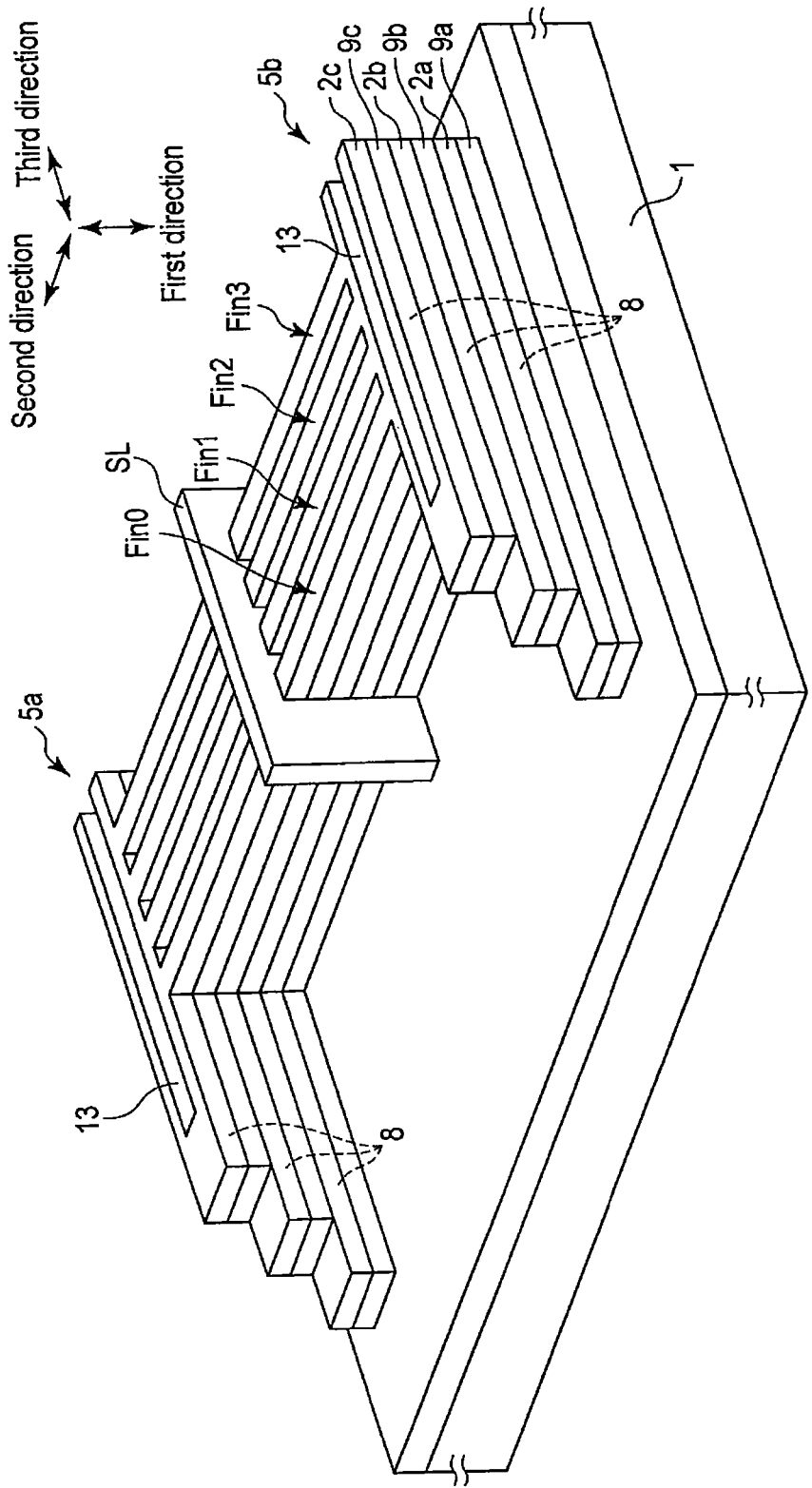
F I G. 34

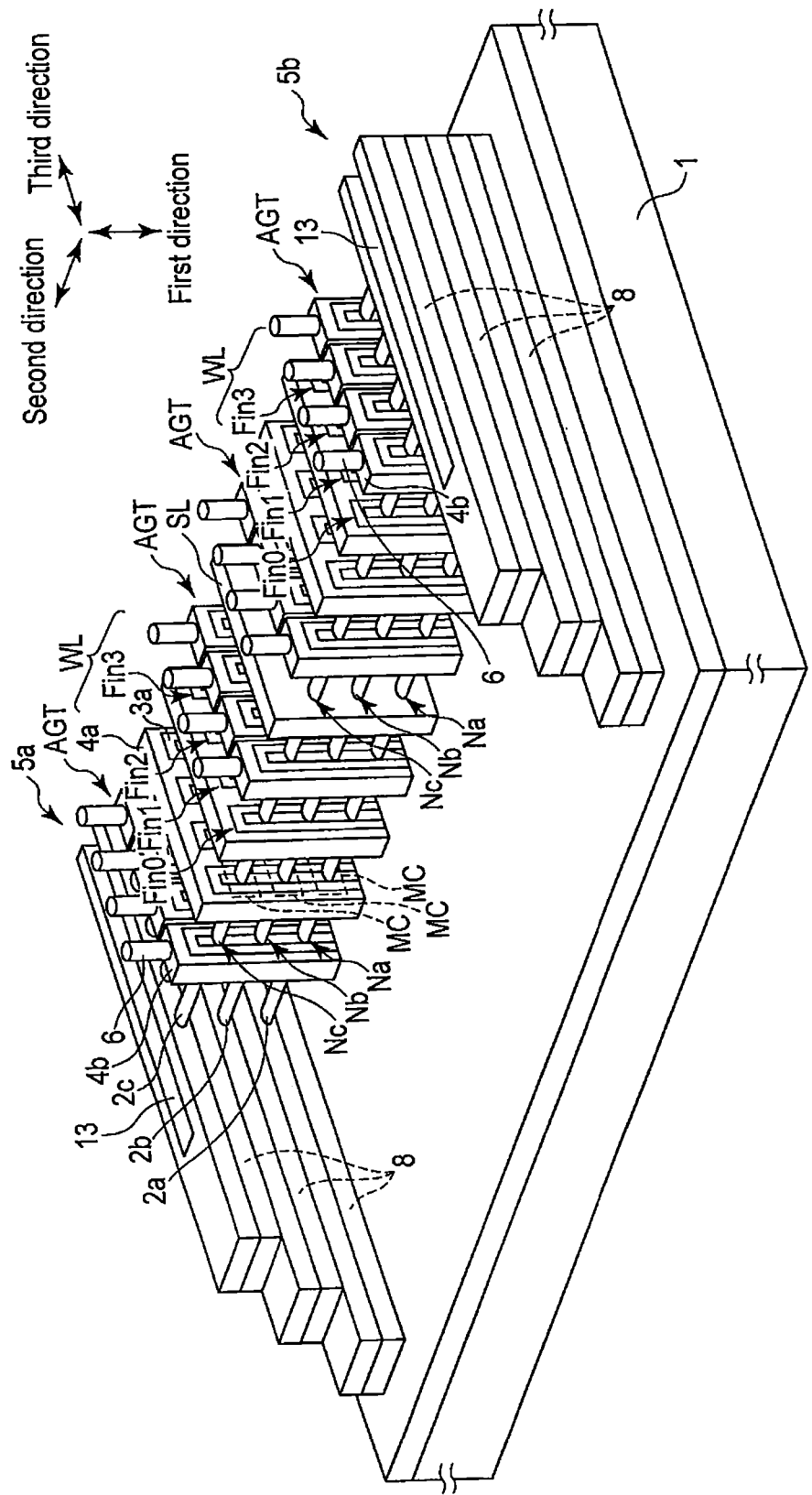
F I G. 35

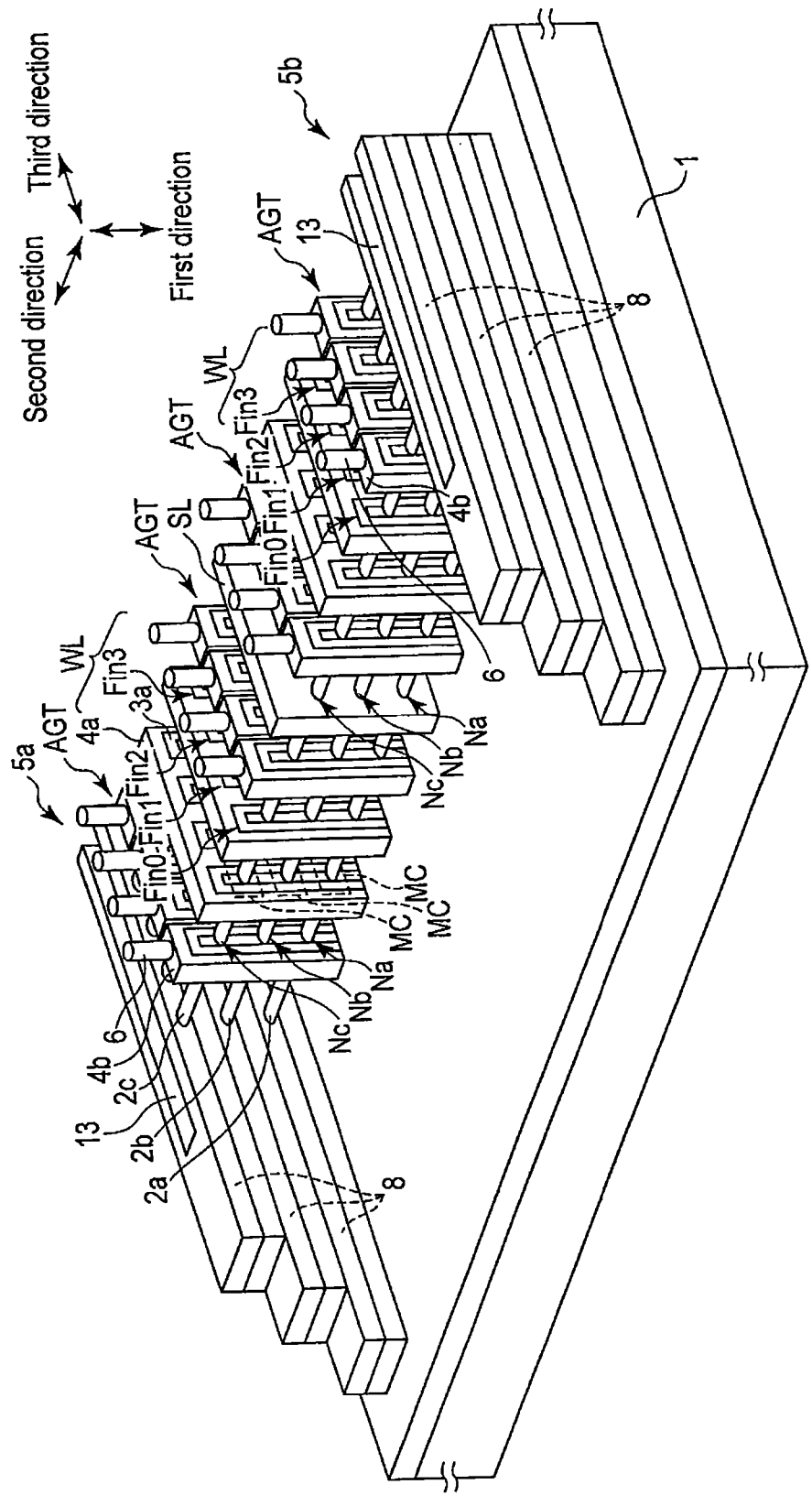
F I G. 36

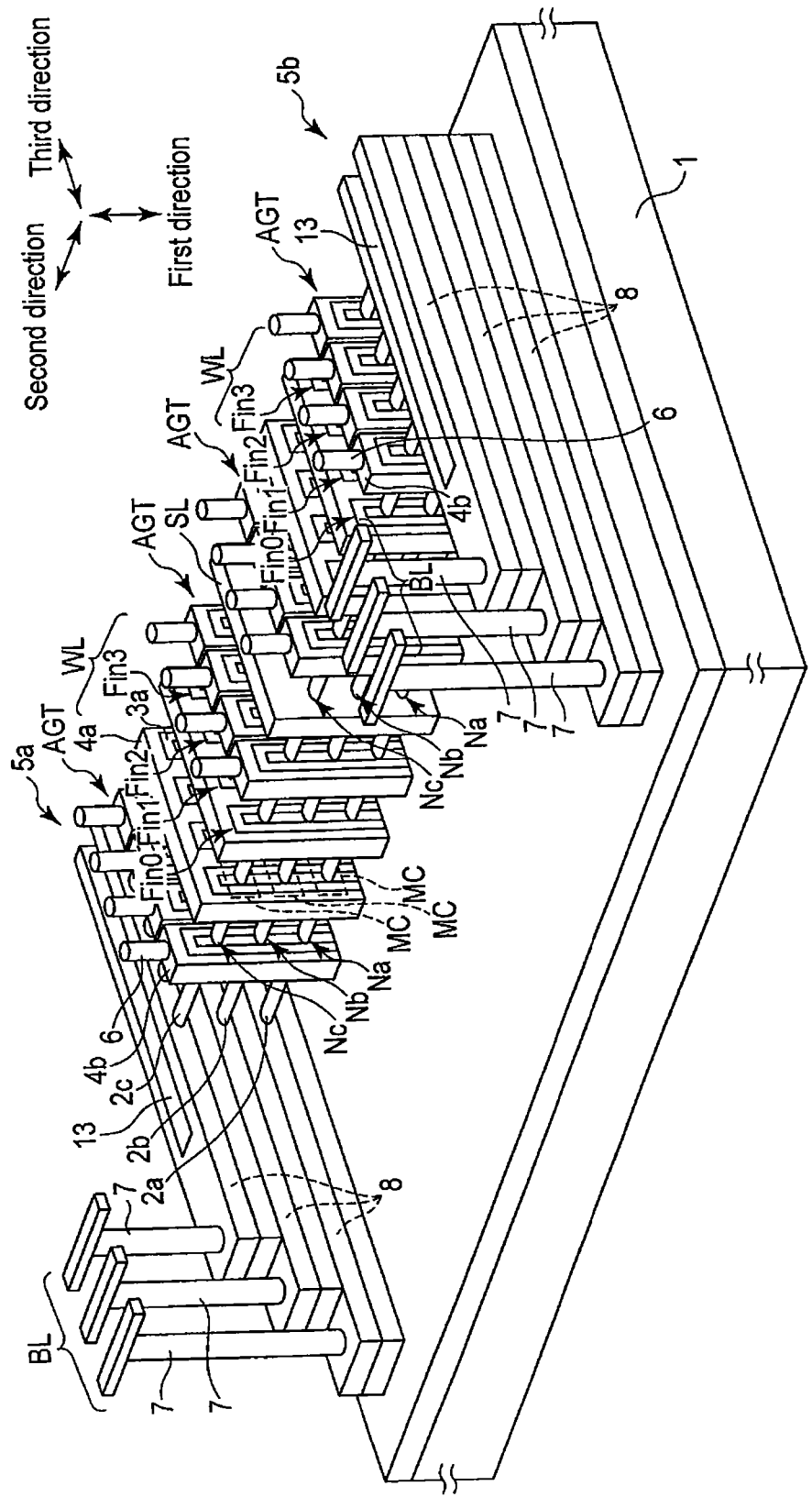
F I G. 37

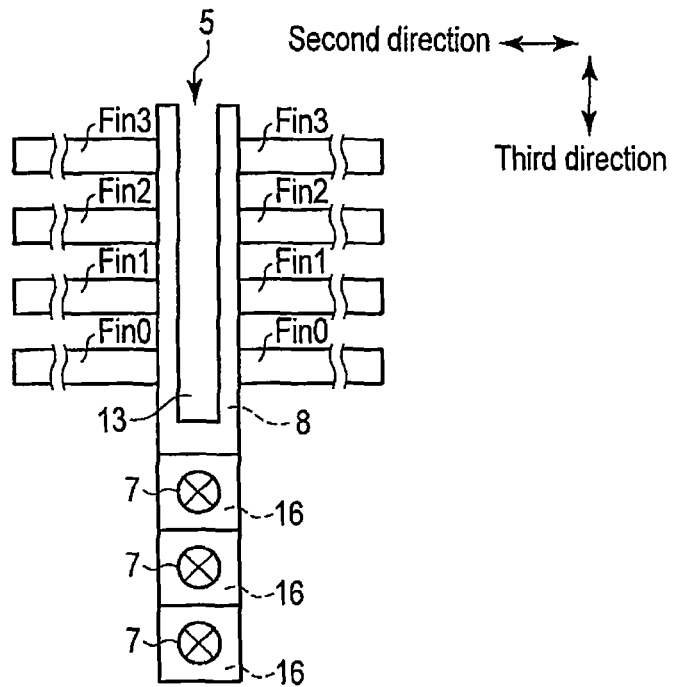
F I G. 38
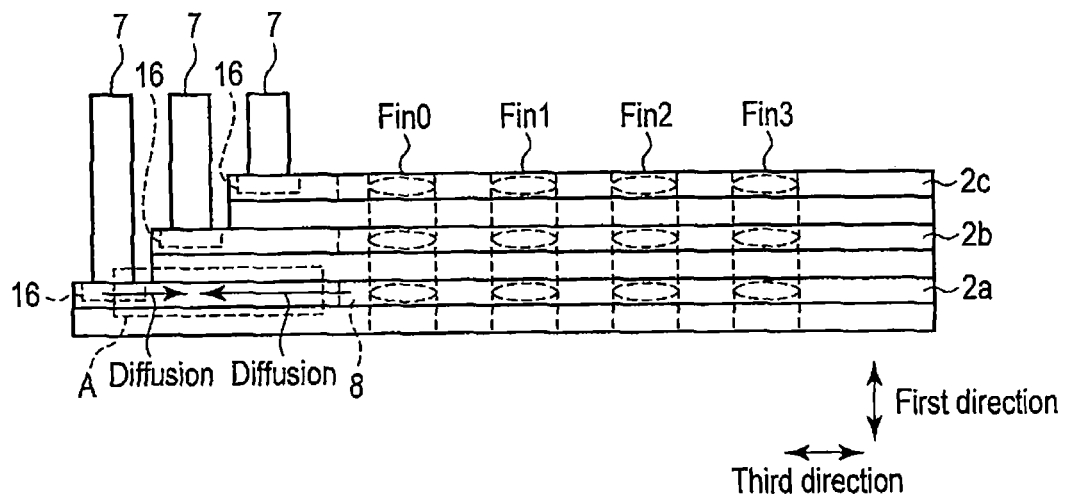
F I G. 39

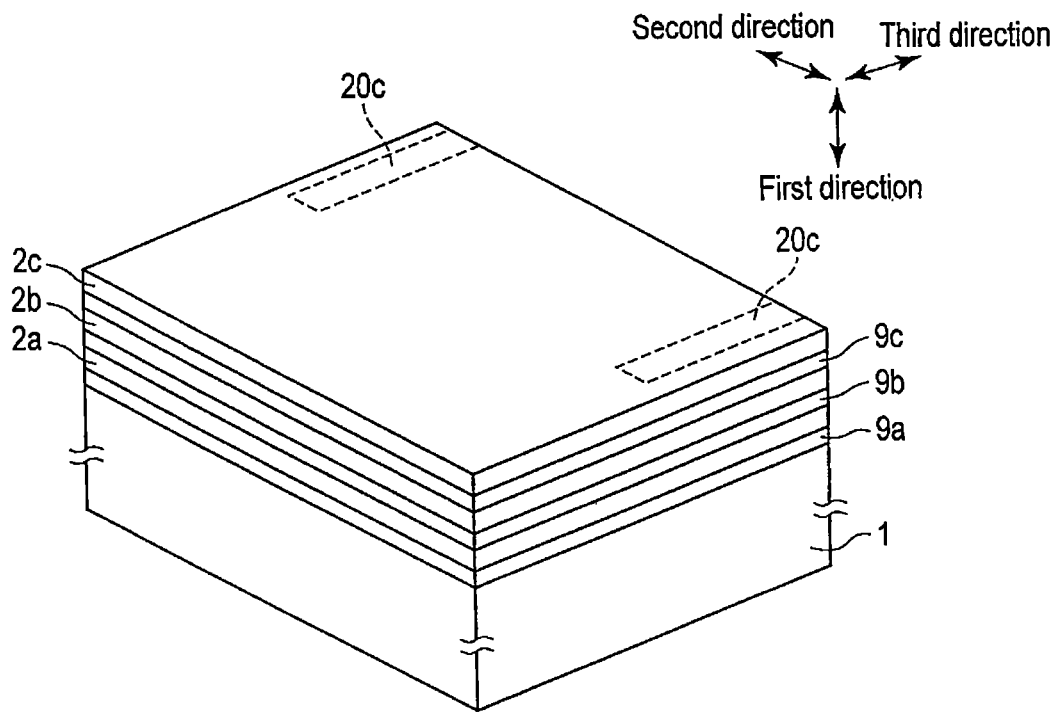
F I G. 4 8
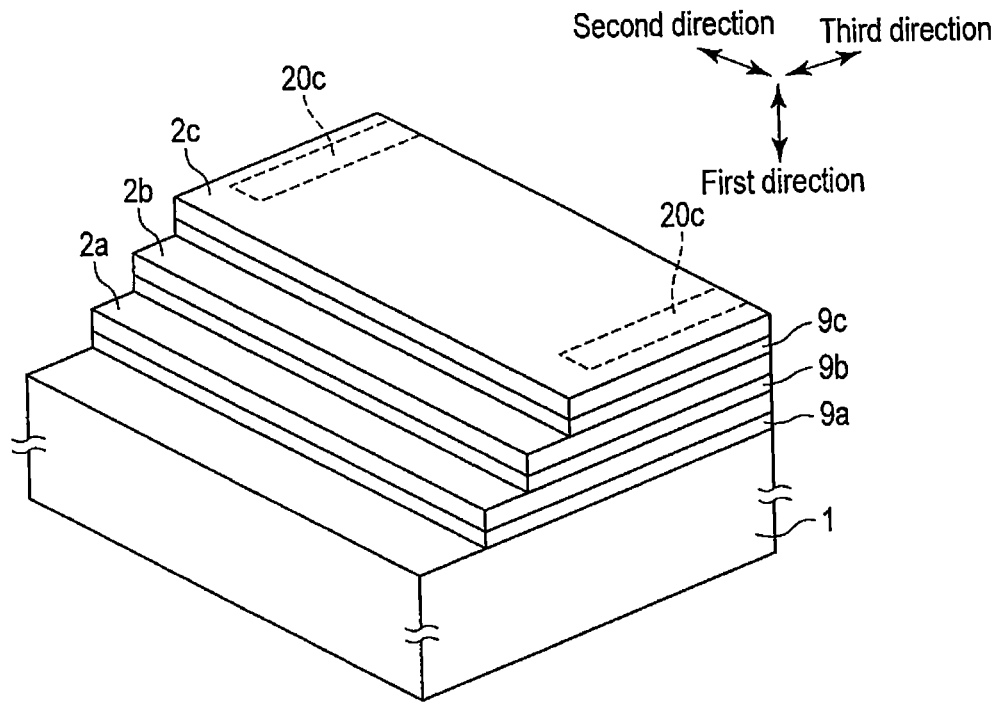
F I G. 4 9

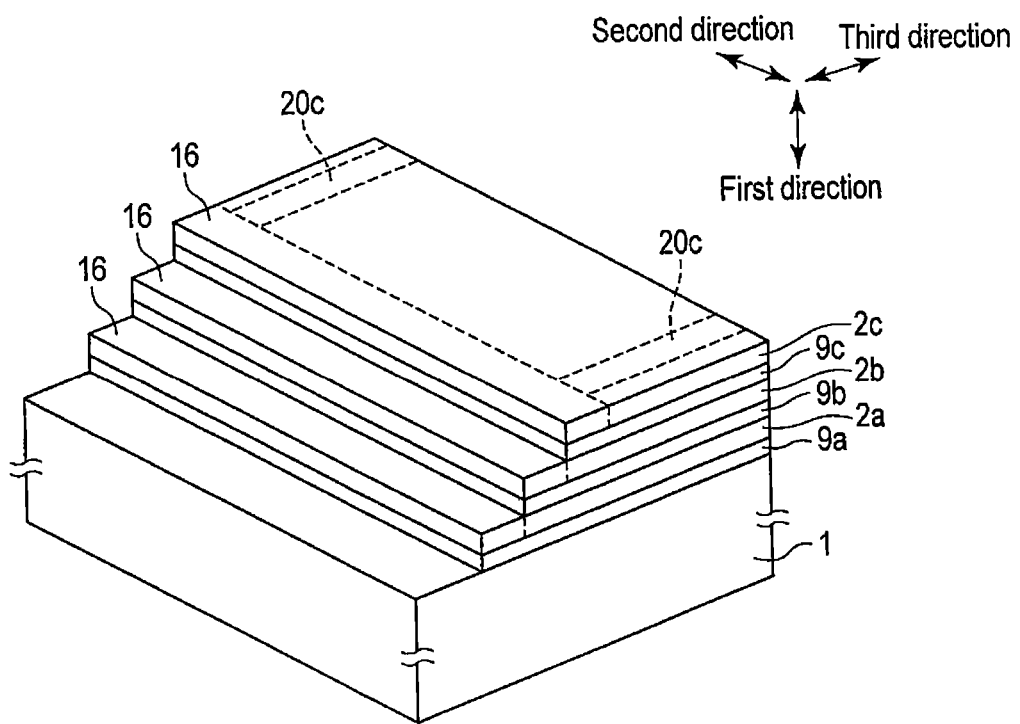
F I G. 5 0

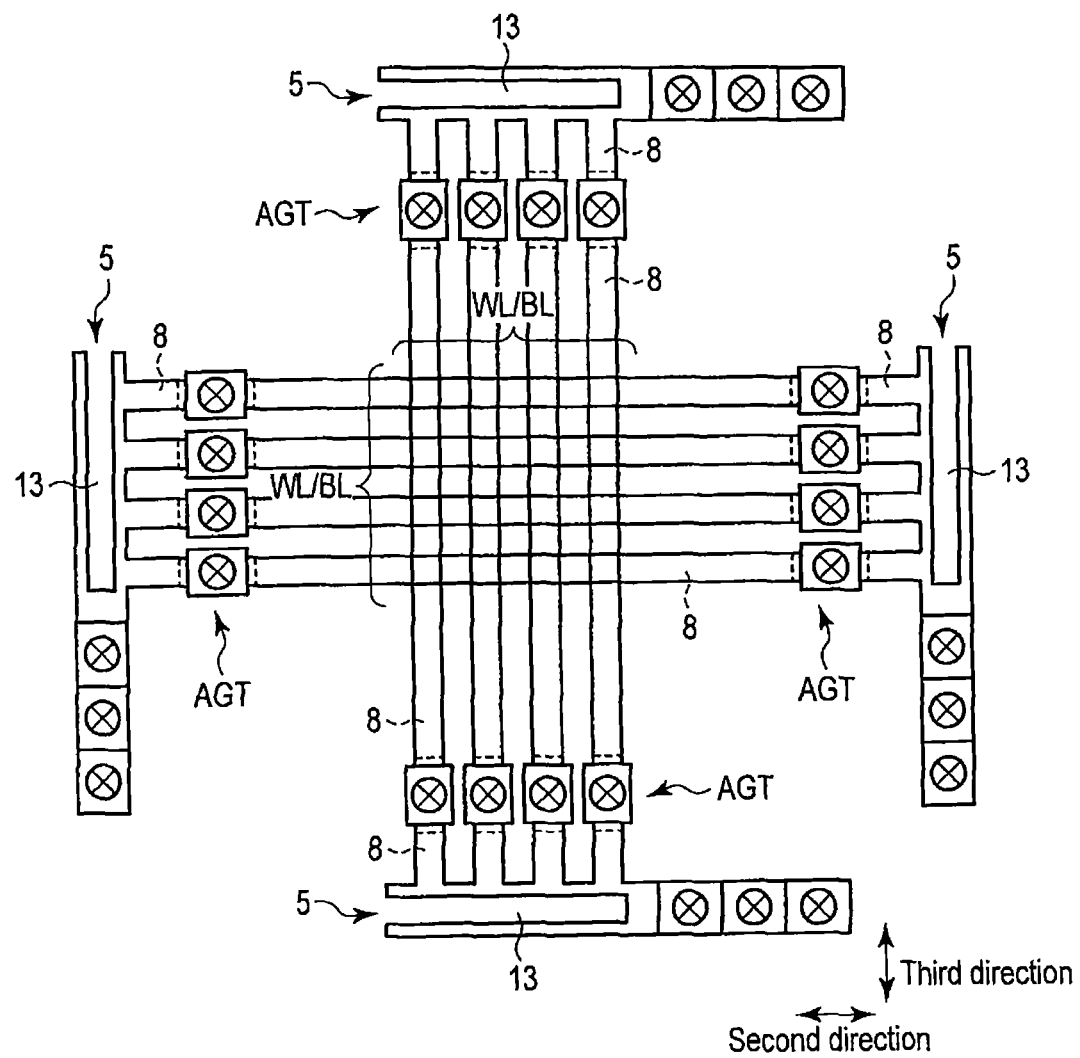
F I G. 5 2

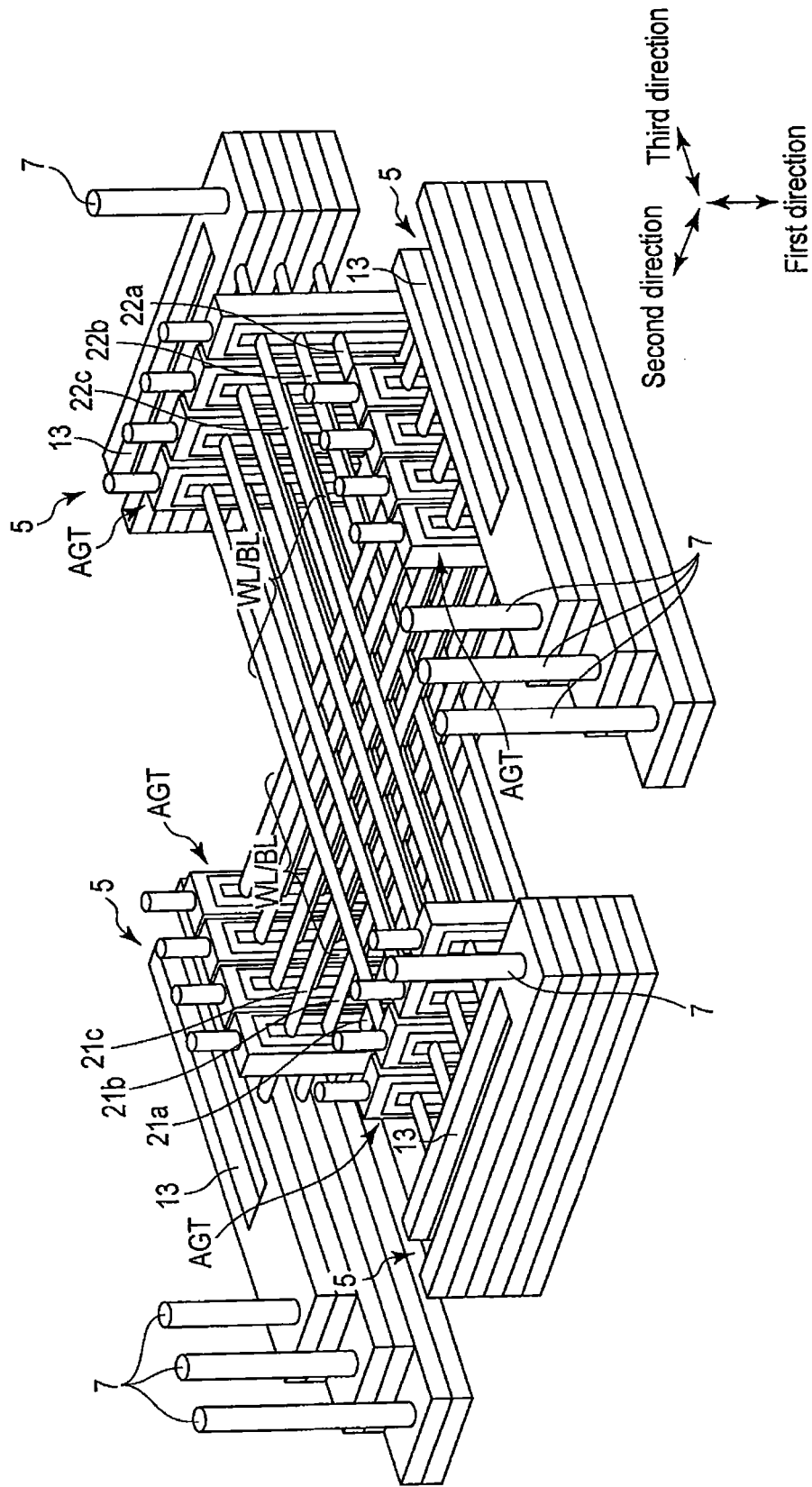
F I G. 56

NONVOLATILE SEMICONDUCTOR MEMORY DEVICE AND METHOD OF MANUFACTURING THE SAME

CROSS-REFERENCE TO RELATED APPLICATIONS

This application is based upon and claims the benefit of priority from prior Japanese Patent Application No. 2011-157157, filed Jul. 15, 2011, the entire contents of which are incorporated herein by reference.

FIELD

Embodiments described herein relate generally to a nonvolatile semiconductor memory device and a method of manufacturing the same.

BACKGROUND

For higher integration and higher capacity of a nonvolatile semiconductor memory device, it is necessary to reduce design rules. In order to reduce the design rules, enhanced micro fabrication of wiring patterns or the like is needed. This, however, requires an extremely high level of fabrication technique, so that the reduction of the design rules has become increasingly difficult.

Accordingly, nonvolatile semiconductor memory devices having three-dimensional structures have recently been suggested for higher integration of memory cells.

A common feature of these nonvolatile semiconductor memory devices is that a fin type stacked layer structure is obtained by a semiconductor substrate and memory strings. The memory strings are stacked in a first direction perpendicular to the surface of the semiconductor substrate, and extend in a second direction parallel to the surface of the semiconductor substrate. The memory strings comprise memory cells connected in series in the second direction. One end of the fin type stacked layer structure in the second direction is connected to a beam extending in a third direction perpendicular to the first and second directions. The beam has, for example, a structure in which semiconductor layers and insulating layers are alternately stacked, and functions to prevent the collapse of the fin type stacked layer structure. A function of selecting one of the memory strings is added to a part of the beam.

According to such a structure, theoretically, integration can be enhanced by the increase of the number of stacked memory strings and by the reduction of the fin width (width in the third direction) of the fin type stacked layer structure.

However, both the semiconductor layers that constitute the memory strings and the semiconductor layers that constitute the beam are made of, for example, monocrystalline Si. In this case, if no resistance reduction technique is applied to these semiconductor layers, memory characteristics deteriorate due to the rise of the resistance value (wiring resistance) of the semiconductor layers. This problem becomes more obvious when amorphous Si or polycrystalline Si is used in the semiconductor layer for cost reduction.

BRIEF DESCRIPTION OF THE DRAWINGS

FIG. 1 is a perspective view showing a first embodiment;
FIG. 4 to FIG. 9 are diagrams showing a method of manufacturing the structure shown in FIG. 1;
FIG. 10 is a perspective view showing a second embodiment;
FIG. 12 to FIG. 19 are diagrams showing a method of manufacturing the structure shown in FIG. 10;
FIG. 20 is a perspective view showing a third embodiment;
FIG. 21 is a plan view of FIG. 20;
FIG. 22 and FIG. 23 are diagrams showing a modification of a slit;
FIG. 24 to FIG. 29 are diagrams showing a method of manufacturing the structure shown in FIG. 20;
FIG. 30 is a perspective view showing a fourth embodiment;
FIG. 31 is a plan view of FIG. 30;
FIG. 32 to FIG. 37 are diagrams showing a method of manufacturing the structure shown in FIG. 30;
FIG. 38 to FIG. 50 are diagrams showing an example of a resistance reduction technique;
FIG. 52 is a plan view of FIG. 51;
FIG. 55 and FIG. 56 are diagrams showing a modification of the structure shown in FIG. 51.

DETAILED DESCRIPTION

Figure 2:
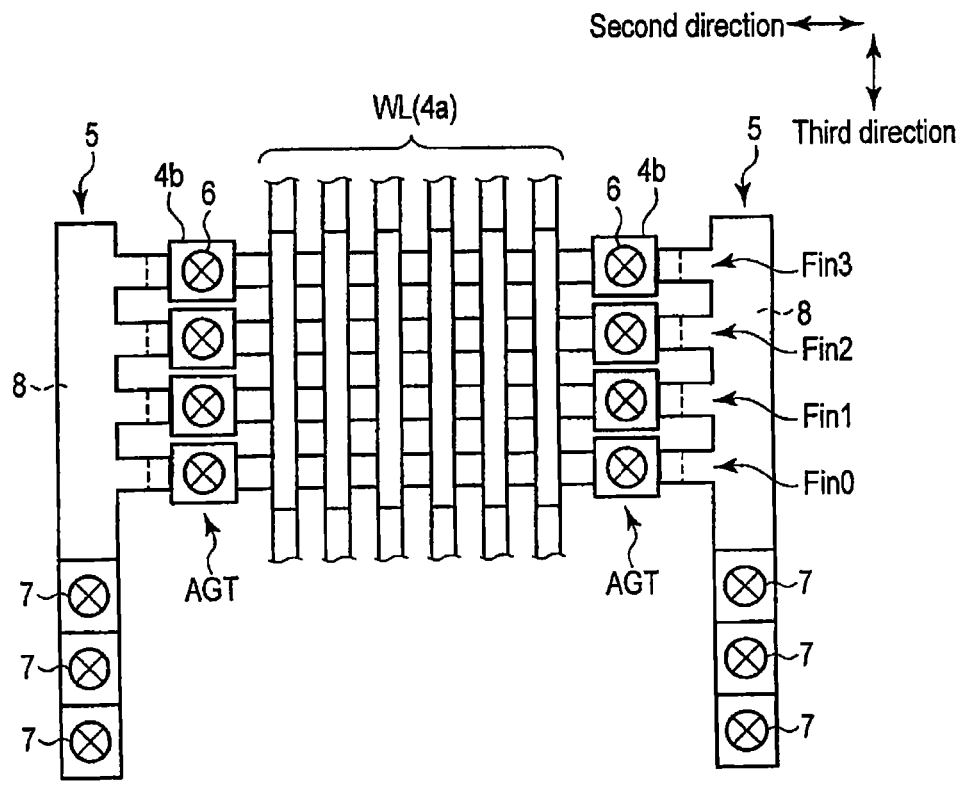
FIG. 2 is a plan view of FIG. 1.

In general, according to one embodiment, a nonvolatile semiconductor memory device comprises: a semiconductor substrate; a fin type stacked layer structure which has first and second memory cells stacked in a first direction perpendicular to the surface of the semiconductor substrate and which extends in a second direction parallel to the surface of the semiconductor substrate; and a beam which is connected to an end of the structure in the second direction and which extends in a third direction perpendicular to the first and second directions. The structure and the beam each comprises first and second semiconductor layers stacked in the first direction. The beam comprises a contact portion being contact with the first and second semiconductor layers at one end of the beam in the third direction, and a low resistance portion having a resistance value lower than that of the first and second semiconductor layers. The low resistance portion is provided between the contact portion and the end of the structure in the second direction.

Hereinafter, embodiments will be described with reference to the drawings.

Like components are provided with like reference numerals throughout the embodiments below and are not repeatedly described. The drawings are schematic diagrams for explaining the embodiments and serve for the understanding of the same. In these drawings, the shapes, dimensions, and ratios are different in some parts from those of an actual device, but can be suitably designed and changed taking the following explanation and known techniques into consideration.

1. Basic Structure

A technique suggested by the embodiments transforms memory cells into a three-dimensional form by a fin type stacked layer structure, and in a nonvolatile semiconductor memory device (e.g., vertical gate ladder-bit cost scalable memory) which has a semiconductor layer connected to a memory cell within a beam supporting the fin type stacked layer structure, this technique reduces the resistance of the semiconductor layer within the beam.

The fin type stacked layer structure has first and second memory cells stacked in a first direction perpendicular to the surface of a semiconductor substrate, and extends in a second direction parallel to the surface of the semiconductor substrate. The beam is connected to one end of the fin type stacked layer structure in the second direction, and extends in a third direction perpendicular to the first and second directions. The fin type stacked layer structure and the beam each comprise first and second semiconductor layers stacked in the first direction.

For example, when each of the first and second memory cells is an FET which has a recording layer and a gate electrode and which changes in threshold in accordance with the state of the recording layer, the first and second memory cells uses the first and second semiconductor layers as channels. The recording layer may be a charge storage layer having a charge storage function, or may be a resistance change layer whose resistance value changes in accordance with a voltage, a current, heat, a magnetic field, or the like.

Moreover, for example, when a third semiconductor layer extending in the third direction is further provided between the first and second semiconductor layers, the first memory cell can be a resistance change element disposed between the first and third semiconductor layers, and the second memory cell can be a resistance change element disposed between the second and third semiconductor layers.

In the nonvolatile semiconductor memory device having such a structure, the beam has a contact portion for the first and second semiconductor layers at one end in the third direction, and a low resistance portion extending to the contact portion from a connection portion between the beam and the fin type stacked layer structure.

This low resistance portion has a resistance value lower than those of the first and second semiconductor layers. The low resistance portion may be an impurity region in which an impurity is implanted in the first and second semiconductor layers, or may be a low resistance layer formed on the side surfaces of the first and second semiconductor layers in the second direction.

When the width of the beam in the second direction is greater than the width of the fin type stacked layer structure in the third direction, the low resistance portion can be easily formed if the beam is provided with a slit passing through the first and second semiconductor layers. When the contact portion has a stepped shape, a low resistance layer having a resistance value lower than those of the first and second semiconductor layers which are exposed by the stepped shape is preferably added to the first and second semiconductor layers.

Here, it is preferable that beams are respectively provided at both ends of the fin type stacked layer structure, but a beam may be only provided at one end of the fin type stacked layer structure.

When a memory string comprising memory cells connected in series is formed in the fin type stacked layer structure, the beam located at one end of the fin type stacked layer structure is a conductive wire which connects the memory string to a bit line or a source line. Thus, the resistance reduction technique according to the embodiments is effective in enhancing the performance of the nonvolatile semiconductor memory device.

In addition, beams may be respectively provided at both ends of the fin type stacked layer structure, and a common source electrode passing through the fin type stacked layer structure may be provided. In this case, each of the beams located at both ends of the fin type stacked layer structure is a conductive wire which connects the memory string to the bit line.

2. First Embodiment

(1) Structure

FIG. 1 shows a perspective view of a nonvolatile semiconductor memory device. FIG. 2 shows a plan view of the device shown in FIG. 1.

On semiconductor substrate (e.g., Si substrate) 1, there are arranged memory strings Na, Nb, and Nc stacked in a first direction perpendicular to the surface of the substrate and extending in a second direction parallel to the surface of semiconductor substrate 1. In the present embodiment, the number of the memory strings stacked in the first direction is three, but the present embodiment is not limited to this embodiment. That is, the number of the memory strings stacked in the first direction may be two or more.

The larger number of the memory strings stacked in the first direction is more suitable for higher capacity of the nonvolatile semiconductor memory device.

These memory strings Na, Nb, and Nc are constituted of three semiconductor layers (e.g., monocrystalline Si layers) 2a, 2b, and 2c stacked in the first direction, and memory cells MC connected in series in the second direction. In the present embodiment, the number of memory cells MC connected in series is six, but the present embodiment is not limited to this embodiment. That is, the number of the memory cells connected in series in the second direction may be two or more.

The larger number of the memory cells connected in series in the second direction is more suitable for higher capacity of the nonvolatile semiconductor memory device.

Figure 3:
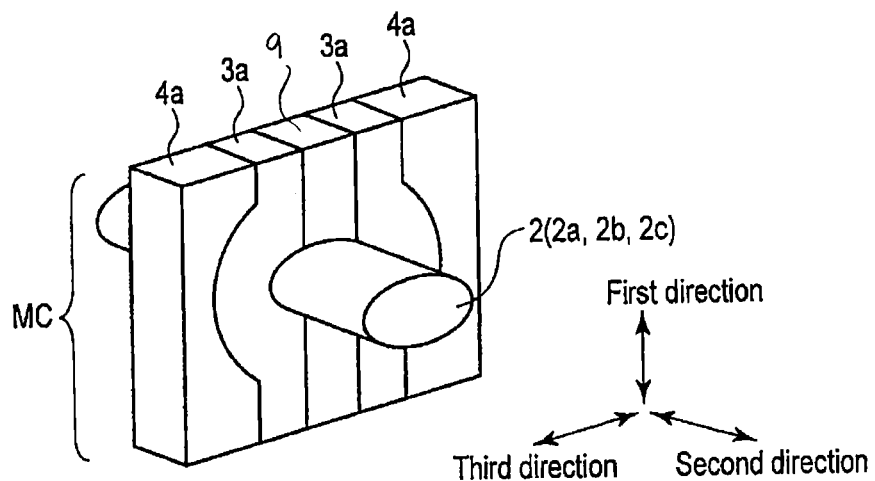
FIG. 3 is a diagram showing a memory cell.

For example, as shown in FIG. 3, each of the memory cells MC comprises recording layer 3a disposed on the side surface of semiconductor layer 2 (2a, 2b, or 2c) in a third direction perpendicular to the first and second directions, and gate electrode (e.g., word line WL) 4a disposed on the side of recording layer 3a which is opposite to the side of semiconductor layer 2. Reference number 9 denotes an insulating layer.

Gate electrode 4a extends in the first direction on the side of the side surface of each of semiconductor layers 2a, 2b, and 2c that is located in the third direction. Moreover, when gate electrode 4a is seen from the upper surface thereof, gate electrode 4a extends across memory strings Na, Nb, and Nc in the third direction.

Beams 5 extending in the third direction are connected to both ends of each of memory strings Na, Nb, and Nc in the second direction. When semiconductor layers 2a, 2b, and 2c are separated by insulating layers and one semiconductor layer and one insulating layer are alternately stacked to form fin type stacked layer structures Fin0 to Fin3. In this case, for example, beams 5 have the same structure as fin type stacked layer structures Fin0 to Fin3.

Beams 5 have a function of fixing memory strings Na, Nb, and Nc, and preventing, for example, the collapse of fin type stacked layer structures Fin0 to Fin3. The width of each beam 5 in the second direction is preferably greater than the width of each of fin type stacked layer structures Fin0 to Fin3 in the third direction, i.e., the width of each of semiconductor layers 2a, 2b, and 2c in the third direction.

Between each of memory strings Na, Nb, and Nc and beam 5, for example, assist gate transistor AGT is disposed to select one fin type stacked layer structure (one group comprising memory strings Na, Nb, and Nc). Assist gate transistors AGT have only to function as switches. Therefore, assist gate transistors AGT may have the same structure as memory cells MC, or may have a different structure.

In the present embodiment, assist gate transistor AGT has recording layer 3 and gate electrode (assist gate electrode) 4b, similarly to each memory cell MC. When assist gate transistors AGT are different in structure from memory cells MC, assist gate transistors AGT can be constituted of, for example, transistors having a metal-oxide-semiconductor (MOS) structure.

Gate electrodes 4b are electrically isolated from one another. Moreover, gate electrodes 4b are connected to assist gate lines AGL via contact plugs 6.

At an end of beam 5 in the third direction, a function of selecting one of memory strings Na, Nb, and Nc is added. For example, the end of beam 5 in the third direction has a stepped shape, and contact plug 7 is independently connected to each of the semiconductor layers in beam 5 (each of the semiconductor layers in fin type stacked layer structures Fin0 to Fin3).

Bit line BL is connected to contact plug 7 on one of two beams 5, and source line SL is connected to contact plug 7 on the other beam.

In consequence, one of memory strings Na, Nb, and Nc (one of the semiconductor layers in fin type stacked layer structures Fin0 to Fin3) can be selected. That is, the respective semiconductor layers in fin type stacked layer structures Fin0 to Fin3 can independently be controlled as the channels of the memory strings.

In the present embodiment, fin type stacked layer structures Fin0 to Fin3 are arranged in the third direction. In the present embodiment, the number of fin type stacked layer structures Fin0 to Fin3 arranged in the third direction is four, but the present embodiment is not limited to this embodiment. That is, the number of fin type stacked layer structures Fin0 to Fin3 arranged in the third direction may be two or more.

It is to be noted that the larger number of fin type stacked layer structures Fin0 to Fin3 arranged in the third direction is suitable for higher capacity of the nonvolatile semiconductor device.

Although assist gate transistors AGT are arranged at both ends of each of memory strings Na, Nb, and Nc in the second direction in the present embodiment, one fin type stacked layer structure can be selected if assist gate transistor AGT is only disposed at one end of the memory string. However, if high reliability resulting from the inhibition of program disturb is taken into account, it is preferable to provide assist gate transistors AGT at both ends of each of memory strings Na, Nb, and Nc in the second direction.

When assist gate transistors AGT are provided at both ends of each of memory strings Na, Nb, and Nc in the second direction, assist gate transistor AGT at one end of each of memory strings Na, Nb, and Nc in the second direction may share assist gate electrode 4b with the fin type stacked layer structure disposed in the third direction, and function as a select gate transistor. In this case, the gate width of the select gate transistor can be smaller than the gate width of the assist gate transistor, so that the memory strings can be shorter, which can contribute to higher integration.

In the structure described above, according to the present embodiment, the resistance reduction technique is applied to beam 5. Here, impurity region 8 is formed in each of the semiconductor layers constituting beam 5 (corresponding to the semiconductor layers in fin type stacked layer structures Fin0 to Fin3). Impurity region 8 is preferably formed all over each of the semiconductor layers constituting beam 5.

However, even if impurity region 8 is provided in part of each of the semiconductor layers constituting beam 5, the performance of the nonvolatile semiconductor memory device can be enhanced by the reduction of the resistance of beam 5. This impurity region 8 can prevent an operational delay during writing/erasing/reading in the memory cells, and increase the speed of the memory operation.

(2) Materials

Now, examples of materials that constitute components of the above-mentioned nonvolatile semiconductor memory device are described.

While materials best suited to the generations of the semiconductor memories can be properly selected as the materials that constitute the elements of the above-mentioned nonvolatile semiconductor memory device, examples of most often used materials are described below.

The semiconductor layers that constitute the fin type stacked layer structure and the beam are made of, for example, silicon (Si), and the insulating layer is made of, for example, silicon oxide ($SiO_2$). The semiconductor layers are preferably monocrystalline, but may be amorphous or polycrystalline. The uppermost insulating layers that constitute the fin type stacked layer structure and the beam comprise, for example, silicon oxide ($SiO_2$), silicon nitride ($SiN_x$), or a structure in which these materials are stacked.

The recording layer that constitutes memory cell MC is, for example, a charge storage layer (a floating gate electrode, a charge trap insulating layer, or the like), or a variable resistance layer (a material layer whose resistance value changes in accordance with a voltage, a current, heat, a magnetic field, or the like).

When the recording layer that constitutes memory cell MC is a charge storage layer, memory cell MC comprises a first gate insulating layer (tunnel insulating layer), a charge storage layer, a second gate insulating layer (block insulating layer), and a control gate electrode. In this case, the control gate electrodes need to be separated from each other in one memory string within one fin type stacked layer structure.

When the charge storage layer is a charge trap insulating layer, the first gate insulating layer, the charge storage layer, and the second gate insulating layer may be or may not be separated from one another in one memory string within one fin type stacked layer structure.

The first gate insulating layer is made of, for example, silicon oxide ($SiO_2$). The charge storage layer is made of, for example, silicon nitride ($Si_3N_4$). The second gate insulating layer is made of, for example, aluminum oxide ($Al_2O_3$). The control gate electrode is made of, for example, nickel silicide (NiSi). The first gate insulating layer may be, for example, a stack structure constituted of silicon oxynitride, silicon oxide, and silicon nitride. Moreover, the first gate insulating layer may include silicon nanoparticles, metal ions, or the like.

For example, the charge storage layer is made of at least one of the materials selected from the group consisting of silicon-rich SiN, $Si_xN_y$ having any composition ratio x, y of silicon and nitrogen, silicon oxynitride (SiON), aluminum oxide ($Al_2O_3$), aluminum oxynitride (AlON), hafnia ($HfO_2$), hafnium aluminate ($HfAlO_3$), hafnia nitride (HfON), hafnium nitride-aluminate (HfAlON), hafnium silicate (HfSiO), hafnium nitride-silicate (HfSiON), lanthanum oxide ($La_2O_3$), and lanthanum aluminate ($LaAlO_3$).

The charge storage layer may include silicon nanoparticles, metal ions, or the like. The charge storage layer may otherwise be made of impurity-doped polysilicon or a conductor such as a metal.

The second gate insulating layer is made of at least one of the materials selected from the group consisting of silicon oxide (SiO$_2$), silicon oxynitride (SiON), aluminum oxide (Al$_2$O$_3$), aluminum oxynitride (AlON), hafnia (HfO$_2$), hafnium aluminate (HfAlO$_3$), hafnia nitride (HfON), hafnium nitride-aluminate (HfAlON), hafnium silicate (HfSiO), hafnium nitride-silicate (HfSiON), lanthanum oxide (La$_2$O$_3$), lanthanum aluminate (LaAlO$_3$), and lanthanum aluminum silicate (LaAlSiO).

The control gate electrode is made of a metal compound such as tantalum nitride (TaN), tantalum carbide (TaC), or titanium nitride (TiN), or an electrically conductive metallic material such as Ni, V, Cr, Mn, Y, Mo, Ru, Rh, Hf, Ta, W, Ir, Co, Ti, Er, Pt, Pd, Zr, Gd, Dy, Ho, and Er and silicides of these substances.

As an impurity that constitutes the impurity region formed in the beam, it is possible to use an impurity serving as an N-type semiconductor, for example, a pentad such as arsenic (As) or phosphorus (P), an impurity serving as a P-type semiconductor, for example, a triad such as boron (B) or indium (In), and a combination of these substances.

The contact plug, the bit line, the assist gate line, and the source line are made of a metal material such as W or Al. These components may be made of the same material or different materials. The bit line and the assist gate line can be formed in the same wiring layer, and are therefore preferably made of the same material.

(3) Manufacturing Method

Now, a method of manufacturing the nonvolatile semiconductor memory device according to the first embodiment is described.

First, as shown in FIG. 4, first-conductivity-type (e.g., p-type) semiconductor substrate (e.g., silicon substrate) 1 having, for example, a plane direction (100) and a specific resistance of 10 to 20 Ωcm is prepared. On this semiconductor substrate 1, a stack structure comprising insulating layers (e.g., silicon oxide) 9a, 9b, and 9c and semiconductor layers (e.g., monocrystalline silicon) 2a, 2b, and 2c is formed.

That is, insulating layer 9a is formed on semiconductor substrate 1, and semiconductor layer 2a is formed on insulating layer 9a. Insulating layer 9b is formed on semiconductor layer 2a, and semiconductor layer 2b is formed on insulating layer 9b. Insulating layer 9c is formed on semiconductor layer 2b, and semiconductor layer 2c is formed on insulating layer 9c.

Figure 5:
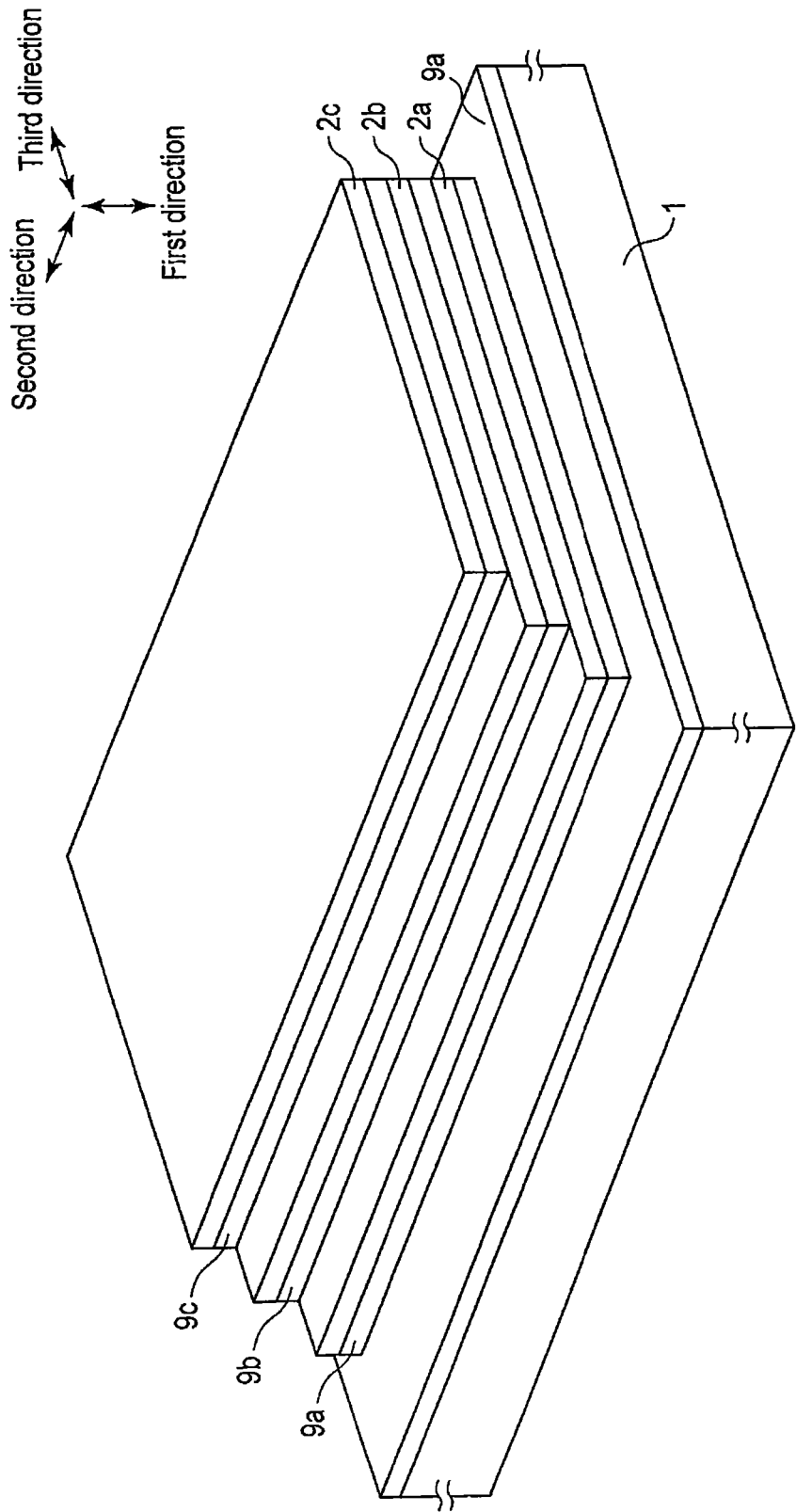

As shown in FIG. 5, a stepped shape that exposes the upper surfaces of semiconductor layers (the lowermost layer, the intermediate layer, and the uppermost layer) 2a, 2b, and 2c can be then formed at the end of the stack structure comprising insulating layers 9a, 9b, and 9c and semiconductor layers 2a, 2b, and 2c.

This stepped shape can be formed, for example, by using three photo engraving processes (PEP).

First, a resist pattern is formed on semiconductor layer 2c by the first photo engraving process. Using this resist pattern as a mask, semiconductor layer 2c and insulating layer 9c are etched by reactive ion etching (RIE). As a result, an uppermost step is formed. The resist pattern is removed afterwards.

A resist pattern is formed on semiconductor layers 2b and 2c by the second PEP. Using this resist pattern as a mask, semiconductor layer 2b and insulating layer 9b are etched by the RIE. As a result, an intermediate step is formed. The resist pattern is removed afterwards.

A resist pattern is further formed on semiconductor layers 2a, 2b, and 2c by the third PEP. Using this resist pattern as a mask, semiconductor layer 2a and insulating layer 9a are etched by the RIE. As a result, a lowermost step is formed. The resist pattern is removed afterwards.

According to the process described above, the stepped shape that exposes the upper surfaces of semiconductor layers (the lowermost layer, the intermediate layer, and the uppermost layer) 2a, 2b, and 2c can be formed at the end of the stack structure in the third direction.

As shown in FIG. 6, the stack structure comprising insulating layers 9a, 9b, and 9c and semiconductor layers 2a, 2b, and 2c is then patterned to form fin type stacked layer structures Fin0, Fin1, Fin2, and Fin3 and beam 5 which links the fin type stacked layer structures at the end in the second direction.

For example, a resist pattern is formed on semiconductor substrate 1 and semiconductor layers 2a, 2b, and 2c by the PEP, and using this resist pattern as a mask, semiconductor layers 2a, 2b, and 2c and insulating layers 9a, 9b, and 9c are etched by the RIE. As a result, fin type stacked layer structures Fin0, Fin1, Fin2, and Fin3 extending in the second direction, and beam 5 which extends in the third direction and which links fin type stacked layer structures Fin0, Fin1, Fin2, and Fin3 at the end in the second direction are formed.

As shown in FIG. 7, word line WL extending across fin type stacked layer structures Fin0, Fin1, Fin2, and Fin3 in the third direction is then formed, and assist gate electrode AG is formed at the end of each of fin type stacked layer structures Fin0, Fin1, Fin2, and Fin3 in the second direction.

In the case described here, memory cell MC and assist gate transistor AGT have the same structure.

First, a gate insulating layer (e.g., silicon oxide) covering the surfaces (side surfaces in the third direction) of semiconductor layers 2a, 2b, and 2c in fin type stacked layer structures Fin0, Fin1, Fin2, and Fin3 is formed, and a recording layer (e.g., a charge storage layer) covering the gate insulating layer is formed. Further, a block insulating layer covering the recording layer is formed, and a conductive layer (gate electrode layer) covering the block insulating layer is formed.

A resist pattern is then formed on the gate electrode layer, for example, by the PEP. Using this resist pattern as a mask, the gate electrode layer, the block insulating layer, the recording layer, and the gate insulating layer are etched by the RIE. As a result, word line WL which extends, in the first direction, on the side surfaces of fin type stacked layer structures Fin0, Fin1, Fin2, and Fin3 in the third direction and which extends in the third direction when seen from the upper surface thereof is formed, and assist gate electrode AG is formed at the end of each of fin type stacked layer structures Fin0, Fin1, Fin2, and Fin3 in the second direction.

As shown in FIG. 8, a resistance reduction process for reducing the resistance of semiconductor layers 2a, 2b, and 2c is then applied to beam 5.

The resistance reduction process is conducted, for example, by implanting impurity ions from the side surface of beam 5 in the second direction and forming impurity regions 8 in semiconductor layers 2a, 2b, and 2c within beam 5. As an impurity to be implanted into semiconductor layers 2a, 2b, and 2c, it is possible to use an impurity serving as an N-type semiconductor, for example, a pentad such as arsenic (As) or phosphorus (P), an impurity serving as a P-type semiconductor, for example, a triad such as boron (B) or indium (In), and a combination of these substances.

Otherwise, a technique used for a control gate electrode of a flash memory can be used as the resistance reduction process.

For example, the resistance of semiconductor layers 2a, 2b, and 2c can be reduced by forming a low resistance layer on the side surfaces of semiconductor layers 2a, 2b, and 2c within beam 5 in the second direction. The low resistance layer can be made of a metal compound such as tantalum nitride (TaN), tantalum carbide (TaC), or titanium nitride (TiN), or an electrically conductive metallic material such as Ni, V, Cr, Mn, Y, Mo, Ru, Rh, Hf, Ta, W, Ir, Co, Ti, Er, Pt, Pd, Zr, Gd, Dy, Ho, and Er and silicides of these substances.

Impurity region 8 within beam 5 may be combined with the low resistance layer formed on the side surface of beam 5 in the second direction.

Other structures and processes for reducing the resistance of beam 5 will be described later.

Figure 9:
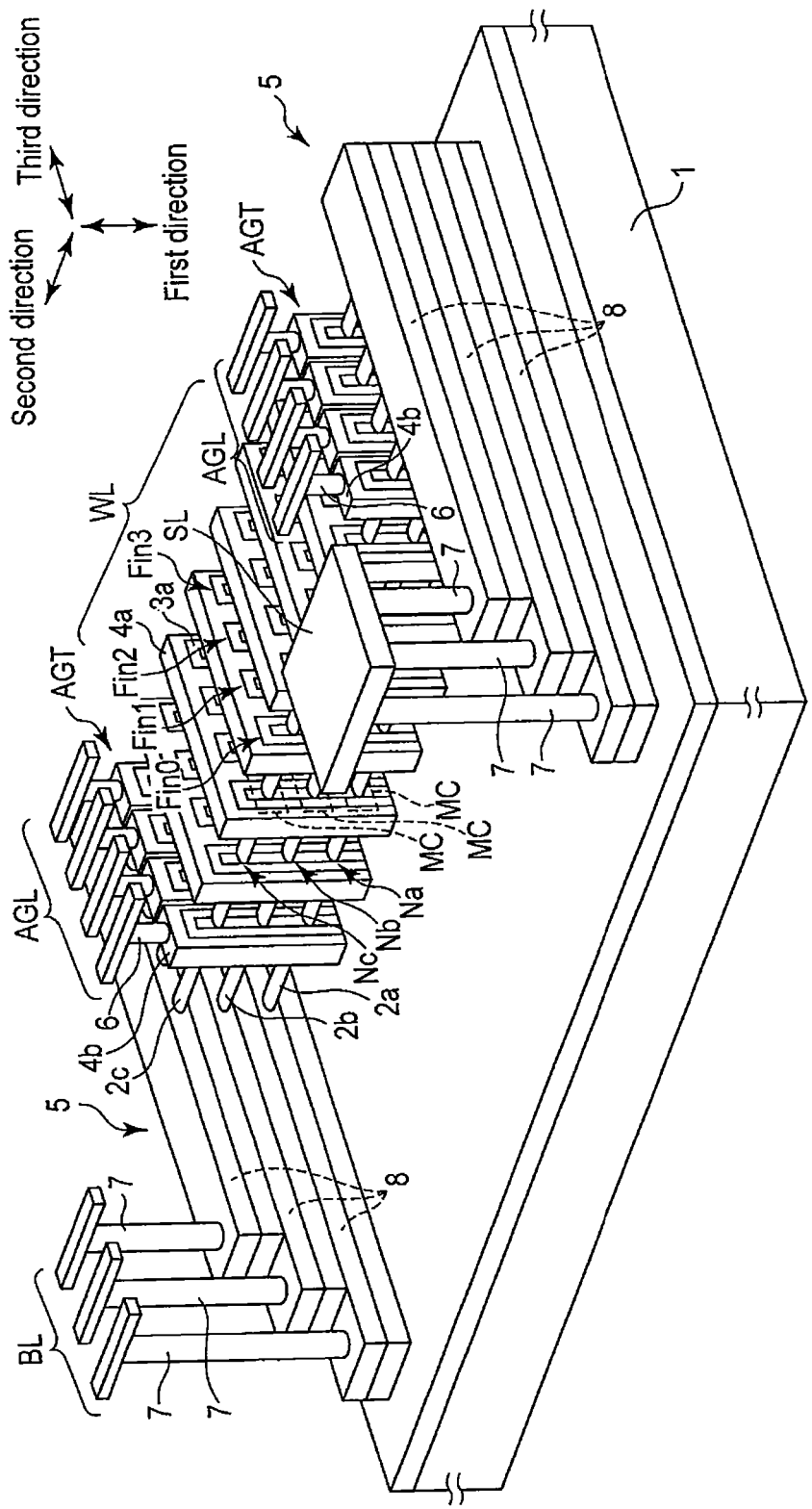

As shown in FIG. 9, assist gate line contact portion (plug) 6 connected to assist gate electrode AG, and bit line/source line contact portion (plug) 7 independently connected to each of semiconductor layers 2a, 2b, and 2c within beam 5 are then formed.

The device shown in FIG. 1 to FIG. 3 is completed by forming bit lines BL, source lines SL, and assist gate lines AGL.

In the manufacturing method described above, the increase in the number of manufacturing steps can be inhibited preferably by performing the resistance reduction process for semiconductor layers 2a, 2b, and 2c within beam 5 simultaneously with, for example, the resistance reduction process for the gate electrode (word line WL) of memory cell MC or the resistance reduction process for a gate electrode of a field effect transistor (FET) disposed in a peripheral circuit.

2. Second Embodiment

The second embodiment is a modification of the first embodiment.

The differences between the second embodiment and the first embodiment are described below.

(1) Structure

Figure 11:
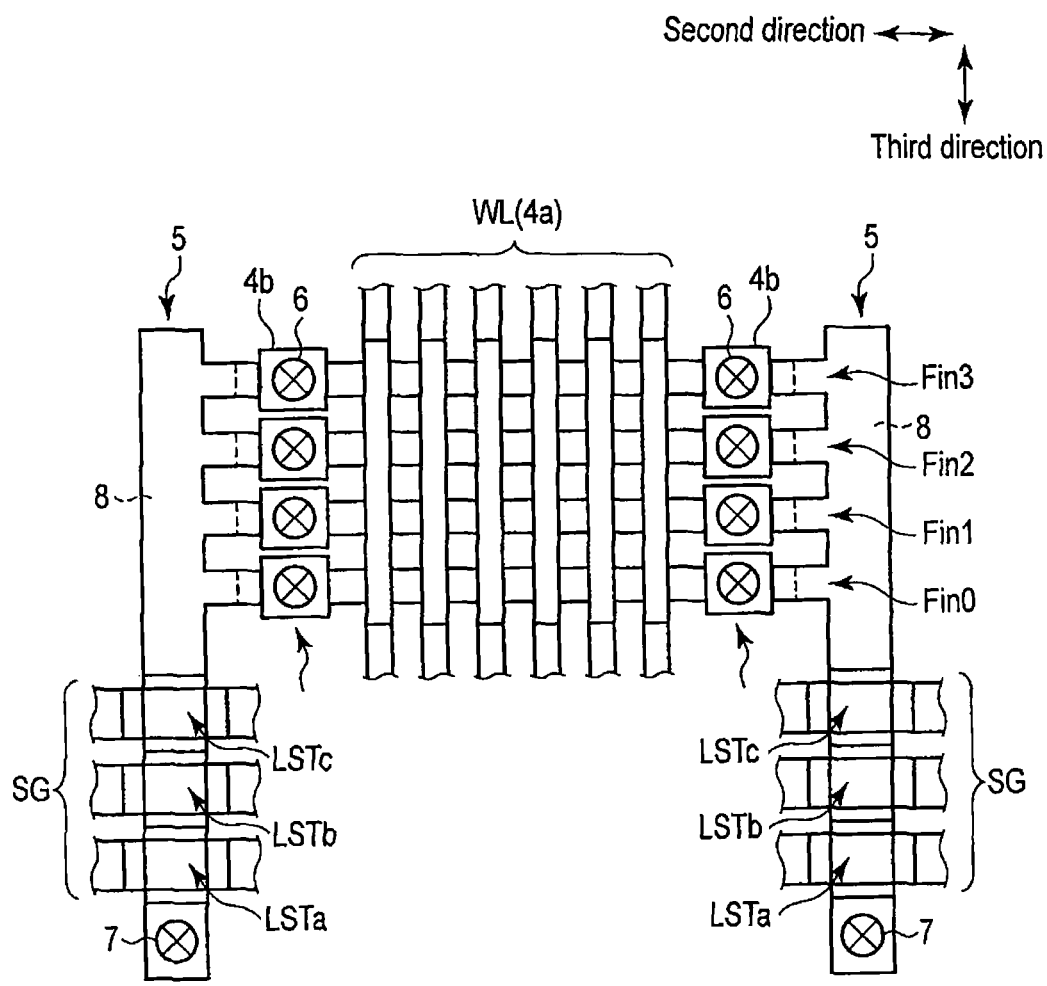
FIG. 11 is a plan view of FIG. 10.

FIG. 10 shows a perspective view of a nonvolatile semiconductor memory device. FIG. 11 shows a plan view of the device shown in FIG. 10.

The present embodiment is characterized by a function of selecting one of memory strings Na, Nb, and Nc which are provided in beam 5 and which are stacked in the first direction.

In the device shown in FIG. 1 to FIG. 3, the end of beam 5 in the third direction has a stepped shape, and the bit line contact portion is independently provided in each of the semiconductor layers within beam 5 (corresponding to the semiconductor layers in fin type stacked layer structures Fin0 to Fin3), in order to select one of memory strings Na, Nb, and Nc.

In contrast, according to the present embodiment, one common bit line contact portion (plug) 7 is provided for the semiconductor layers within beam 5, and the function of selecting one of memory strings Na, Nb, and Nc is obtained by layer select transistors LSTa, LSTb, and LSTc.

Layer select transistor LSTa is always on (normally on) in the lowermost semiconductor layer in beam 5, i.e., the semiconductor layer provided with one memory string Na in each of fin type stacked layer structures Fin0 to Fin3. Layer select transistor LSTa functions as a switch in the other semiconductor layers.

Moreover, layer select transistor LSTb is always on (normally on) in the intermediate semiconductor layer in beam 5, i.e., the semiconductor layer provided with one memory string Nb in each of fin type stacked layer structures Fin0 to Fin3. Layer select transistor LSTb functions as a switch in the other semiconductor layers.

Furthermore, layer select transistor LSTc is always on (normally on) in the uppermost semiconductor layer in beam 5, i.e., the semiconductor layer provided with one memory string Nc in each of fin type stacked layer structures Fin0 to Fin3. Layer select transistor LSTc functions as a switch in the other semiconductor layers.

The normally-on state of layer select transistors LSTa, LSTb, and LSTc is obtained, for example, by selectively forming impurity regions 11a, 11b, and 11c in the respective semiconductor layers of beams 5.

In this case, for example, when memory string Na is selected, a potential is applied to select gate electrode SG so that layer select transistor LSTa is off and layer select transistors LSTb and LSTc are on. At this time, in the uppermost layer and the intermediate layer, layer select transistor LSTa is off, and hence memory strings Nb and Nc are not selected. In contrast, in the lowermost layer, layer select transistor LSTa is normally on, and hence memory string Na is selected.

According to a similar principle, memory strings Nb and Nc can independently be selected.

The configuration is the same as that of the device shown in FIG. 1 to FIG. 3 except for the parts described above, and is therefore not described here.

In the present embodiment as well, the resistance reduction technique is applied to beam 5. For example, impurity region 8 is formed in each of the semiconductor layers constituting beam 5 (corresponding to the semiconductor layers in fin type stacked layer structures Fin0 to Fin3). This impurity region 8 can prevent an operational delay during writing/erasing/reading in the memory cells, and increase the speed of the memory operation.

Examples of materials are similar to those described in the first embodiment.

Additionally, each of layer select transistors LSTa, LSTb, and LSTc may be constituted of recording layer 3 and gate electrode 4b, similarly to memory cell MC. The transistor may be different in structure from memory cell MC instead.

When layer select transistors LSTa, LSTb, and LSTc are different in structure from memory cells MC, layer select transistors LSTa, LSTb, and LSTc can be constituted of, for example, transistors having a MOS structure.

According to this structure, one of the memory strings in one fin type stacked layer structure is selected, so that it is not necessary to provide contact portions corresponding to the number of stacked semiconductor layers 2a, 2b, and 2c. For example, while three contact portions (plugs) are provided in three semiconductor layers 2a, 2b, and 2c in the embodiment shown in FIG. 1 to FIG. 3, one common contact portion (plug) has only to be provided for three semiconductor layers 2a, 2b, and 2c in the present embodiment.

That is, according to the present embodiment, one contact portion has only to be provided for the semiconductor layers regardless of the number of stacked semiconductor layers, so that the area of the contact portion is not increased even if the memory capacity is increased by increasing the number of stacked memory strings. This can contribute to the increase of the memory capacity and the reduction of chip area.

(2) Manufacturing Method

Now, a method of manufacturing the nonvolatile semiconductor memory device according to the second embodiment is described.

Figure 12:
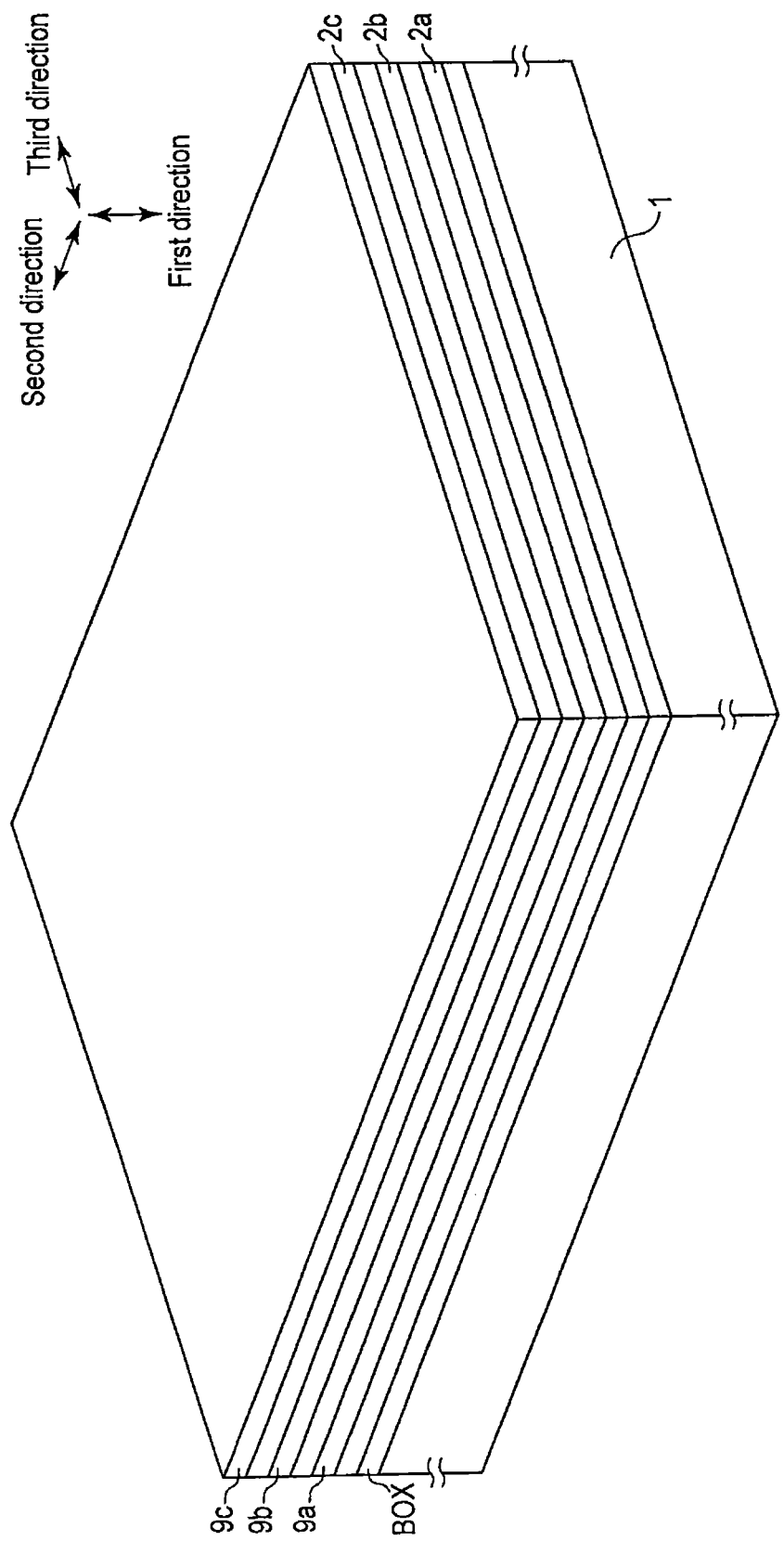

First, as shown in FIG. 12, first-conductivity-type (e.g., p-type) semiconductor substrate (e.g., silicon substrate) 1 having, for example, a plane direction (100) and a specific resistance of 10 to 20 Ωcm is prepared. An element isolation insulating layer (BOX: buried oxide) is formed on semiconductor substrate 1. On this element isolation insulating layer BOX, a stack structure comprising semiconductor layers (e.g., monocrystalline silicon) 2a, 2b, and 2c and insulating layers (e.g., silicon oxide) 9a, 9b, and 9c is formed.

That is, semiconductor layer 2a is formed on element isolation insulating layer BOX, and insulating layer 9a is formed on semiconductor layer 2a. Semiconductor layer 2b is formed on insulating layer 9a, and insulating layer 9b is formed on semiconductor layer 2b. Semiconductor layer 2c is formed on insulating layer 9b, and insulating layer 9c is formed on semiconductor layer 2c.

As shown in FIG. 13, a stepped shape that exposes the upper surfaces of insulating layers (the lowermost layer, the intermediate layer, and the uppermost layer) 9a, 9b, and 9c is then formed at the end of the stack structure comprising semiconductor layers 2a, 2b, and 2c and insulating layers 9a, 9b, and 9c in the third direction.

This stepped shape can be formed, for example, by using three PEPs.

First, a resist pattern is formed on insulating layer 9c by the first PEP. Using this resist pattern as a mask, insulating layer 9c and semiconductor layer 2c are etched by the RIE. As a result, an uppermost step is formed. The resist pattern is removed afterwards.

A resist pattern is formed on insulating layers 9b and 9c by the second PEP. Using this resist pattern as a mask, insulating layer 9b and semiconductor layer 2b are etched by the RIE. As a result, an intermediate step is formed. The resist pattern is removed afterwards.

A resist pattern is further formed on insulating layers 9a, 9b, and 9c by the third PEP. Using this resist pattern as a mask, insulating layer 9a and semiconductor layer 2a are etched by the RIE. As a result, a lowermost step is formed. The resist pattern is removed afterwards.

According to the process described above, the stepped shape that exposes the upper surfaces of insulating layers (the lowermost layer, the intermediate layer, and the uppermost layer) 9a, 9b, and 9c can be formed at the end of the stack structure in the third direction.

Figure 14:
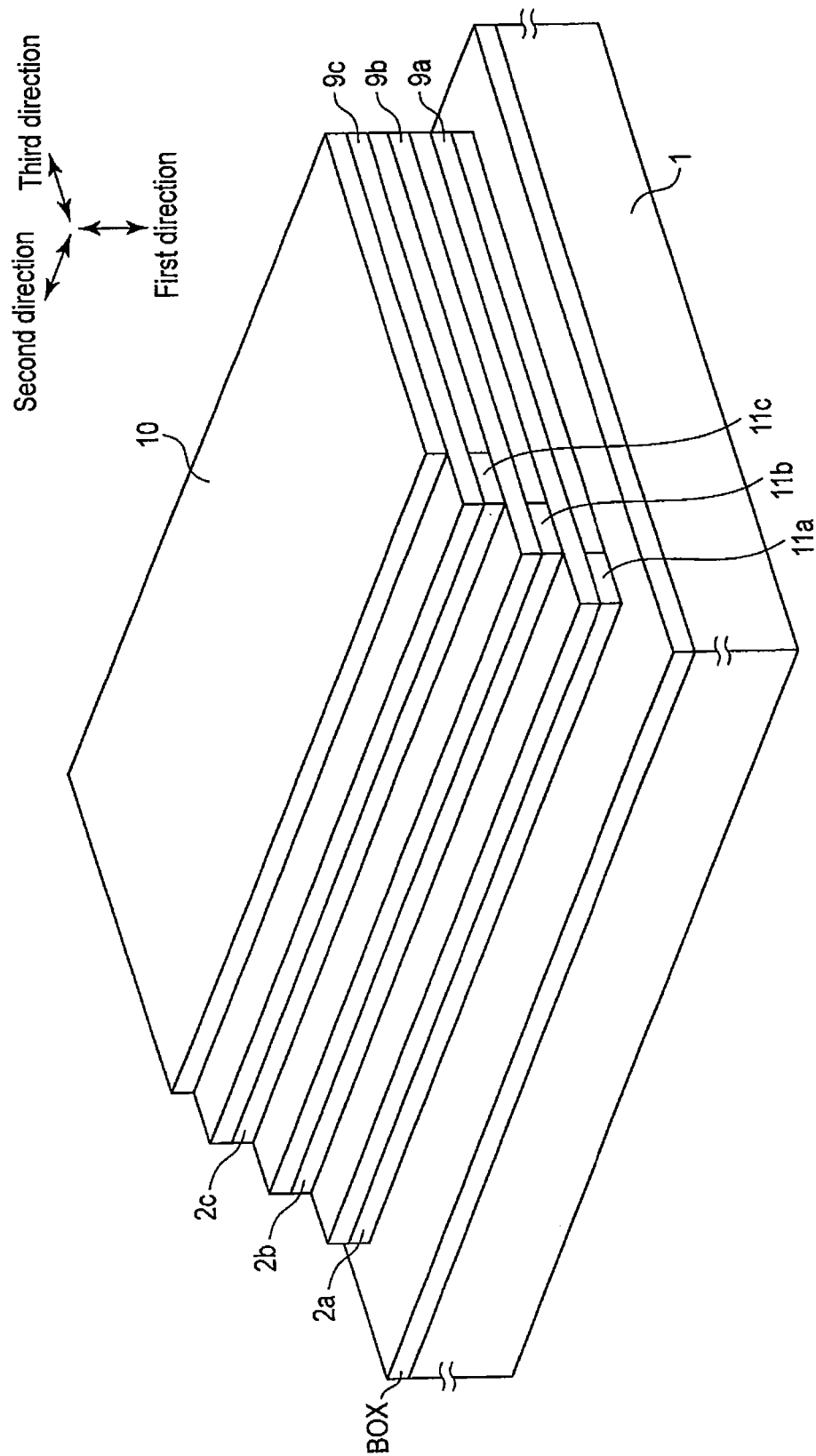

As shown in FIG. 14, resist pattern 10 is then formed on insulating layer 9c by the PEP, and using this resist pattern 10 as a mask, an impurity is implanted into semiconductor layers 2a, 2b, and 2c through ion implantation, thereby forming impurity regions 11a, 11b, and 11c. As an impurity to be implanted into semiconductor layers 2a, 2b, and 2c, it is possible to use an impurity serving as an N-type semiconductor, for example, a pentad such as arsenic (As) or phosphorus (P), an impurity serving as a P-type semiconductor, for example, a triad such as boron (B) or indium (In), and a combination of these substances.

Impurity regions 11a, 11b, and 11c are formed so that layer select transistors LSTa, LSTb, and LSTc shown in FIG. 10 and FIG. 11 are normally on.

Resist pattern 10 is removed afterwards.

Here, according to the present embodiment, impurity regions 11a, 11b, and 11c are simultaneously formed by one ion implantation to reduce the number of manufacturing steps (the number of PEPs).

Otherwise, for example, the step of forming the stack structure shown in FIG. 12 can be as follows. Semiconductor layer 2a is formed, and then impurity region 11a is formed before the formation of insulating layer 9a. Semiconductor layer 2b is formed, and then impurity region 11b is formed before the formation of insulating layer 9b. Semiconductor layer 2c is formed, and then impurity region 11c is formed before the formation of insulating layer 9c.

In this case, the following step shown in FIG. 15 can be omitted.

As shown in FIG. 15, semiconductor layer (e.g., monocrystalline silicon) 12 is then formed on insulating layers 9a, 9b, and 9c to cover the stepped shape of the stack structure. After the formation of semiconductor layer 12, the upper surface of semiconductor layer 12 may be planarized by chemical mechanical polishing (CMP) so that the upper surface of semiconductor layer 12 is substantially flush with the upper surface of insulating layer 9c (the uppermost layer of the stack structure).

As shown in FIG. 16, the stack structure comprising semiconductor layers 2a, 2b, and 2c and insulating layers 9a, 9b, and 9c is then patterned to form fin type stacked layer structures Fin0, Fin1, Fin2, and Fin3 and beam 5 which links the fin type stacked layer structures at the end in the second direction.

For example, a resist pattern is formed on element isolation insulating layer BOX and insulating layers 9a, 9b, and 9c by the PEP, and using this resist pattern as a mask, insulating layers 9a, 9b, and 9c and semiconductor layers 2a, 2b, and 2c are etched by the RIE. As a result, fin type stacked layer structures Fin0, Fin1, Fin2, and Fin3 extending in the second direction, and beam 5 which extends in the third direction and which links fin type stacked layer structures Fin0, Fin1, Fin2, and Fin3 at the end in the second direction are formed.

Here, the end of beam 5 in the third direction comprises a stepped shape having the stack structure comprising semiconductor layers 2a, 2b, and 2c and insulating layers 9a, 9b, and 9c, and semiconductor layer 12 in which the stack structure is buried.

Figure 17:
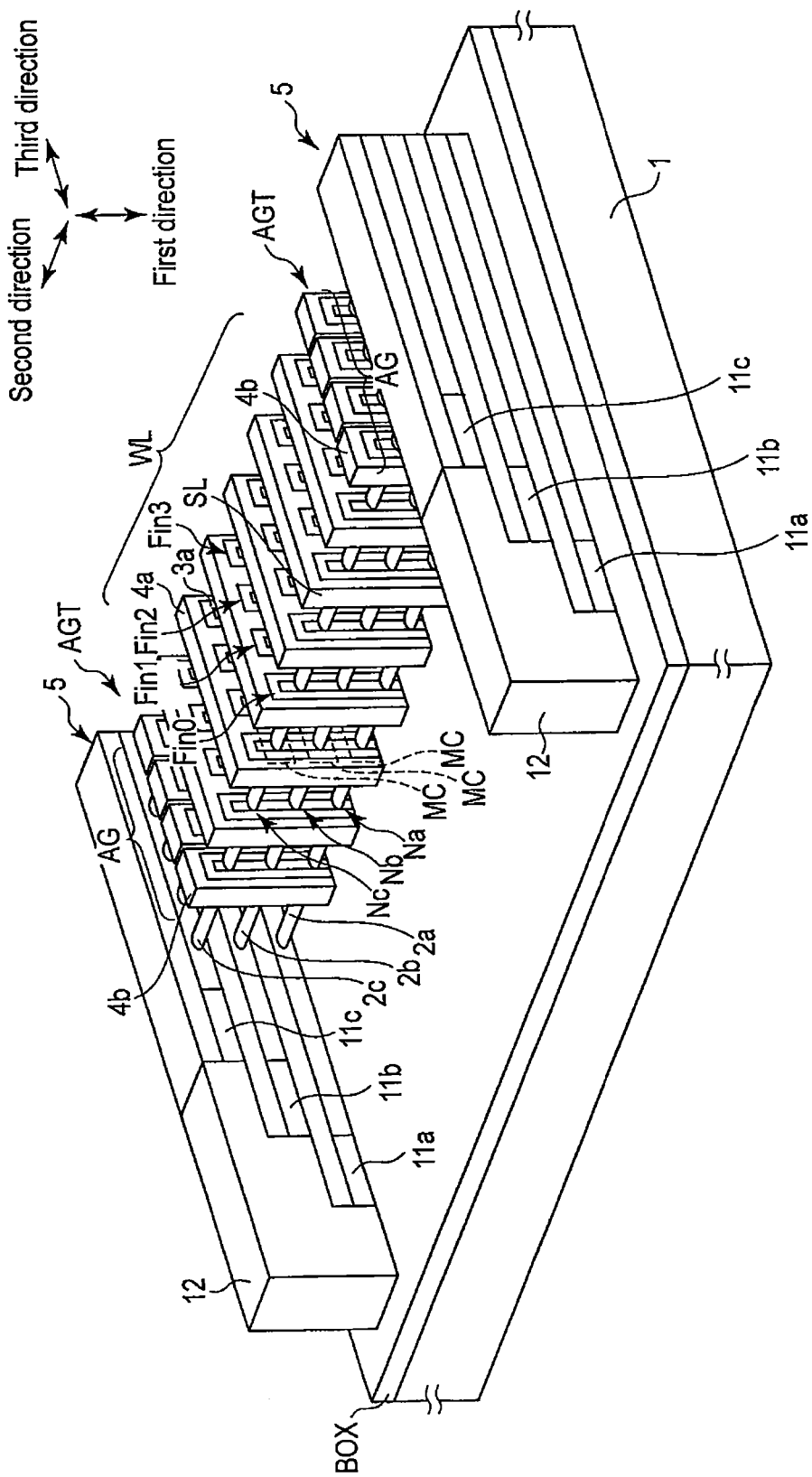

As shown in FIG. 17, word line WL extending across fin type stacked layer structures Fin0, Fin1, Fin2, and Fin3 in the third direction is then formed, and assist gate electrode AG is formed at the end of each of fin type stacked layer structures Fin0, Fin1, Fin2, and Fin3 in the second direction.

In the case described here, memory cell MC and assist gate transistor AGT have the same structure.

First, a gate insulating layer (e.g., silicon oxide) covering the surfaces (side surfaces in the third direction) of semiconductor layers 2a, 2b, and 2c in fin type stacked layer structures Fin0, Fin1, Fin2, and Fin3 is formed, and a recording layer (e.g., a charge storage layer) covering the gate insulating layer is formed. Further, a block insulating layer covering the recording layer is formed, and a conductive layer (gate electrode layer) covering the block insulating layer is formed.

A resist pattern is then formed on the gate electrode layer, for example, by the PEP. Using this resist pattern as a mask, the gate electrode layer, the block insulating layer, the recording layer, and the gate insulating layer are etched by the RIE.

As a result, word line WL which extends, in the first direction, on the side surfaces of fin type stacked layer structures Fin0, Fin1, Fin2, and Fin3 in the third direction and which extends in the third direction when seen from the upper surface thereof is formed, and assist gate electrode AG is formed at the end of each of fin type stacked layer structures Fin0, Fin1, Fin2, and Fin3 in the second direction.

As shown in FIG. 18, select gate electrode SG extending across beam 5 in the second direction is then formed. Although select gate electrode SG can be formed simultaneously with word line WL and assist gate electrode AG, select gate electrode SG is formed separately from word line WL and assist gate electrode AG in the example described here. In this case, layer select transistors LSTa, LSTb, and LSTc are different in structure from memory cell MC and assist gate transistor AGT.

First, a gate insulating layer (e.g., silicon oxide) covering the surfaces (side surfaces in the second direction) of semiconductor layers 2a, 2b, and 2c in beam 5 is formed, and a conductive layer (gate electrode layer) covering the gate insulating layer is formed. Further, a resist pattern is formed on the gate electrode layer, for example, by the PEP. Using this resist pattern as a mask, the gate electrode layer and the gate insulating layer are etched by the RIE.

As a result, select gate electrode SG which extends, in the first direction, on the side surface of beam 5 in the second direction and which extends in the second direction when seen from the upper surface thereof is formed.

Select gate electrode SG is a gate electrode of each of layer select transistors LSTa, LSTb, and LSTc.

Therefore, gate electrode SG of layer select transistor LSTa overlaps impurity region 11a, gate electrode SG of layer select transistor LSTb overlaps impurity region 11b, and gate electrode SG of layer select transistor LSTc overlaps impurity region 11c.

Layer select transistors LSTa, LSTb, and LSTc have only to function as switches, and are not particularly limited in their structure.

As shown in FIG. 19, the resistance reduction process for reducing the resistance of semiconductor layers 2a, 2b, and 2c is then applied to beam 5.

The resistance reduction process is conducted, for example, by implanting impurity ions from the side surface of beam 5 in the second direction and forming impurity regions 8 in semiconductor layers 2a, 2b, and 2c within beam 5. As an impurity to be implanted into semiconductor layers 2a, 2b, and 2c, it is possible to use an impurity serving as an N-type semiconductor, for example, a pentad such as arsenic (As) or phosphorus (P), an impurity serving as a P-type semiconductor, for example, a triad such as boron (B) or indium (In), and a combination of these substances.

Otherwise, a technique used for a control gate electrode of a flash memory can be used as the resistance reduction process.

For example, the resistance of semiconductor layers 2a, 2b, and 2c can be reduced by forming a low resistance layer on the side surfaces of semiconductor layers 2a, 2b, and 2c within beam 5 in the second direction. The low resistance layer can be made of a metal compound such as tantalum nitride (TaN), tantalum carbide (TaC), or titanium nitride (TiN), or an electrically conductive metallic material such as Ni, V, Cr, Mn, Y, Mo, Ru, Rh, Hf, Ta, W, Ir, Co, Ti, Er, Pt, Pd, Zr, Gd, Dy, Ho, and Er and silicides of these substances.

Impurity region 8 within beam 5 may be combined with the low resistance layer formed on the side surface of beam 5 in the second direction.

Other structures and processes for reducing the resistance of beam 5 will be described later.

Here, according to the present embodiment, impurity regions 8 are formed in semiconductor layers 2a, 2b, and 2c within beam 5 in a self-aligning manner by using gate electrode SG of layer select transistors LSTa, LSTb, and LSTc as a mask.

Therefore, after the resistance reduction process as well, in semiconductor layer 2a, layer select transistors LSTb and LSTc function as switches, and layer select transistor LSTa is normally on.

Similarly, after the resistance reduction process as well, in semiconductor layer 2b, layer select transistors LSTa and LSTc function as switches, and layer select transistor LSTb is normally on.

Moreover, after the resistance reduction process as well, in semiconductor layer 2c, layer select transistors LSTa and LSTb function as switches, and layer select transistor LSTc is normally on.

Finally, assist gate line contact portion (plug) 6 connected to assist gate electrode AG, and common bit line/source line contact portion (plug) 7 connected to semiconductor layers 2a, 2b, and 2c within beam 5 are formed.

The device shown in FIG. 10 and FIG. 11 is completed by forming bit lines BL, source lines SL, and assist gate lines AGL.

In the manufacturing method described above, the increase in the number of manufacturing steps can be inhibited preferably by performing the resistance reduction process for semiconductor layers 2a, 2b, and 2c within beam 5 simultaneously with, for example, the resistance reduction process for the gate electrode (word line WL) of memory cell MC or the resistance reduction process for a gate electrode of an FET disposed in a peripheral circuit.

Before and after the step of forming impurity regions 11a, 11b, and 11c shown in FIG. 14, ion implantation for controlling the thresholds of layer select transistors LSTa, LSTb, and LSTc may be performed.

(3) Third Embodiment

The third embodiment is also a modification of the first embodiment.

The differences between the third embodiment and the first embodiment are described below.

(1) Structure

FIG. 20 shows a perspective view of a nonvolatile semiconductor memory device. FIG. 21 shows a plan view of the device shown in FIG. 20.

The present embodiment is characterized by a structure for reducing the resistance of semiconductor layers 2a, 2b, and 2c within beam 5.

In the device shown in FIG. 1 to FIG. 3, in order to reduce the resistance of semiconductor layers 2a, 2b, and 2c within beam 5, the resistance reduction technique is applied; for example, ions are implanted from the outer side (side surface) of beam 5, or a low resistance layer is added to the side surface of beam 5.

In contrast, according to the present embodiment, slit 13 passing through semiconductor layers 2a, 2b, and 2c is provided in beam 5, and the resistance reduction technique is applied to semiconductor layers 2a, 2b, and 2c both from the outer side of beam 5 and from the inner side of beam 5 (the inner side of slit 13).

Slit 13 may be shaped to be closed at its end in the third direction as shown in FIG. 22. This increases the effect of preventing the collapse of beam 5 as compared with the slit which is open at one end in the third direction shown in FIG. 21.

Moreover, when layer select transistors LSTa, LSTb, and LSTc are provided in beam 5 as shown in FIG. 23, slit 13 may extend to channel portions of these transistors. Accordingly, each of layer select transistors LSTa, LSTb, and LSTc in semiconductor layers 2a, 2b, and 2c comprises two double gate transistors, so that gate control power is increased, and an on-resistance can be reduced. This also ensures the reduction of resistance from layer select transistors LSTa, LSTb, and LSTc to a contact portion between the beam and fin type stacked layer structure.

In the third embodiment, the resistance of semiconductor layers 2a, 2b, and 2c is reduced in more regions. As a result, the resistance value of each of semiconductor layers 2a, 2b, and 2c within beam 5 is more easily reduced.

Although the end of beam 5 in the third direction has a stepped shape as a function of selecting one of semiconductor layers 2a, 2b, and 2c in the present embodiment, the second embodiment can be applied as this function instead.

That is, in the third embodiment, as shown in FIG. 10 and FIG. 11, one common bit line contact portion (plug) 7 may be provided for semiconductor layers 2a, 2b, and 2c within beam 5, and the function of selecting one of memory strings Na, Nb, and Nc may be obtained by layer select transistors LSTa, LSTb, and LSTc.

The configuration is the same as that of the device shown in FIG. 1 to FIG. 3 except for the parts described above, and is therefore not described here. Examples of materials are also similar to those described in the first embodiment, and are therefore not described here.

(2) Manufacturing Method

Now, a method of manufacturing the nonvolatile semiconductor memory device according to the third embodiment is described.

First, as shown in FIG. 4 and FIG. 5, a stack structure comprising insulating layers 9a, 9b, and 9c and semiconductor layers 2a, 2b, and 2c is formed, for example, on semiconductor substrate 1, and a stepped shape that exposes the upper surfaces of semiconductor layers (the lowermost layer, the intermediate layer, and the uppermost layer) 2a, 2b, and 2c is formed at the end of the stack structure in the third direction. The process so far is the same as that in the manufacturing method described in the first embodiment and is therefore not described in detail here.

As shown in FIG. 24, the stack structure comprising insulating layers 9a, 9b, and 9c and semiconductor layers 2a, 2b, and 2c is then patterned to form fin type stacked layer structures Fin0, Fin1, Fin2, and Fin3, beam 5 which links the fin type stacked layer structures at the end in the second direction, and slit 13 passing through semiconductor layers 2a, 2b, and 2c within beam 5.

As has already been described, slit 13 may be shaped to be closed at its end in the third direction. When the layer select transistors are provided in the beam, slit 13 may extend to channel portions of these transistors.

For example, a resist pattern is formed on semiconductor substrate 1 and semiconductor layers 2a, 2b, and 2c by the PEP, and using this resist pattern as a mask, semiconductor layers 2a, 2b, and 2c and insulating layers 9a, 9b, and 9c are etched by the RIE. As a result, fin type stacked layer structures Fin0, Fin1, Fin2, and Fin3, beam 5, and slit 13 are formed.

As shown in FIG. 25, word line WL extending across fin type stacked layer structures Fin0, Fin1, Fin2, and Fin3 in the third direction is then formed, and assist gate electrode AG is formed at the end of each of fin type stacked layer structures Fin0, Fin1, Fin2, and Fin3 in the second direction.

In the case described here, memory cell MC and assist gate transistor AGT have the same structure.

First, a gate insulating layer (e.g., silicon oxide) covering the surfaces (side surfaces in the third direction) of semiconductor layers 2a, 2b, and 2c in fin type stacked layer structures Fin0, Fin1, Fin2, and Fin3 is formed, and a recording layer (e.g., a charge storage layer) covering the gate insulating layer is formed. Further, a block insulating layer covering the recording layer is formed, and a conductive layer (gate electrode layer) covering the block insulating layer is formed.

A resist pattern is then formed on the gate electrode layer, for example, by the PEP. Using this resist pattern as a mask, the gate electrode layer, the block insulating layer, the recording layer, and the gate insulating layer are etched by the RIE. As a result, word line WL which extends, in the first direction, on the side surfaces of fin type stacked layer structures Fin0, Fin1, Fin2, and Fin3 in the third direction and which extends in the third direction when seen from the upper surface thereof is formed, and assist gate electrode AG is formed at the end of each of fin type stacked layer structures Fin0, Fin1, Fin2, and Fin3 in the second direction.

As shown in FIG. 26, a resistance reduction process for reducing the resistance of semiconductor layers 2a, 2b, and 2c is then applied to beam 5.

The resistance reduction process is conducted, for example, by implanting impurity ions from the outer side (side surface) of beam 5 and from the inner side of beam 5 (the inner side of slit 13) and forming impurity regions 8 in semiconductor layers 2a, 2b, and 2c within beam 5.

As an impurity to be implanted into semiconductor layers 2a, 2b, and 2c, it is possible to use an impurity serving as an N-type semiconductor, for example, a pentad such as arsenic (As) or phosphorus (P), an impurity serving as a P-type semiconductor, for example, a triad such as boron (B) or indium (In), and a combination of these substances.

Otherwise, a technique used for a control gate electrode of a flash memory can be used as the resistance reduction process.

For example, the resistance of semiconductor layers 2a, 2b, and 2c can be reduced by forming a low resistance layer on the side surfaces (including the inner surfaces exposed in slit 13) of semiconductor layers 2a, 2b, and 2c within beam 5.

The low resistance layer can be made of a metal compound such as tantalum nitride (TaN), tantalum carbide (TaC), or titanium nitride (TiN), or an electrically conductive metallic material such as Ni, V, Cr, Mn, Y, Mo, Ru, Rh, Hf, Ta, W, Ir, Co, Ti, Er, Pt, Pd, Zr, Gd, Dy, Ho, and Er and silicides of these substances.

Impurity region 8 within beam 5 may be combined with the low resistance layer formed on the side surfaces of semiconductor layers 2a, 2b, and 2c within beam 5.

Other structures and processes for reducing the resistance of beam 5 will be described later.

As shown in FIG. 27, assist gate line contact portion (plug) 6 connected to assist gate electrode AG, and bit line/source line contact portion (plug) 7 independently connected to each of semiconductor layers 2a, 2b, and 2c within beam 5 are then formed.

The device shown in FIG. 20 and FIG. 21 is completed by forming bit lines BL, source lines SL, and assist gate lines AGL.

According to the present embodiment, slit 13 is formed simultaneously with fin type stacked layer structures Fin0, Fin1, Fin2, and Fin3 and beam 5 which links the fin type stacked layer structures at the end in the second direction. This is intended to reduce the number of manufacturing steps (the number of PEPs).

Otherwise, slit 13 may be formed separately from the patterning of fin type stacked layer structures Fin0, Fin1, Fin2, and Fin3 and beam 5.

For example, as shown in FIG. 28, fin type stacked layer structures Fin0, Fin1, Fin2, and Fin3 and beam 5 are patterned first. Slit 13 passing through semiconductor layers 2a, 2b, and 2c may be then formed in beam 5, as shown in FIG. 29. In this case, slit 13 may be formed before or after the formation of word line WL and assist gate electrode AG.

In the manufacturing method described above, the increase in the number of manufacturing steps can be inhibited preferably by performing the resistance reduction process for semiconductor layers 2a, 2b, and 2c within beam 5 simultaneously with, for example, the resistance reduction process for the gate electrode (word line WL) of memory cell MC or the resistance reduction process for a gate electrode of an FET disposed in a peripheral circuit.

(4) Fourth Embodiment

The fourth embodiment is a modification of the third embodiment.

The differences between the fourth embodiment and the third embodiment are described below.

(1) Structure

FIG. 30 shows a perspective view of a nonvolatile semiconductor memory device. FIG. 31 shows a plan view of the device shown in FIG. 30.

The present embodiment is different from the third embodiment in that source line SL shared by all memory strings is provided between first and second beams 5a and 5b, in that fin type stacked layer structures (memory strings Na, Nb, and Nc) Fin0 to Fin3 are formed between first beam 5a and common source line SL, and in that fin type stacked layer structures (memory strings Na, Nb, and Nc) Fin0 to Fin3 are also formed between second beam 5b and common source line SL.

On semiconductor substrate (e.g., Si substrate) 1, there are arranged memory strings Na, Nb, and Nc stacked in a first direction perpendicular to the surface of the substrate and extending in a second direction parallel to the surface of semiconductor substrate 1. In the present embodiment, the number of the memory strings stacked in the first direction is three, but the present embodiment is not limited to this embodiment. That is, the number of the memory strings stacked in the first direction may be two or more.

These memory strings Na, Nb, and Nc are constituted of three semiconductor layers (e.g., monocrystalline Si layers) 2a, 2b, and 2c stacked in the first direction, and memory cells MC connected in series in the second direction. In the present embodiment, the number of memory cells MC connected in series is two, but the present embodiment is not limited to this embodiment. That is, the number of the memory cells connected in series in the second direction may be two or more.

Gate electrode 4a extends in the first direction on the side of the side surface of each of semiconductor layers 2a, 2b, and 2c that is located in the third direction. Moreover, when gate electrode 4a is seen from the upper surface thereof, gate electrode 4a extends across memory strings Na, Nb, and Nc in the third direction.

Memory strings Na, Nb, and Nc are connected between first beam 5a extending in the third direction and common source line SL, and also connected between second beam 5b extending in the third direction and common source line SL. When semiconductor layers 2a, 2b, and 2c are separated by insulating layers and one semiconductor layer and one insulating layer are alternately stacked to form fin type stacked layer structures Fin0 to Fin3. In this case, for example, each of first and second beams 5a and 5b has the same structure as fin type stacked layer structures Fin0 to Fin3.

First and second beams 5a and 5b have a function of fixing memory strings Na, Nb, and Nc, and preventing, for example, the collapse of fin type stacked layer structures Fin0 to Fin3. The width of each of first and second beams 5a and 5b in the second direction is preferably greater than the width of each of fin type stacked layer structures Fin0 to Fin3 in the third direction, i.e., the width of each of semiconductor layers 2a, 2b, and 2c in the third direction.

Between each of memory strings Na, Nb, and Nc and first beam 5a and between each of memory strings Na, Nb, and Nc on the side of first beam 5a and common source line SL, for example, assist gate transistors AGT are respectively disposed to select one fin type stacked layer structure (one group comprising memory strings Na, Nb, and Nc).

Similarly, between each of memory strings Na, Nb, and Nc and second beam 5b and between each of memory strings Na, Nb, and Nc on the side of second beam 5b and common source line SL, for example, assist gate transistors AGT are respectively disposed to select one fin type stacked layer structure (one group comprising memory strings Na, Nb, and Nc).

Assist gate transistors AGT have only to function as switches. Therefore, assist gate transistors AGT may have the same structure as memory cells MC, or may have a different structure.

In the present embodiment, assist gate transistor AGT has recording layer 3 and gate electrode (assist gate electrode) 4b, similarly to each memory cell MC. When assist gate transistors AGT are different in structure from memory cells MC, assist gate transistors AGT can be constituted of, for example, transistors having a MOS structure.

Gate electrodes 4b are electrically isolated from one another. Moreover, gate electrodes 4b are connected to assist gate lines AGL via contact plugs 6.

In the present embodiment, fin type stacked layer structures are arrayed in the second and third directions. In the present embodiment, the number of fin type stacked layer structures arranged in the second direction is two, and the number of fin type stacked layer structures arranged in the third direction is four, but the present embodiment is not limited to this embodiment. That is, the number of fin type stacked layer structures arranged in the second and third directions may be two or more.

Although assist gate transistors AGT are arranged at both ends of each of memory strings Na, Nb, and Nc in the present embodiment, one fin type stacked layer structure can be selected if assist gate transistor AGT is only disposed at one end of the memory string. However, if high reliability resulting from the inhibition of program disturb is taken into account, it is preferable to provide assist gate transistors AGT at both ends of each of memory strings Na, Nb, and Nc.

When assist gate transistors AGT are provided at both ends of each of memory strings Na, Nb, and Nc, assist gate transistor AGT at one end of each of memory strings Na, Nb, and Nc may share assist gate electrode 4b with the fin type stacked layer structure disposed in the third direction, and function as a select gate transistor. In this case, the gate width of the select gate transistor can be smaller than the gate width of the assist gate transistor, so that the memory strings can be shorter, which can contribute to higher integration.

Although the end of beam 5 in the third direction has a stepped shape as a function of selecting one of semiconductor layers 2a, 2b, and 2c in the present embodiment, the second embodiment can be applied as this function instead.

That is, in the fourth embodiment, as shown in FIG. 10 and FIG. 11, one common bit line contact portion (plug) 7 may be provided for semiconductor layers 2a, 2b, and 2c within beam 5, and the function of selecting one of memory strings Na, Nb, and Nc may be obtained by layer select transistors LSTa, LSTb, and LSTc.

The configuration is the same as that of the device shown in FIG. 1 to FIG. 3 except for the parts described above, and is therefore not described here. Examples of materials are also similar to those described in the first embodiment, and are therefore not described here.

(2) Manufacturing Method

Now, a method of manufacturing the nonvolatile semiconductor memory device according to the fourth embodiment is described.

First, as shown in FIG. 4 and FIG. 5, a stack structure comprising insulating layers 9a, 9b, and 9c and semiconductor layers 2a, 2b, and 2c is formed, for example, on semiconductor substrate 1, and a stepped shape that exposes the upper surfaces of semiconductor layers (the lowermost layer, the intermediate layer, and the uppermost layer) 2a, 2b, and 2c is formed at the end of the stack structure in the third direction. The process so far is the same as that in the manufacturing method described in the first embodiment and is therefore not described in detail here.

Figure 32:
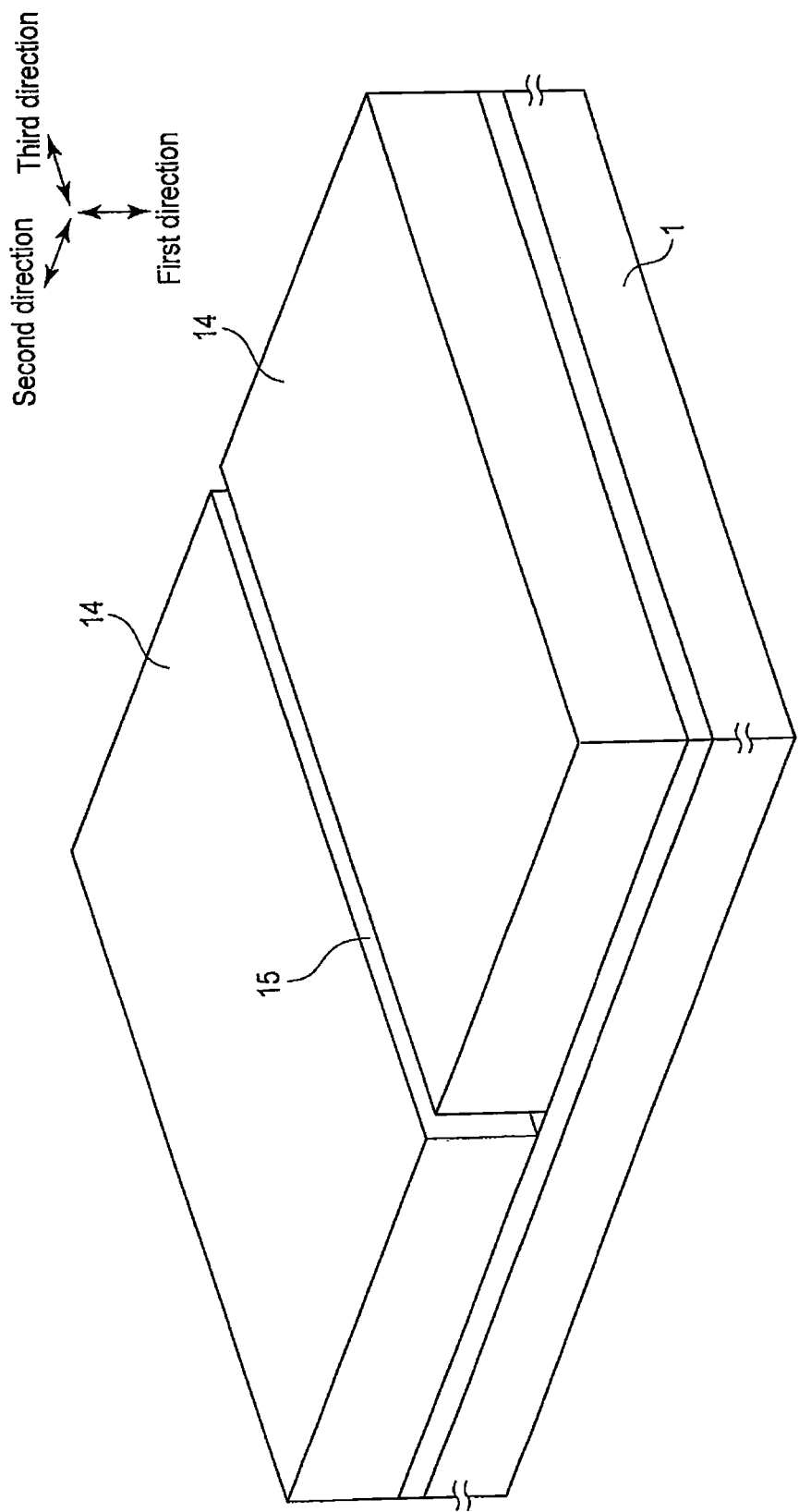

As shown in FIG. 32, insulating layer (e.g., silicon oxide) 14 completely covering the stack structure comprising insulating layers 9a, 9b, and 9c and semiconductor layers 2a, 2b, and 2c is then formed. The upper surface of insulating layer 14 is then planarized, for example, by the CMP.

A resist pattern is formed on insulating layer 14 by the PEP. Using this resist pattern as a mask, insulating layer 14, and the stack structure comprising insulating layers 9a, 9b, and 9c and semiconductor layers 2a, 2b, and 2c are then etched by the RIE, thereby forming wiring line groove 15 extending in the third direction. This wiring line groove 15 passes through semiconductor layers 2a, 2b, and 2c in the first and third directions.

The resist pattern is removed afterwards.

Figure 33:
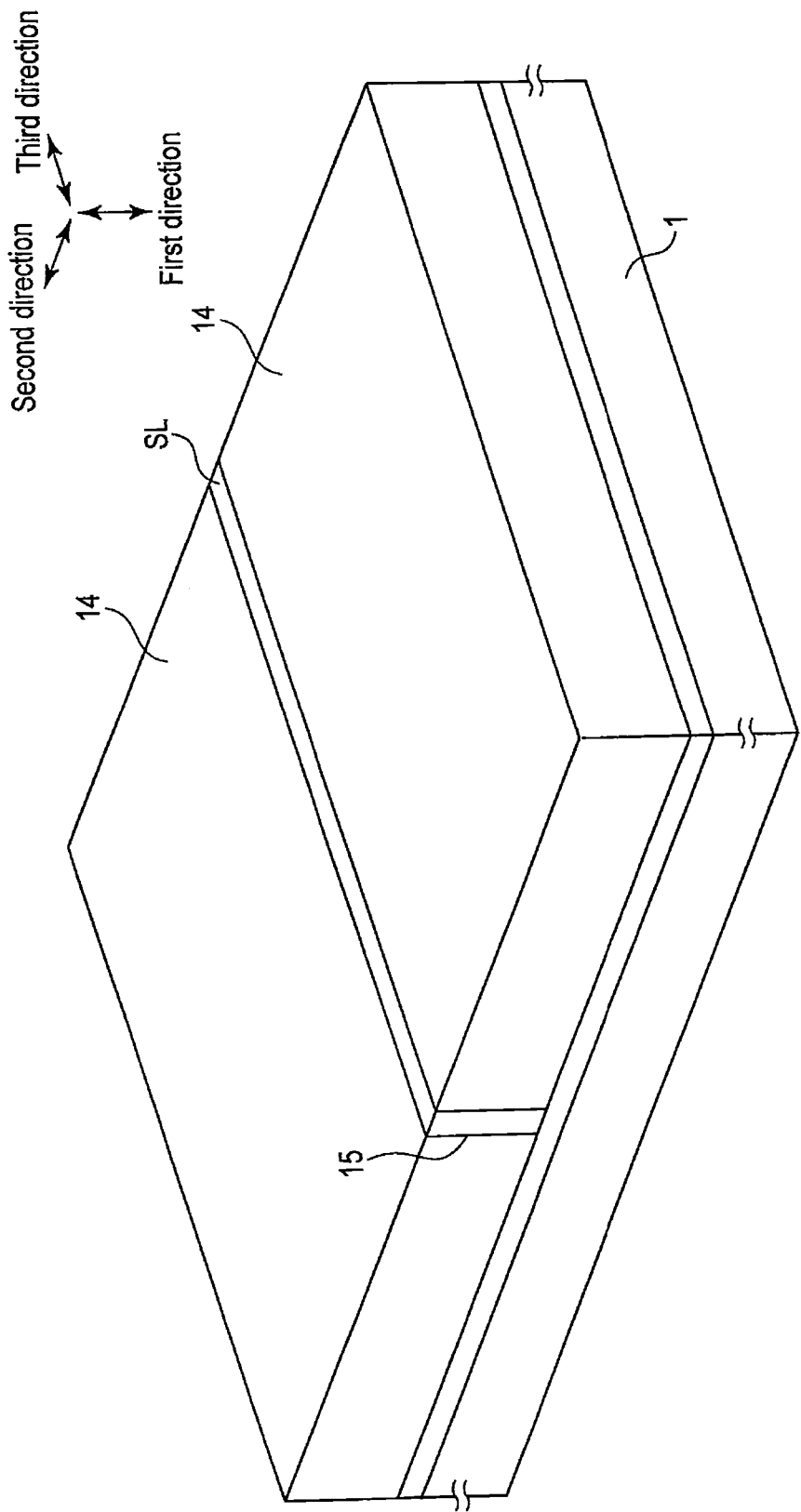

As shown in FIG. 33, wiring line groove 15 is filled with a conductive material (e.g., impurity-containing conductive silicon, or a metal), thereby forming common source line SL.

As shown in FIG. 34, the stack structure comprising insulating layers 9a, 9b, and 9c and semiconductor layers 2a, 2b, and 2c is then patterned to form fin type stacked layer structures Fin0, Fin1, Fin2, and Fin3, first and second beams 5a and 5b which link the fin type stacked layer structures at the end in the second direction, and slit 13 passing through semiconductor layers 2a, 2b, and 2c within first and second beams 5a and 5b in the first direction.

As has already been described, slit 13 may be shaped to be closed at its end in the third direction. When the layer select transistors are provided in the beams, slit 13 may extend to channel portions of these transistors.

For example, a resist pattern is formed on semiconductor substrate 1 and semiconductor layers 2a, 2b, and 2c by the PEP, and using this resist pattern as a mask, semiconductor layers 2a, 2b, and 2c and insulating layers 9a, 9b, and 9c are etched by the RIE. As a result, fin type stacked layer structures Fin0, Fin1, Fin2, and Fin3, first and second beams 5a and 5b, and slit 13 are formed.

As shown in FIG. 35, word line WL extending across fin type stacked layer structures Fin0, Fin1, Fin2, and Fin3 in the third direction is then formed, and assist gate electrode AG is formed at the end of each of fin type stacked layer structures Fin0, Fin1, Fin2, and Fin3 in the second direction.

In the case described here, memory cell MC and assist gate transistor AGT have the same structure.

First, a gate insulating layer (e.g., silicon oxide) covering the surfaces (side surfaces in the third direction) of semiconductor layers 2a, 2b, and 2c in fin type stacked layer structures Fin0, Fin1, Fin2, and Fin3 is formed, and a recording layer (e.g., a charge storage layer) covering the gate insulating layer is formed. Further, a block insulating layer covering the recording layer is formed, and a conductive layer (gate electrode layer) covering the block insulating layer is formed.

A resist pattern is then formed on the gate electrode layer, for example, by the PEP. Using this resist pattern as a mask, the gate electrode layer, the block insulating layer, the recording layer, and the gate insulating layer are etched by the RIE. As a result, word line WL which extends, in the first direction, on the side surfaces of fin type stacked layer structures Fin0, Fin1, Fin2, and Fin3 in the third direction and which extends in the third direction when seen from the upper surface thereof is formed, and assist gate electrode AG is formed at the end of each of fin type stacked layer structures Fin0, Fin1, Fin2, and Fin3 in the second direction.

As shown in FIG. 36, a resistance reduction process for reducing the resistance of semiconductor layers 2a, 2b, and 2c is then applied to first and second beams 5a and 5b.

The resistance reduction process is conducted, for example, by implanting impurity ions from the outer sides (side surfaces) of first and second beams 5a and 5b and from the inner side of first and second beams 5a and 5b (the inner side of slit 13) and forming impurity regions 8 in semiconductor layers 2a, 2b, and 2c within first and second beams 5a and 5b.

As an impurity to be implanted into semiconductor layers 2a, 2b, and 2c, it is possible to use an impurity serving as an N-type semiconductor, for example, a pentad such as arsenic (As) or phosphorus (P), an impurity serving as a P-type semiconductor, for example, a triad such as boron (B) or indium (In), and a combination of these substances.

Otherwise, a technique used for a control gate electrode of a flash memory can be used as the resistance reduction process.

For example, the resistance of semiconductor layers 2a, 2b, and 2c can be reduced by forming a low resistance layer on the side surfaces (including the inner surfaces exposed in slit 13) of semiconductor layers 2a, 2b, and 2c within first and second beams 5a and 5b.

The low resistance layer can be made of a metal compound such as tantalum nitride (TaN), tantalum carbide (TaC), or titanium nitride (TiN), or an electrically conductive metallic material such as Ni, V, Cr, Mn, Y, Mo, Ru, Rh, Hf, Ta, W, Ir, Co, Ti, Er, Pt, Pd, Zr, Gd, Dy, Ho, and Er and silicides of these substances.

Impurity regions 8 within first and second beams 5a and 5b may be combined with the low resistance layer formed on the side surfaces of semiconductor layers 2a, 2b, and 2c within first and second beams 5a and 5b.

Other structures and processes for reducing the resistance of first and second beams 5a and 5b will be described later.

As shown in FIG. 37, assist gate line contact portion (plug) 6 connected to assist gate electrode AG, and bit line contact portion (plug) 7 independently connected to each of semiconductor layers 2a, 2b, and 2c within first and second beams 5a and 5b are then formed.

The device shown in FIG. 30 and FIG. 31 is completed by forming bit lines BL and assist gate lines AGL.

According to the present embodiment, slit 13 is formed simultaneously with fin type stacked layer structures Fin0, Fin1, Fin2, and Fin3 and first and second beams 5a and 5b which link the fin type stacked layer structures at the ends in the second direction. This is intended to reduce the number of manufacturing steps (the number of PEPs).

Otherwise, slit 13 may be formed separately from the patterning of fin type stacked layer structures Fin0, Fin1, Fin2, and Fin3 and first and second beams 5a and 5b, as in the process shown in FIG. 28 and FIG. 29. For example, an interlayer film is buried after gate fabrication, and planarized by the CMP. Then slit 13 may be formed by the application of a resist and the PEP.

In the manufacturing method described above, the increase in the number of manufacturing steps can be inhibited preferably by performing the resistance reduction process for semiconductor layers 2a, 2b, and 2c within first and second beams 5a and 5b simultaneously with, for example, the resistance reduction process for the gate electrode (word line WL) of memory cell MC or the resistance reduction process for a gate electrode of an FET disposed in a peripheral circuit.

(5) Resistance Reduction Technique

An example of the resistance reduction technique for the beam applicable to the above first to fourth embodiments is described.

FIG. 38 and FIG. 39 show an example of resistance reduction by impurity regions 8 and 16.

This example corresponds to the third embodiment, and beam 5 has slit 13. Impurity region 8 formed, for example, by ion implantation is provided in each of semiconductor layers 2a, 2b, and 2c within beam 5. Separately from impurity region 8, impurity region 16 is also provided in each of semiconductor layers 2a, 2b, and 2c immediately under contact plug 7.

As an impurity to constitute impurity regions 8 and 16, it is possible to use an impurity serving as an N-type semiconductor, for example, a pentad such as arsenic (As) or phosphorus (P), an impurity serving as a P-type semiconductor, for example, a triad such as boron (B) or indium (In), and a combination of these substances.

Here, the total resistance of each semiconductor layers 2a, 2b, and 2c within beam 5 can be reduced by the diffusion of the impurity from impurity regions 8 and 16.

In particular, lowermost semiconductor layer 2a has the longest distance from the end of slit 13 to contact plug 7. It is therefore preferable to combine the diffusion of the impurity from impurity regions 8 and 16 with the implantation of the impurity from the side surface of beam 5 in the second direction and thereby reduce the total resistance value of semiconductor layer 2a.

Figure 40:
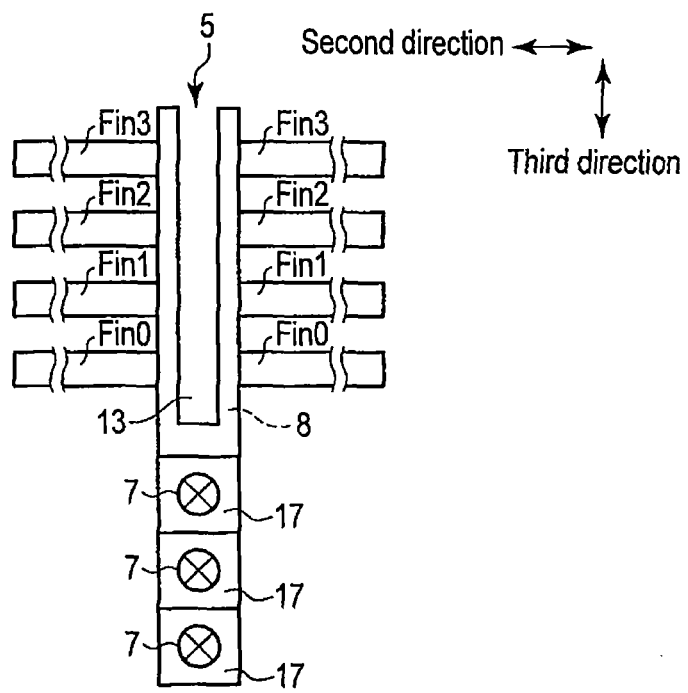
Figure 41:
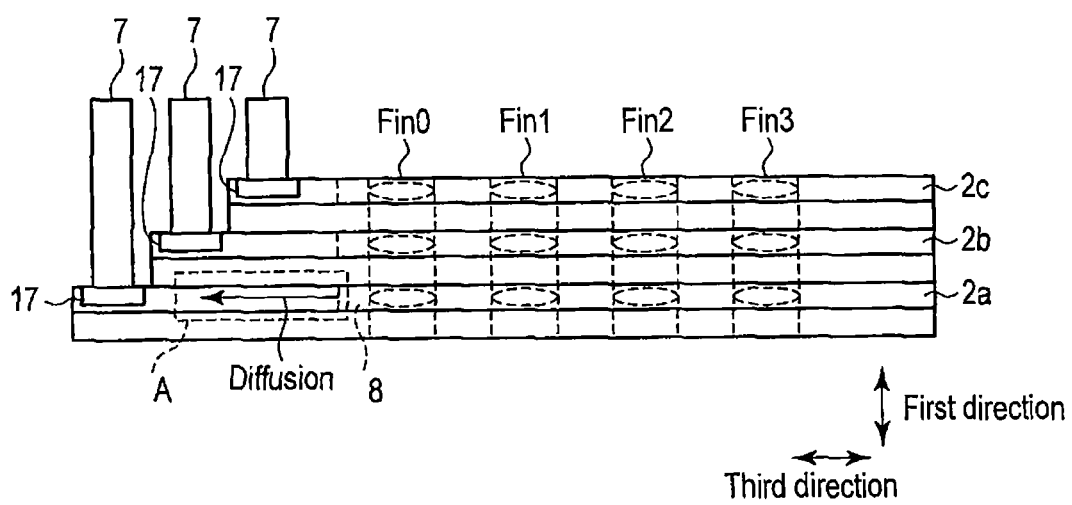

FIG. 40 and FIG. 41 show an example of resistance reduction by impurity region 8 and low resistance layer 17.

This example also corresponds to the third embodiment, and beam 5 has slit 13. Impurity region 8 formed, for example, by ion implantation is provided in each of semiconductor layers 2a, 2b, and 2c within beam 5. Low resistance layer 17 is provided in each of semiconductor layers 2a, 2b, and 2c immediately under contact plug 7. In addition to low resistance layer 17, impurity region 16 shown in FIG. 38 and FIG. 39 may be formed.

As an impurity to constitute impurity region 8, it is possible to use an impurity serving as an N-type semiconductor, for example, a pentad such as arsenic (As) or phosphorus (P), an impurity serving as a P-type semiconductor, for example, a triad such as boron (B) or indium (In), and a combination of these substances.

Low resistance layer 17 can be made of a metal compound such as tantalum nitride (TaN), tantalum carbide (TaC), or titanium nitride (TiN), or an electrically conductive metallic material such as Ni, V, Cr, Mn, Y, Mo, Ru, Rh, Hf, Ta, W, Ir, Co, Ti, Er, Pt, Pd, Zr, Gd, Dy, Ho, and Er and silicides of these substances.

Here, the total resistance of each semiconductor layers 2a, 2b, and 2c within beam 5 can be reduced by the diffusion of the impurity from impurity region 8.

In particular, lowermost semiconductor layer 2a has the longest distance from the end of slit 13 to contact plug 7. It is therefore preferable to combine the diffusion of the impurity from impurity region 8 with the implantation of the impurity from the side surface of beam 5 in the second direction and thereby reduce the total resistance value of semiconductor layer 2a.

In this example, low resistance layer 17 functions as an etching stopper during the formation of a contact hole for contact plug 7.

Figure 42:
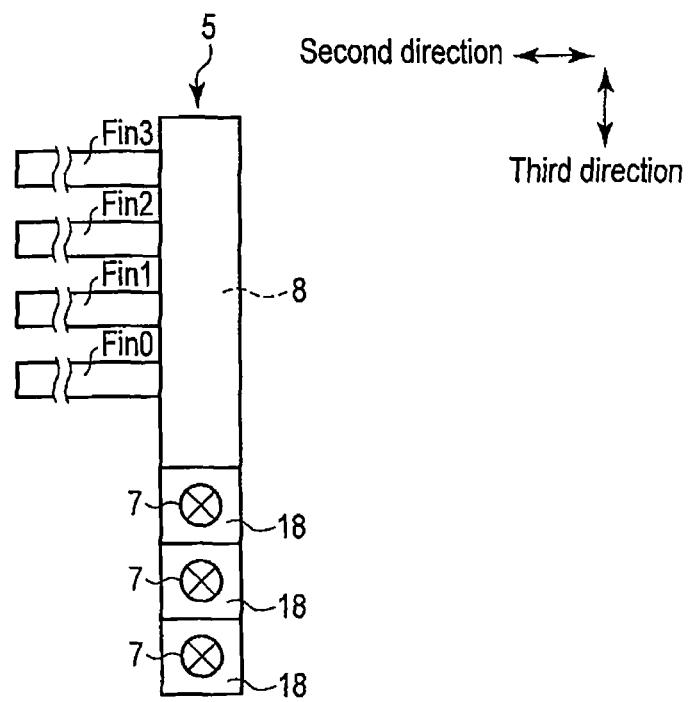
Figure 43:
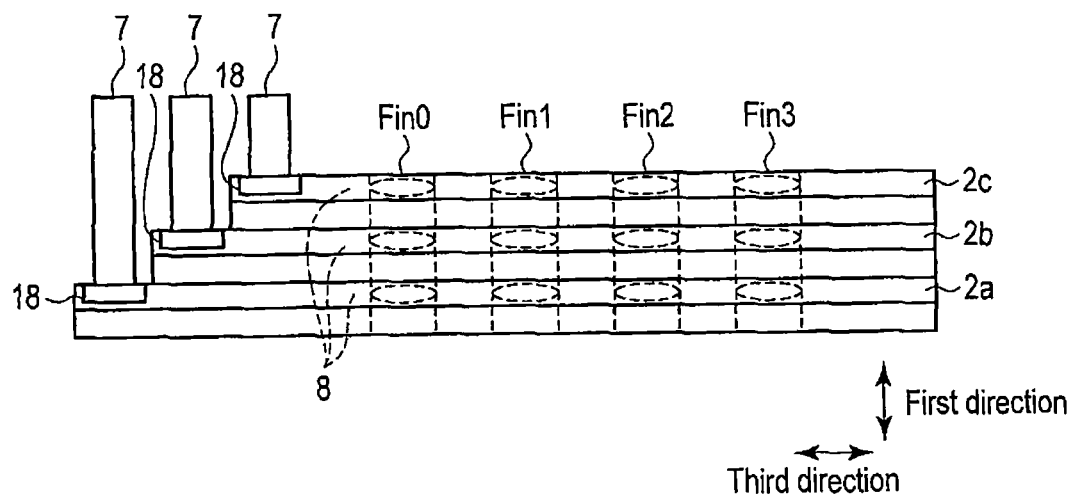

FIG. 42 and FIG. 43 show an example of resistance reduction by impurity region 8 and low resistance layer 18.

This example corresponds to the first embodiment, and fin type stacked layer structures Fin0 to Fin3 are connected to one end of beam 5 in the second direction, and no fin type stacked layer structures are connected to the other end of beam 5 in the second direction.

Impurity region 8 formed, for example, by ion implantation is provided in each of semiconductor layers 2a, 2b, and 2c within beam 5. Low resistance layer 18 is provided in each of semiconductor layers 2a, 2b, and 2c immediately under contact plug 7. In addition to low resistance layer 18, impurity region 16 shown in FIG. 38 and FIG. 39 may be formed.

As an impurity to constitute impurity region 8, it is possible to use an impurity serving as an N-type semiconductor, for example, a pentad such as arsenic (As) or phosphorus (P), an impurity serving as a P-type semiconductor, for example, a triad such as boron (B) or indium (In), and a combination of these substances.

Low resistance layer 18 can be made of a metal compound such as tantalum nitride (TaN), tantalum carbide (TaC), or titanium nitride (TiN), or an electrically conductive metallic material such as Ni, V, Cr, Mn, Y, Mo, Ru, Rh, Hf, Ta, W, Ir, Co, Ti, Er, Pt, Pd, Zr, Gd, Dy, Ho, and Er and silicides of these substances.

Here, the total resistance of each of semiconductor layers 2a, 2b, and 2c within beam 5 can be reduced by the diffusion of the impurity from impurity region 8.

In particular, lowermost semiconductor layer 2a has the longest distance from the end of slit 13 to contact plug 7. It is therefore preferable to combine the diffusion of the impurity from impurity region 8 with the implantation of the impurity from the side surface of beam 5 in the second direction and thereby reduce the total resistance value of semiconductor layer 2a.

In this example as well, low resistance layer 18 functions as an etching stopper during the formation of a contact hole for contact plug 7.

Here, in this example, no fin type stacked layer structures are connected to the other end of beam 5 in the second direction. Accordingly, the resistance reduction of beam 5 can be further improved, for example, by combining a structure shown in FIG. 44 and FIG. 45 described below.

Figure 44:
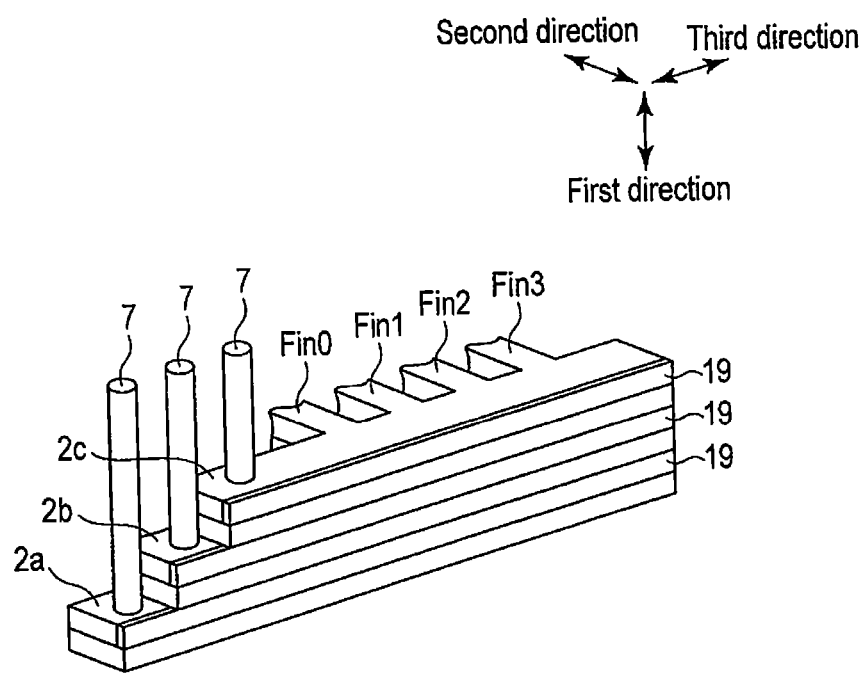
Figure 45:
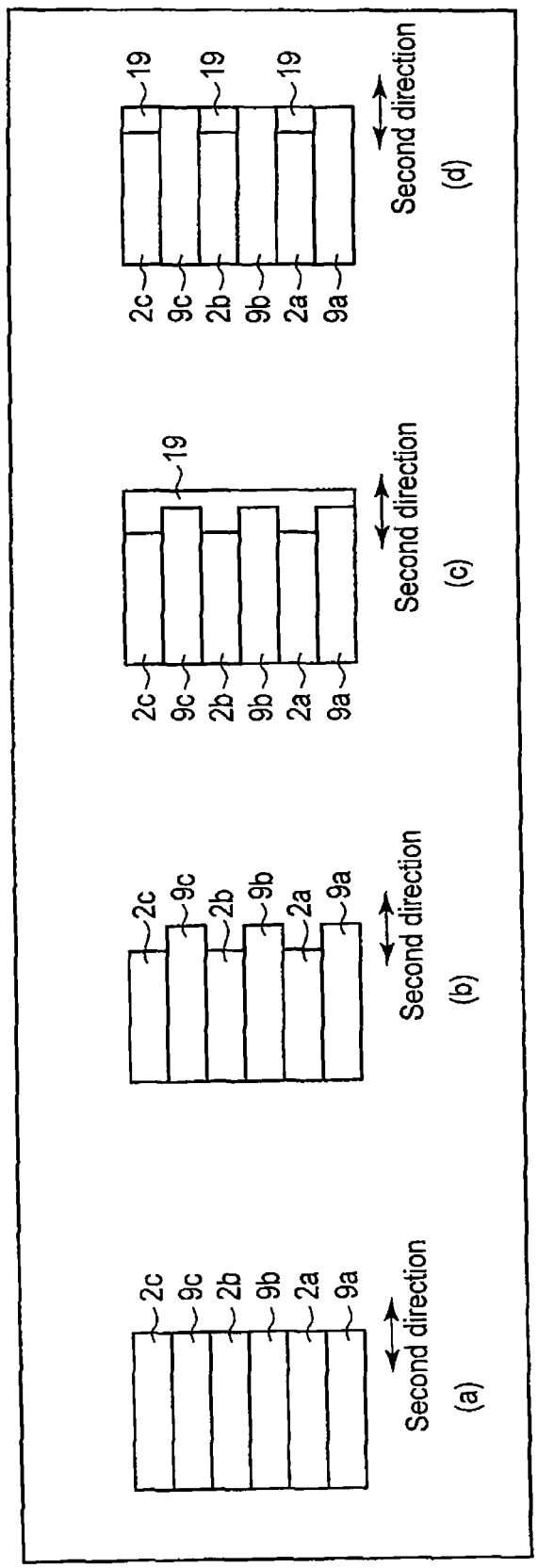

FIG. 44 and FIG. 45 show an example of resistance reduction by low resistance layer 19 on the side surface of beam 5.

This structure is characterized in that low resistance layer 19 is formed at the other end of beam 5 in the second direction to which no fin type stacked layer structures are connected. Low resistance layer 19 can be made of a metal compound such as tantalum nitride (TaN), tantalum carbide (TaC), or titanium nitride (TiN), or an electrically conductive metallic material such as Ni, V, Cr, Mn, Y, Mo, Ru, Rh, Hf, Ta, W, Ir, Co, Ti, Er, Pt, Pd, Zr, Gd, Dy, Ho, and Er and silicides of these substances.

First, as shown in (a) and (b) of FIG. 45, a stack structure comprising semiconductor layers 2a, 2b, and 2c and insulating layers 4a, 4b, and 4c is formed, and recesses are then formed in semiconductor layers 2a, 2b, and 2c in the second direction by dry etching or wet etching.

Furthermore, as shown in (c) and (d) of FIG. 45, low resistance layer 19 that fills the recesses of semiconductor layers 2a, 2b, and 2c in the second direction is formed, and then low resistance layer 19 is only left in the recesses of semiconductor layers 2a, 2b, and 2c in the second direction by the RIE.

Here, for semiconductor layers 2a, 2b, and 2c to be completely insulated by insulating layers 4a, 4b, and 4c, low resistance layer 19 needs to be sufficiently etched so that low resistance layer 19 may not remain on the side surfaces of insulating layers 4a, 4b, and 4c in the second direction.

Low resistance layer 19 can also be formed by substitution that uses gas atmosphere such as $WF_6$, $PtF^6$, or $RuF^5$ for each of semiconductor layers 2a, 2b, and 2c.

For example, when W is used as low resistance layer 19, the stack structure comprising semiconductor layers 2a, 2b, and 2c and insulating layers 4a, 4b, and 4c is formed, and semiconductor layers 2a, 2b, and 2c are then brought into contact with a gas containing $WF_6$ at a temperature of 200 to 300° C. Thereby, low resistance layer (W) 19 can be formed on the surfaces of semiconductor layers 2a, 2b, and 2c.

Similarly, when Ti, Co, Ni, or Mo is used as low resistance layer 19, semiconductor layers 2a, 2b, and 2c are brought into contact with a gas containing $TiCl_4$, $CoCl_2$, $NiCl_2$, $MoF_6$ at a temperature of 200 to 500° C., so that low resistance layer (Ti, Co, Ni, or Mo) 19 can be formed on the surfaces of semiconductor layers 2a, 2b, and 2c.

When the above-described process is used, an insulating material such as $SiO_2$, SiN can be used for insulating layers 4a, 4b, and 4c.

FIG. 46 to FIG. 50 show an example of resistance reduction by impurity regions 20a to 20c.

This structure is characterized in that ion implantation is conducted every time each of semiconductor layers 2a, 2b, and 2c is formed to ensure that impurity regions 20a to 20c will be formed in each of entire semiconductor layers 2a, 2b, and 2c within beam 5.

Figure 46:
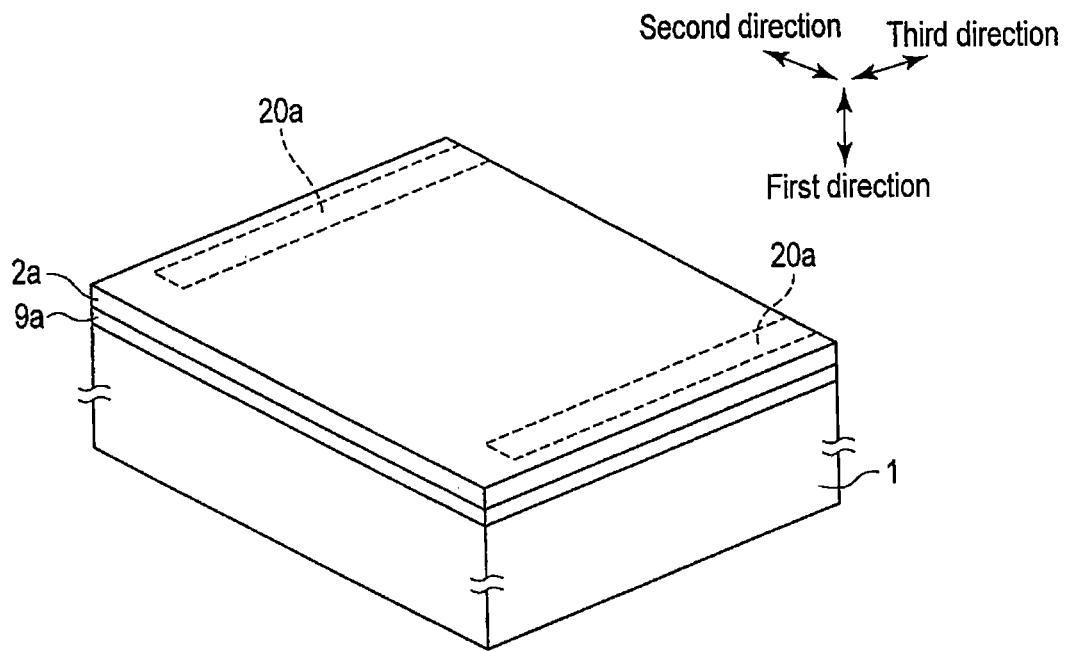

First, as shown in FIG. 46, insulating layer 9a is formed on semiconductor substrate 1, and semiconductor layer 2a is formed on insulating layer 9a. A resist pattern is then formed on semiconductor layer 2a by the PEP, and using this resist pattern as a mask, impurity region 20a is formed in semiconductor layer 2a by ion implantation. This impurity region 20a is formed in a part to serve as a beam which supports the fin type stacked layer structures. The resist pattern is removed afterwards.

Figure 47:
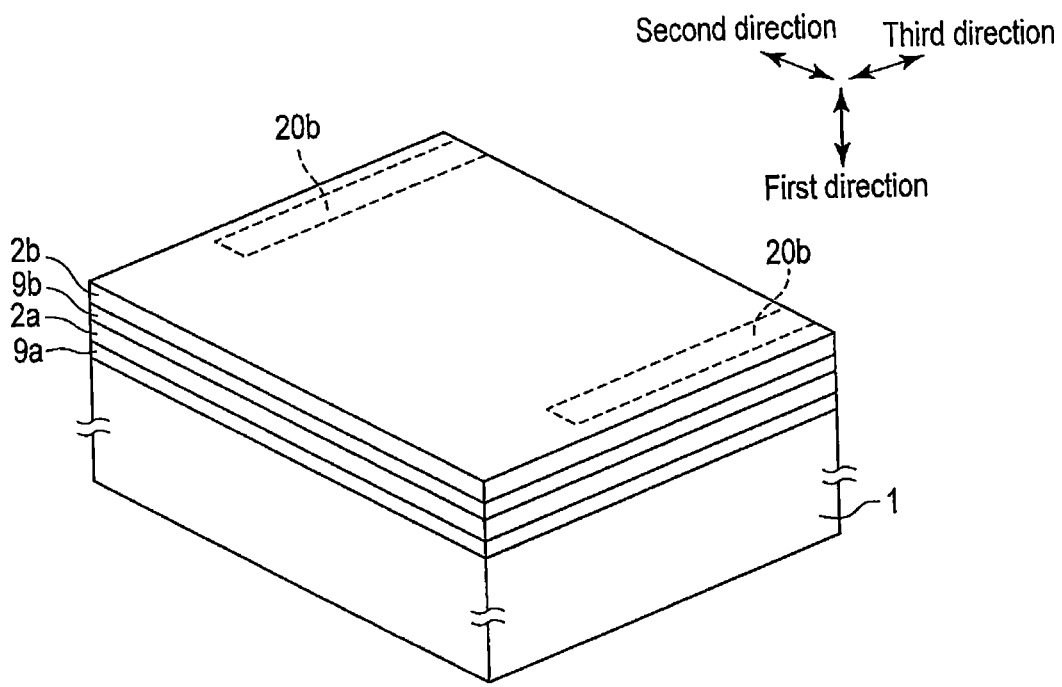

Furthermore, as shown in FIG. 47, insulating layer 9b is formed on semiconductor layer 2a, and semiconductor layer 2b is formed on insulating layer 9b. A resist pattern is then formed on semiconductor layer 2b by the PEP, and using this resist pattern as a mask, impurity region 20b is formed in semiconductor layer 2b by ion implantation. This impurity region 20b is formed in a part to serve as a beam which supports the fin type stacked layer structures. The resist pattern is removed afterwards.

Furthermore, as shown in FIG. 48, insulating layer 9c is formed on semiconductor layer 2b, and semiconductor layer 2c is formed on insulating layer 9c. A resist pattern is then formed on semiconductor layer 2c by the PEP, and using this resist pattern as a mask, impurity region 20c is formed in semiconductor layer 2c by ion implantation. This impurity region 20c is formed in a part to serve as a beam which supports the fin type stacked layer structures. The resist pattern is removed afterwards.

Furthermore, as shown in FIG. 49, a stepped shape that exposes the upper surfaces of semiconductor layers (the lowermost layer, the intermediate layer, and the uppermost layer) 2a, 2b, and 2c is formed at the end of the stack structure comprising insulating layers 9a, 9b, and 9c and semiconductor layers 2a, 2b, and 2c in the third direction.

This stepped shape can be formed, for example, by three PEPs. The method of forming the stepped shape has already been described in detail in the first embodiment (see FIG. 5) and is therefore not descried in detail here.

Furthermore, as shown in FIG. 50, a resist pattern is formed on semiconductor layer 2c by the PEP, and using this resist pattern as a mask, impurity regions 16 are formed in semiconductor layers 2a, 2b, and 2c by ion implantation. This impurity region 16 is formed into the contact portion where the contact plug is formed. The resist pattern is removed afterwards.

According to the process described above, impurity regions 16 and 20a to 20c are previously formed in semiconductor layers 2a, 2b, and 2c within beam which supports the fin type stacked layer structures, so that the total resistance of each of semiconductor layers 2a, 2b, and 2c within the beam can be reduced.

(6) Operation

An example of the operation of the nonvolatile semiconductor memory device according to the embodiments is described.

In the following explanation, the targets for writing/reading are memory strings Na, Nb, and Nc in in type stacked layer structures Fin0 shown in FIG. 1 (first embodiment), FIG. 10 (second embodiment), FIG. 20 (third embodiment), and FIG. 30 (fourth embodiment).

Each of memory strings Na, Nb, and Nc is a NAND string comprising memory cells connected in series, and each of the memory cells is an FET (flash memory cell) having a charge storage layer.

An example of write operation is as follows.

First, a ground potential is applied to bit line BL and source line SL, and in this condition, a first positive bias is applied to all word lines WL. At the same time, N-type impurity storage regions are formed in semiconductor layers 2a, 2b, and 2c serving as channels of memory strings Na, Nb, and Nc.

Furthermore, the potential of assist gate line AGL corresponding to selected fin type stacked layer structure Fin0 is set to, for example, "H", and assist gate transistor AGT in fin type stacked layer structure Fin0 is switched on. The potentials of assist gate lines AGL corresponding to unselected fin type stacked layer structures Fin1, Fin2, and Fin3 are set to, for example, "L", and assist gate transistors AGT in fin type stacked layer structures Fin1, Fin2, and Fin3 are switched off.

Here, "H" is defined as a potential for switching on the transistor (FET), and "L" is defined as a potential for switching off the transistor (FET). The same applies to the following cases.

Subsequently, for example, a second positive bias higher than the first positive bias is applied to word line (control gate electrode) WL-select of the selected memory cell targeted for writing.

In the structures shown in FIG. 1, FIG. 20, and FIG. 30, data can be written into all memory strings Na, Nb, and Nc in selected fin type stacked layer structure Fin0 in parallel. Thus, program data "0"/"1" is transferred to the channels of memory strings Na, Nb, and Nc in fin type stacked layer structure Fin0 from bit line BL.

In the structure shown in FIG. 10, data is written into one memory string in selected fin type stacked layer structure Fin0. Thus, one memory string, for example, memory string Na is selected by layer select transistors LSTa, LSTb, and LSTc, and program data "0"/"1" is transferred to the channel of selected memory string Na.

At the same time, in memory strings Na, Nb, and Nc in unselected fin type stacked layer structures Fin1, Fin2, and Fin3, the channel potential is increased by capacitive coupling resulting from the application of the second positive bias. Therefore, a voltage high enough for writing is not applied across the control gate electrode (or charge storage layer) and the channel, and writing is inhibited accordingly.

Similarly, in the example shown in FIG. 10, the channel potential is increased in memory strings Nb and Nc in fin type stacked layer structures Fin0, and a voltage high enough for writing is not applied across the control gate electrode (or charge storage layer) and the channel, and writing is inhibited accordingly.

In contrast, in selected fin type stacked layer structure Fin0, assist gate transistor AGT is on. Thus, program data "0"/"1" is transferred to memory strings Na, Nb and Nc (in the cases shown in FIG. 1, FIG. 20, and FIG. 30) or to the channel of memory string Na (in the case shown in FIG. 10).

When the program data is "0", the channel, for example, has a positive potential. In this condition, if the second positive bias is applied to the control gate electrode of the selected memory cell, assist gate transistor AGT on the side of bit line BL is cut off when the channel potential is slightly increased by the capacitive coupling.

Therefore, in the memory string to which the program data "0" is transferred, the channel potential is increased by the capacitive coupling resulting from the application of the second positive bias. That is, a voltage high enough for writing is not applied across the control gate electrode (or charge storage layer) and the channel, and electrons are not injected into the charge storage layer. That is, writing is inhibited ("0"-programming).

In contrast, when the program data is "1", the channel, for example, has a ground potential. In this condition, even if the second positive bias is applied to the control gate electrode of the selected memory cell, assist gate transistor AGT on the side of bit line BL is cut not off.

Therefore, in the memory string to which the program data "1" is transferred, a voltage high enough for writing is generated across the control gate electrode (or charge storage layer) and the channel, and electrons are injected into the charge storage layer. That is, writing is performed ("1"-programming).

An example of erase operation is as follows.

The erase operation can be simultaneously performed in, for example, memory strings Na, Nb, and Nc in selected one or more fin type stacked layer structures.

First, a ground potential is applied to bit line BL and source line SL, and a first negative bias is applied to word line WL. At the same time, P-type impurity storage regions are formed in semiconductor layers 2a, 2b, and 2c serving as channels of memory strings Na, Nb, and Nc.

In the example shown in FIG. 10, all layer select transistors LSTa, LSTb, and LSTc are switched on.

Furthermore, the potential of assist gate line AGL corresponding to selected one or more fin type stacked layer structures targeted for erasing is set to "H", and assist gate transistor AGT corresponding to selected one or more fin type stacked layer structures is switched on.

A second negative bias higher than the first negative bias is then applied to all word lines WL.

As a result, a voltage high enough for erasing is generated across the control gate electrode (or charge storage layer) and the channel, and electrons in the charge storage layer are discharged to the channel. Thus, erasing is performed.

An example of read operation is as follows.

First, bit line BL is connected to a reading circuit, and a ground voltage is applied to source line SL.

The potential of assist gate line AGL corresponding to selected fin type stacked layer structure Fin0 is then set to "H", and assist gate transistor AGT in fin type stacked layer structure Fin0 is switched on. The potentials of assist gate lines AGL corresponding to unselected fin type stacked layer structures Fin1, Fin2, and Fin3 are set to "L", and assist gate transistors AGT in fin type stacked layer structures Fin1, Fin2, and Fin3 are switched off.

Subsequently, a first positive bias is applied to word line WL. The first positive bias has a value that switches on the memory cell regardless of whether data is "0" or "1".

Data is then sequentially read in memory strings Na, Nb, and Nc from the memory cells on the side of source line SL to the memory cells on the side of bit line BL.

In the selected memory cell targeted for reading, for example, a second positive bias for reading that is lower than the first positive bias is applied to the control gate electrode. The second positive bias has, for example, a value between the threshold of the "0"-data and the threshold of the "1"-data.

Therefore, whether to switch on or off the selected memory cell is determined by the value of the data stored in the selected memory cell, so that reading can be performed by using the reading circuit to detect potential changes in bit line BL and changes in currents running through bit line BL.

In the structures shown in FIG. 1, FIG. 20, and FIG. 30, data can be read from all memory strings Na, Nb, and Nc in selected fin type stacked layer structure Fin0 in parallel.

In contrast, in the structure shown in FIG. 10, one memory string in selected fin type stacked layer structure Fin0, for example, memory string Na is selected by layer select transistors LSTa, LSTb, and LSTc, and data is read from the selected memory string.

(7) Other Structures

In the embodiments described above, the memory cell formed in the fin type stacked layer structure is an EFT (e.g., a flash memory cell having a charge storage layer) which has the recording layer and the gate electrode and which uses the semiconductor layer as a channel. However, the present embodiment is not limited to these embodiments.

For example, when first and second fin type stacked layer structures intersect with each other and two-terminal type memory cells are arranged between an electrically conductive layer in the first fin type stacked layer structure and an electrically conductive layer in the second fin type stacked layer structure, a cross point type memory cell array can be obtained.

In this case, as the memory cells, it is possible to employ, as they are, memory cells for use in a resistance change type memory such as a resistance random access memory (ReRAM), a phase change memory (PCM), or a magnetic random access memory (MRAM). As the electrically conductive layer, it is possible to employ a semiconductor layer to which the resistance reduction technique according to the embodiments described above is applied, or a metal layer.

Figure 51:
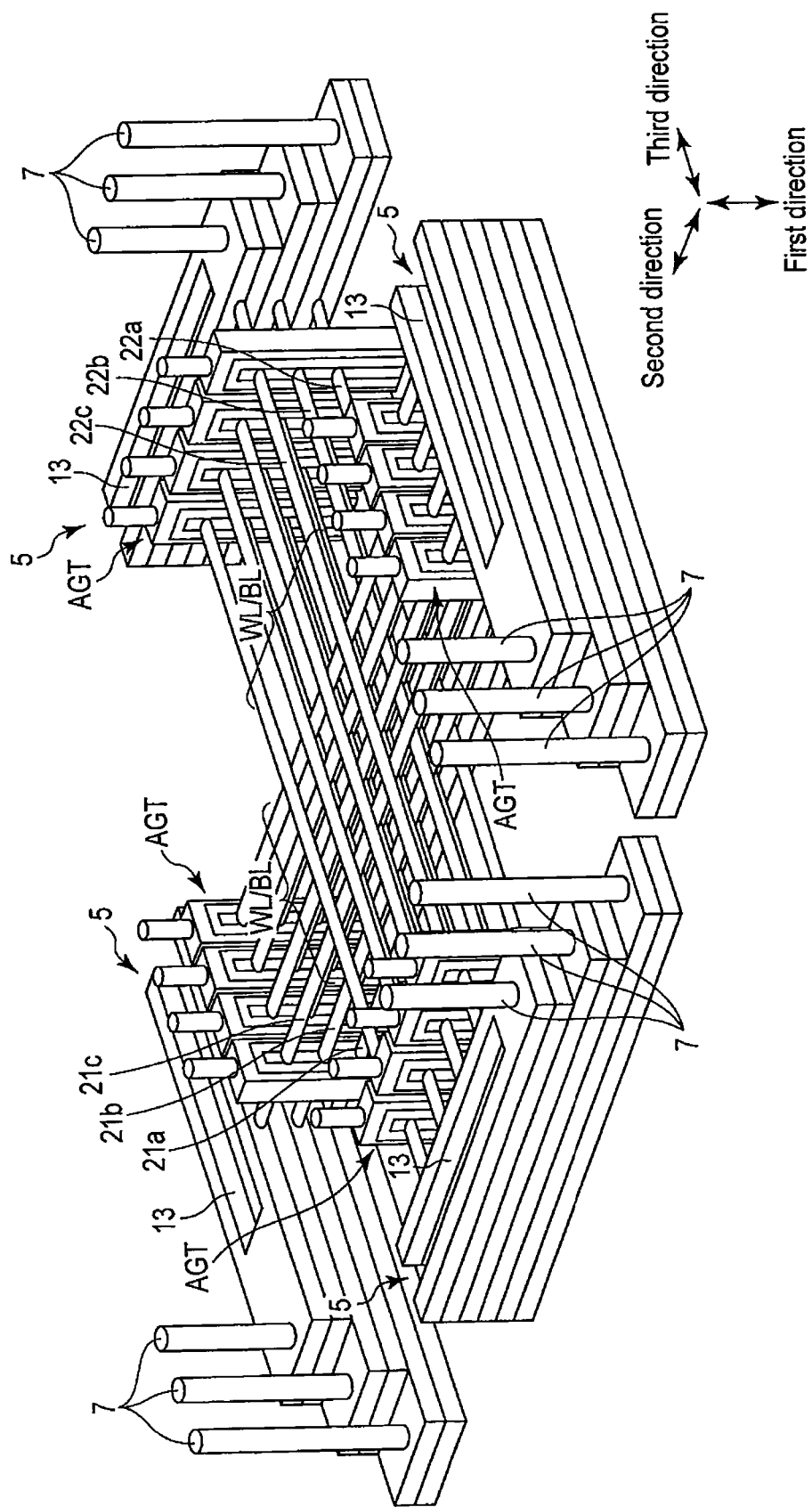
FIG. 51 is a perspective view showing another embodiment.

FIG. 51 is a perspective view of a nonvolatile semiconductor memory device which makes it possible to provide a cross point type memory cell array, and FIG. 52 shows a plan view of the device shown in FIG. 51.

On semiconductor substrate (e.g., an Si substrate) 1, a first fin type stacked layer structure and a second fin type stacked layer structure intersecting with each other are arranged.

The first fin type stacked layer structure comprises electrically conductive layers (e.g., semiconductor layers or metal layers) 21a, 21b, and 21c which are stacked in a first direction perpendicular to the surface of semiconductor substrate 1 and which extend in a second direction parallel to the surface of semiconductor substrate 1.

The second fin type stacked layer structure comprises electrically conductive layers (e.g., semiconductor layers or metal layers) 22a, 22b, and 22c which are stacked in the first direction perpendicular to the surface of semiconductor substrate 1 and which extend in a third direction parallel to the surface of semiconductor substrate 1.

In the present embodiment, the number of electrically conductive layers stacked in the first direction is three in both of the first and second fin type stacked layer structures, but the present embodiment is not limited to this embodiment. That is, the number of the electrically conductive layers stacked in the first direction may be two or more.

It is to be noted that the larger number of electrically conductive layers stacked in the first direction is suitable for higher capacity of the nonvolatile semiconductor device.

Electrically conductive layers 21a, 21b, and 21c in the first fin type stacked layer structure function as word lines WL or bit lines BL. Similarly, electrically conductive layers 22a, 22b, and 22c in the second fin type stacked layer structure function as word lines WL or bit lines BL.

Figure 53:
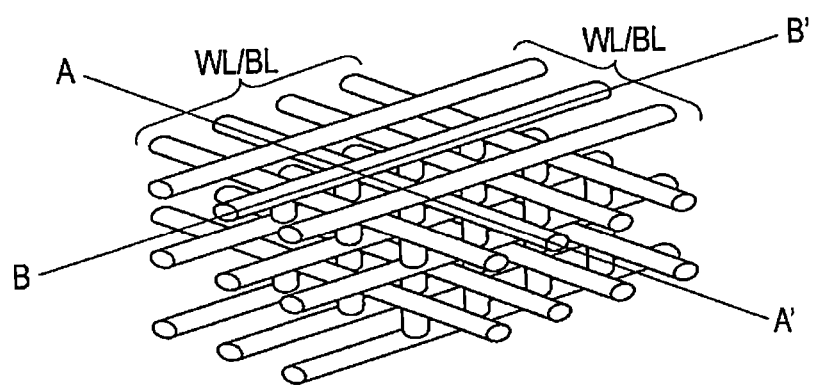
FIG. 53 is a perspective view showing a memory cell array.
Figure 54:
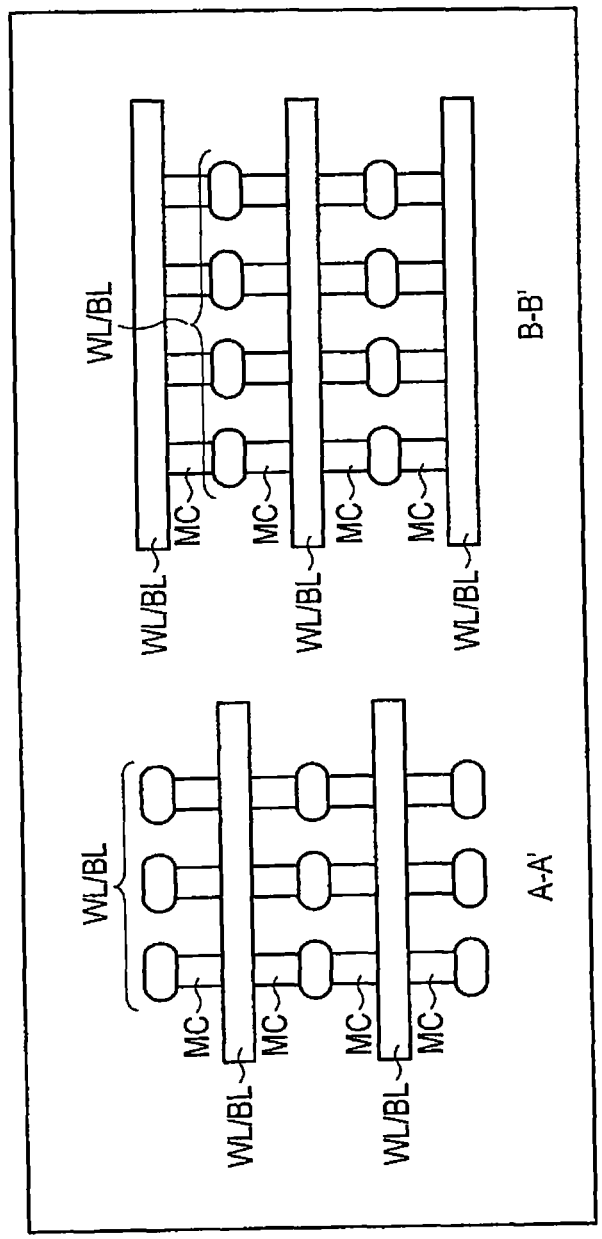
FIG. 54 is a sectional view of FIG. 53.

For example, as shown in FIG. 53 and FIG. 54, two-terminal type memory cells MC are arranged between electrically conductive layer WL/BL (21a, 21b, or 21c) in the first fin type stacked layer structure and electrically conductive layer WL/BL (22a, 22b, or 22c) in the second fin type stacked layer structure.

As the memory cells, it is possible to employ, as they are, memory cells for use in a resistance change element whose resistance value changes in accordance with a voltage, a current, heat, or the like, or a resistance change type memory such as a resistance random access memory (ReRAM), a phase change memory (PCM), or a magnetic random access memory (MRAM).

Beams 5 extending in the third direction are connected to both ends of electrically conductive layer WL/BL (21a, 21b, or 21c) in the first fin type stacked layer structure in the second direction. For example, beams 5 have the same structure as the first fin type stacked layer structure.

Similarly, beams 5 extending in the second direction are connected to both ends of electrically conductive layer WL/BL (22a, 22b, or 22c) in the second fin type stacked layer structure in the third direction. For example, beams 5 have the same structure as the second fin type stacked layer structure.

Beams 5 are provided to fix the first and second fin type stacked layer structures, thereby preventing the collapse of the structures. The width of each beam 5 connected to the first fin type stacked layer structure in the second direction is preferably greater than the width of the first fin type stacked layer structure in the third direction, i.e., the width of each of electrically conductive layers WL/BL (21a, 21b, and 21c) in the third direction.

Moreover, the width of each beam 5 connected to the second fin type stacked layer structure in the third direction is preferably greater than the width of the second fin type stacked layer structure in the second direction, i.e., the width of each of electrically conductive layers WL/BL (22a, 22b, and 22c) in the second direction.

Between electrically conductive layer WL/BL (21a, 21b, or 21c) in the first fin type stacked layer structure and beam 5, assist gate transistor AGT is disposed. Also between electrically conductive layer WL/BL (22a, 22b, or 22c) in the second fin type stacked layer structure and beam 5, assist gate transistor AGT is disposed.

Assist gate transistors AGT have only to function as switches. Assist gate transistors AGT can be constituted of, for example, transistors having a metal-oxide-semiconductor (MOS) structure.

At an end of beam 5 of the first fin type stacked layer structure in the third direction, there is added a function (layer selector) of selecting one of electrically conductive layers 21a, 21b, and 21c. For example, the end of beam 5 in the third direction has a stepped shape, and contact plug 7 is independently connected to each of electrically conductive layers 21a, 21b, and 21c in the first fin type stacked layer structure. This allows one of electrically conductive layers 21a, 21b, and 21c to be selected.

At an end of beam 5 of the second fin type stacked layer structure in the second direction, there is added a function (layer selector) of selecting one of electrically conductive layers 22a, 22b, and 22c. For example, the end of beam 5 in the second direction has a stepped shape, and contact plug 7 is independently connected to each of electrically conductive layers 22a, 22b, and 22c in the second fin type stacked layer structure. This allows one of electrically conductive layers 22a, 22b, and 22c to be selected.

The function of selecting one of electrically conductive layers 21a, 21b, and 21c in the first fin type stacked layer structure and the function of selecting one of electrically conductive layers 22a, 22b, and 22c in the second fin type stacked layer structure may be obtained by layer select transistors (refer to the second embodiment) LST.

In the present embodiment, the number of the first or second fin type stacked layer structures is four, but the present embodiment is not limited to this embodiment. That is, the number of the first or second fin type stacked layer structures may be two or more.

It is to be noted that the larger number of the first or second fin type stacked layer structures is more suitable for higher capacity of the nonvolatile semiconductor memory device.

Figure 55:
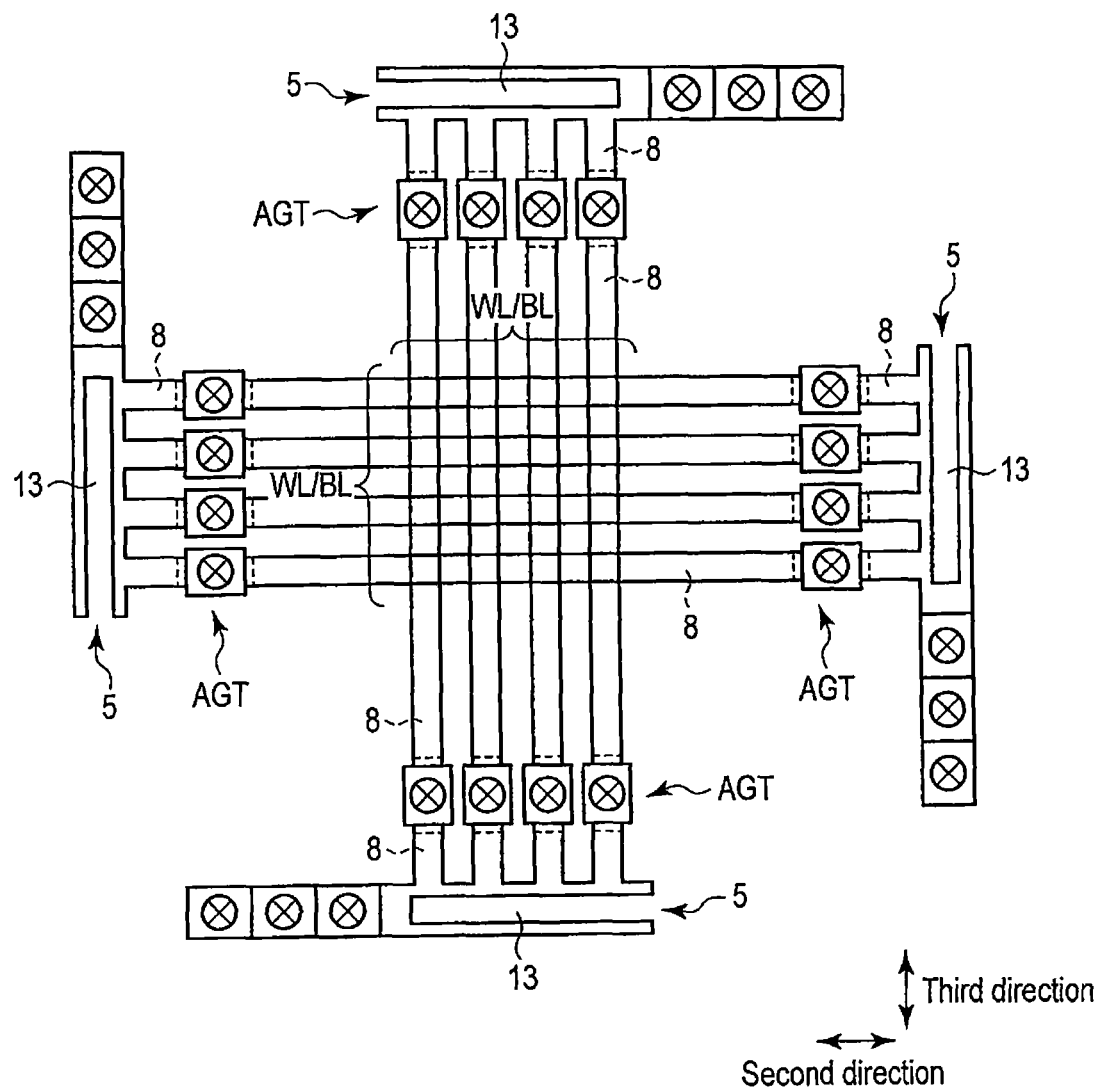

Contact plug 7 connected to two beams 5 of the first fin type stacked layer structure is located on the same side as beams 5 in the present embodiment, but may be located on a side different from beams 5 as shown in FIG. 55. Similarly, contact plug 7 connected to two beams 5 of the second fin type stacked layer structure is located on the same side as beams 5, but may be located on a side different from beams 5 as shown in FIG. 55.

In consequence, the nonvolatile semiconductor memory device has a fylfot planar shape.

Figure 57:
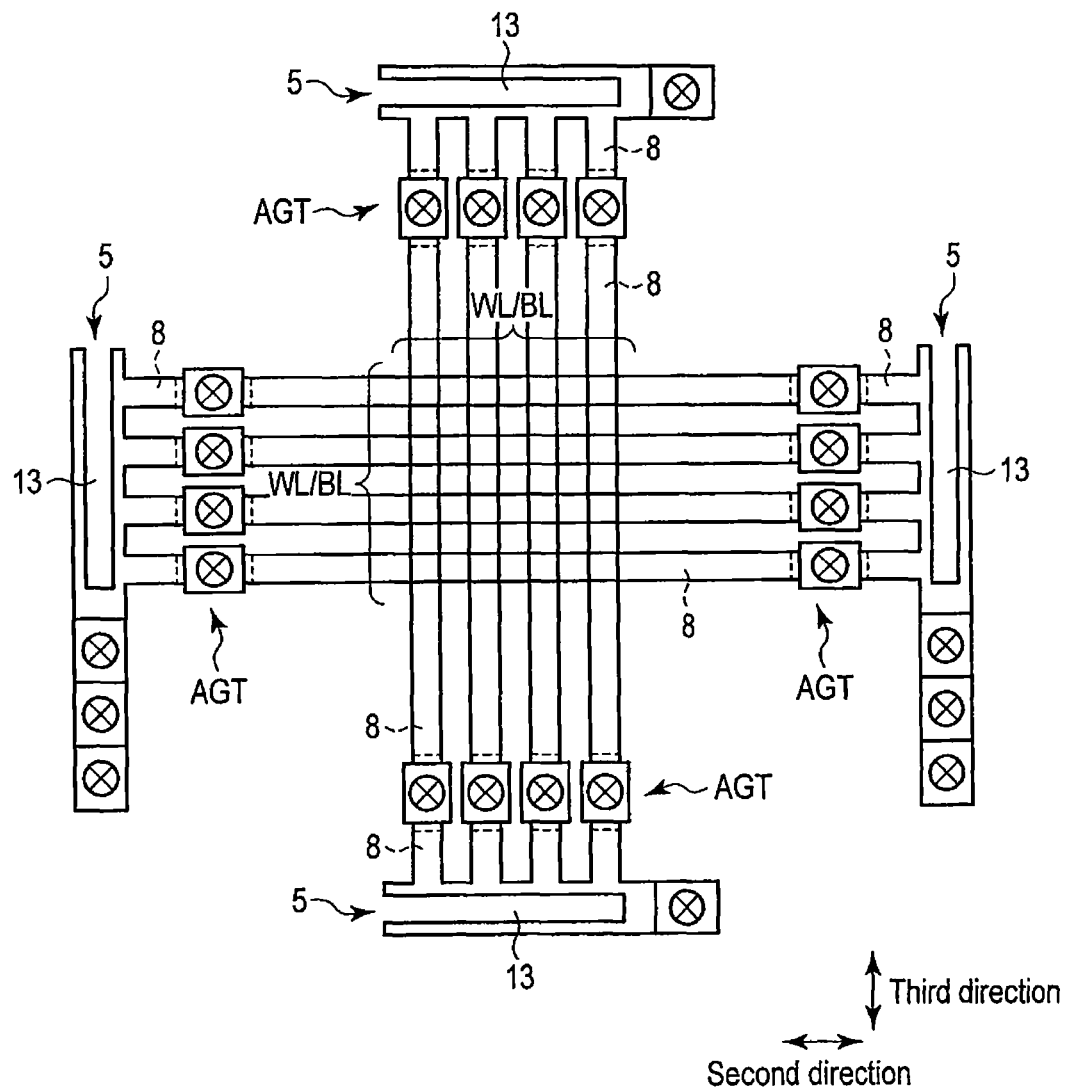
FIG. 57 is a plan view of FIG. 56.

Furthermore, in the present embodiment, the layer selector (having a stepped shape in the present embodiment) is provided in each of beams 5a, 5b, 5c, and 5d connected to the first and second fin type stacked layer structures. However, the cross point type memory cell array can be operated if the layer selector is provided in one of the first and second fin type stacked layer structures as shown in FIG. 56 and FIG. 57.

According to the present embodiment, in the structure described above, the resistance reduction technique is applied to electrically conductive layers 21a, 21b, and 21c in the first fin type stacked layer structure, electrically conductive layers 22a, 22b, and 22c in the second fin type stacked layer structure, and beam 5.

Here, electrically conductive layers 21a, 21b, 21c, 22a, 22b, and 22c and beam 5 are reduced in resistance by impurity regions 8.

For this resistance reduction, low resistance layers may be added to electrically conductive layers 21a, 21b, 21c, 22a, 22b, and 22c and beam 5, or electrically conductive layers 21a, 21b, 21c, 22a, 22b, and 22c and beam 5 may be low resistance layers such as metal layers.

(8) Conclusion

According to the embodiments, the performance of the nonvolatile semiconductor memory device can be enhanced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a semiconductor substrate;
   a structure comprising first and second memory cells stacked in a first direction perpendicular to the surface of the semiconductor substrate and which extends in a second direction parallel to the surface of the semiconductor substrate; and
   a beam,
   wherein the beam is connected to an end of the structure in the second direction and extends in a third direction perpendicular to the first and second directions,
   the structure and the beam each comprises first and second semiconductor layers stacked in the first direction,
   the first and second memory cells correspond to the first and second semiconductor layers in the structure,
   the beam comprises a contact portion in which the first and second semiconductor layers in the beam are in contact with plugs respectively at one end of the beam in the third direction, and a low resistance portion having a resistance value lower than that of the first and second semiconductor layers,
   the low resistance portion extends from the contact portion to the end of the structure, and
   the contact portion has a stepped shape that exposes the first and second semiconductor layers, and comprises the low resistance portion, in the first and second semiconductor layers exposed by the stepped shape.

2. The device of claim 1,
   wherein the low resistance portion is an impurity region in which an impurity is implanted in the first and second semiconductor layers.

3. The device of claim 2,
   wherein the impurity region is formed on the side surfaces of the first and second semiconductor layers.

4. The device of claim 1,
   wherein the low resistance portion comprises one of substances selected from the group consisting of TaN, TaC, and TiN, or one of substances selected from the group consisting of Ni, V, Cr, Mn, Y, Mo, Ru, Rh, Hf, Ta, W, Ir, Co, Ti, Er, Pt, Pd, Zr, Gd, Dy, Ho, and Er or a silicide thereof.

5. The device of claim 1, further comprising
   a layer select transistor which selects one of the first and second semiconductor layers; and a common contact plug connected to the first and second semiconductor layers in the contact portion.

6. The device of claim 1, further comprising
   a common electrode which passes through the fin type stacked layer structure and which is connected to the first and second semiconductor layers.

7. The device of claim 1, further comprising
   an assist gate transistor which is disposed between the first memory cell and the beam and between the second memory cell and the beam, and which serves as an FET using the first and second semiconductor layers as channels.

8. The device of claim 1,
   wherein each of the first and second memory cells is an FET which comprises a recording layer and a gate electrode and which uses the first and second semiconductor layers as channels and which changes in threshold in accordance with the state of the recording layer.

9. The device of claim 1, further comprising a third semiconductor layer which is disposed between the first and second semiconductor layers and which extends in the third direction;
   wherein the first memory cell is a resistance change element disposed between the first and third semiconductor layers, and the second memory cell is a resistance change element disposed between the second and third semiconductor layers, and
   the first, second and third semiconductor layers function as electrically conductive layers, respectively.

10. A nonvolatile semiconductor memory device comprising:
    a semiconductor substrate;
    a structure comprising first and second memory cells stacked in a first direction perpendicular to the surface of the semiconductor substrate and which extends in a second direction parallel to the surface of the semiconductor substrate; and
    a beam,
    wherein the beam is connected to an end of the structure in the second direction and extends in a third direction perpendicular to the first and second directions,
    the structure and the beam each comprises first and second semiconductor layers stacked in the first direction,
    the first and second memory cells correspond to the first and second semiconductor layers in the structure,
    the beam comprises a contact portion in which the first and second semiconductor layers in the beam are in contact with plugs respectively at one end of the beam in the third direction, and a low resistance portion having a resistance value lower than that of the first and second semiconductor layers,
    the low resistance portion extends from the contact portion to the end of the structure,
    the width of the beam in the second direction is greater than the width of the structure in the third direction, and the beam comprises a slit passing through the first and second semiconductor layers, and
    the low resistance portion is provided in the surface regions of the first and second semiconductor layers exposed inside the slit.

* * * * *